US009553081B2

(12) United States Patent
Lotfi et al.

(10) Patent No.: US 9,553,081 B2
(45) Date of Patent: Jan. 24, 2017

(54) SEMICONDUCTOR DEVICE INCLUDING A REDISTRIBUTION LAYER AND METALLIC PILLARS COUPLED THERETO

(71) Applicant: Enpirion, Inc., Hampton, NJ (US)

(72) Inventors: Ashraf W. Lotfi, Bridgewater, NJ (US); Jeffrey Demski, Orefield, PA (US); Anatoly Feygenson, Hillsborough, NJ (US); Douglas Dean Lopata, Boyertown, PA (US); Jay Norton, Wind Gap, PA (US); John D. Weld, Ledgewood, NJ (US)

(73) Assignee: Enpirion, Inc., Hampton, NJ (US)

( * ) Notice: Subject to any disclaimer, the term of this patent is extended or adjusted under 35 U.S.C. 154(b) by 0 days.

(21) Appl. No.: 14/091,626

(22) Filed: Nov. 27, 2013

(65) Prior Publication Data

US 2014/0151794 A1 Jun. 5, 2014

Related U.S. Application Data

(60) Provisional application No. 61/732,208, filed on Nov. 30, 2012.

(51) Int. Cl.
*H01L 27/06* (2006.01)
*H01L 23/482* (2006.01)
(Continued)

(52) U.S. Cl.
CPC ....... *H01L 27/0207* (2013.01); *H01L 21/8234* (2013.01); *H01L 21/823871* (2013.01);
(Continued)

(58) Field of Classification Search
CPC ............. H01L 27/0207; H01L 23/3107; H01L 23/522; H01L 29/41758; H01L 23/642; H01L 29/665;H01L 27/0203; H01L 29/088; H01L 24/83; H01L 21/8234; H01L 21/823871; H01L 27/082; H01L 25/50; H01L 27/0699; H01L 23/495
See application file for complete search history.

(56) References Cited

U.S. PATENT DOCUMENTS 4,761,725 A 8/1988 Henze
4,918,026 A 4/1990 Kosiak et al.
(Continued)

FOREIGN PATENT DOCUMENTS

CN 101409281 A 4/2009
EP 2278345 A2 1/2011
(Continued)

OTHER PUBLICATIONS

Betancourt-Zamora, R.J. et al., "A 1.5 mW, 200 MHz CMOS VCO for Wireless Biotelemetry," First International Workshop on Design of Mixed-Mode Integrated Circuits and Applications, Cancun, Mexico, pp. 72-74, Jul. 1997.

(Continued)

*Primary Examiner* — Galina Yushina
(74) *Attorney, Agent, or Firm* — Fletcher Yoder P.C.

(57) ABSTRACT

A semiconductor device and method of forming the same including, in one embodiment, a semiconductor die formed with a plurality of laterally diffused metal oxide semiconductor ("LDMOS") cells. The semiconductor device also includes a redistribution layer electrically coupled to the plurality of LDMOS cells and a plurality of metallic pillars distributed over and electrically coupled to the redistribution layer.

20 Claims, 80 Drawing Sheets

(51) Int. Cl.

| | |
|---|---|
| ***H01L 21/8234*** | (2006.01) |
| ***H01L 21/8238*** | (2006.01) |
| ***H01L 27/02*** | (2006.01) |
| ***H01L 23/522*** | (2006.01) |
| ***H01L 29/417*** | (2006.01) |
| ***H01L 29/66*** | (2006.01) |
| ***H01L 27/092*** | (2006.01) |
| ***H01L 27/088*** | (2006.01) |
| ***H01L 25/00*** | (2006.01) |
| ***H01L 23/36*** | (2006.01) |
| ***H01L 23/495*** | (2006.01) |
| ***H01L 29/78*** | (2006.01) |
| *H01L 23/31* | (2006.01) |
| *H01L 23/64* | (2006.01) |
| *H01L 23/00* | (2006.01) |
| *H01L 29/45* | (2006.01) |
| *H01L 29/49* | (2006.01) |
| *H01L 29/08* | (2006.01) |
| *H01L 29/10* | (2006.01) |
| *H01L 21/768* | (2006.01) |
| *H01L 21/285* | (2006.01) |

(52) U.S. Cl.

CPC .......... *H01L 23/36* (2013.01); *H01L 23/4824* (2013.01); *H01L 23/495* (2013.01); *H01L 23/49589* (2013.01); *H01L 23/522* (2013.01); *H01L 24/83* (2013.01); *H01L 25/50* (2013.01); *H01L 27/0203* (2013.01); *H01L 27/0688* (2013.01); *H01L 27/088* (2013.01); *H01L 27/092* (2013.01); *H01L 27/0922* (2013.01); *H01L 29/41758* (2013.01); *H01L 29/665* (2013.01); *H01L 29/66659* (2013.01); *H01L 29/7835* (2013.01); *H01L 21/28518* (2013.01); *H01L 21/76801* (2013.01); *H01L 21/76895* (2013.01); *H01L 23/3107* (2013.01); *H01L 23/642* (2013.01); *H01L 24/16* (2013.01); *H01L 24/32* (2013.01); *H01L 24/45* (2013.01); *H01L 24/48* (2013.01); *H01L 24/49* (2013.01); *H01L 24/73* (2013.01); *H01L 24/81* (2013.01); *H01L 29/0847* (2013.01); *H01L 29/1045* (2013.01); *H01L 29/1083* (2013.01); *H01L 29/456* (2013.01); *H01L 29/4933* (2013.01); *H01L 2224/0401* (2013.01); *H01L 2224/04042* (2013.01); *H01L 2224/05647* (2013.01); *H01L 2224/16225* (2013.01); *H01L 2224/16235* (2013.01); *H01L 2224/32245* (2013.01); *H01L 2224/45144* (2013.01); *H01L 2224/48247* (2013.01); *H01L 2224/48647* (2013.01); *H01L 2224/49175* (2013.01); *H01L 2224/73253* (2013.01); *H01L 2224/73265* (2013.01); *H01L 2224/81815* (2013.01); *H01L 2924/10253* (2013.01); *H01L 2924/1306* (2013.01); *H01L 2924/13091* (2013.01); *H01L 2924/15747* (2013.01); *H01L 2924/19041* (2013.01); *H01L 2924/19105* (2013.01); *H01L 2924/19106* (2013.01); *H01L 2924/3011* (2013.01); *H01L 2924/30107* (2013.01)

(56) References Cited

U.S. PATENT DOCUMENTS

| | | | |
|---|---|---|---|
| 4,922,327 | A | 5/1990 | Mena et al. |
| 4,947,192 | A | 8/1990 | Hawkins et al. |
| 4,982,353 | A | 1/1991 | Jacob et al. |
| 5,014,098 | A | 5/1991 | Schlais et al. |
| 5,029,283 | A | 7/1991 | Ellsworth et al. |
| 5,047,358 | A | 9/1991 | Kosiak et al. |
| 5,156,989 | A | 10/1992 | Williams et al. |
| 5,169,794 | A | 12/1992 | Iranmanesh |
| 5,264,782 | A | 11/1993 | Newton |
| 5,321,319 | A | 6/1994 | Mahmood |
| 5,345,670 | A | 9/1994 | Pitzele |
| 5,366,916 | A | 11/1994 | Summe et al. |
| 5,405,791 | A | 4/1995 | Ahmad et al. |
| 5,407,844 | A | 4/1995 | Smayling et al. |
| 5,457,624 | A | 10/1995 | Hastings |
| 5,469,334 | A | 11/1995 | Balakrishnan |
| 5,485,027 | A | 1/1996 | Williams et al. |
| 5,504,450 | A | 4/1996 | McPartland |
| 5,594,324 | A | 1/1997 | Canter et al. |
| 5,610,421 | A | 3/1997 | Contiero et al. |
| 5,644,266 | A | 7/1997 | Chen et al. |
| 5,668,024 | A | 9/1997 | Tsai et al. |
| 5,689,213 | A | 11/1997 | Sher |
| 5,757,045 | A | 5/1998 | Tsai et al. |
| 5,796,276 | A | 8/1998 | Phillips et al. |
| 5,833,585 | A | 11/1998 | Jones et al. |
| 5,859,606 | A | 1/1999 | Schrader et al. |
| 5,877,611 | A | 3/1999 | Brkovic |
| 5,888,861 | A | 3/1999 | Chien et al. |
| 5,889,315 | A | 3/1999 | Farrenkopf et al. |
| 5,899,732 | A | 5/1999 | Gardner et al. |
| 5,930,642 | A | 7/1999 | Moore et al. |
| 5,982,645 | A | 11/1999 | Levran et al. |
| 6,005,377 | A | 12/1999 | Chen et al. |
| 6,022,778 | A | 2/2000 | Contiero et al. |
| 6,118,351 | A | 9/2000 | Kossives et al. |
| 6,166,989 | A | 12/2000 | Hamamoto et al. |
| 6,204,542 | B1 | 3/2001 | Kinoshita et al. |
| 6,255,714 | B1 | 7/2001 | Kossives et al. |
| 6,262,564 | B1 | 7/2001 | Kanamori |
| 6,271,063 | B1 | 8/2001 | Chan et al. |
| 6,278,264 | B1 | 8/2001 | Burstein et al. |
| 6,285,539 | B1 | 9/2001 | Kashimoto et al. |
| 6,288,424 | B1 | 9/2001 | Ludikhuize |
| 6,297,108 | B1 | 10/2001 | Chu |
| 6,320,449 | B1 | 11/2001 | Capici et al. |
| 6,333,217 | B1 | 12/2001 | Umimoto et al. |
| 6,365,475 | B1 | 4/2002 | Cheng et al. |
| 6,380,004 | B2 | 4/2002 | Boden, Jr. et al. |
| 6,384,447 | B2 | 5/2002 | Mihnea et al. |
| 6,384,643 | B1 | 5/2002 | Grose et al. |
| 6,388,468 | B1 | 5/2002 | Li |
| 6,392,275 | B1 | 5/2002 | Jang |
| 6,407,579 | B1 | 6/2002 | Goswick |
| 6,413,806 | B1 | 7/2002 | Sicard et al. |
| 6,420,771 | B2 | 7/2002 | Gregory |
| 6,462,522 | B2 | 10/2002 | Burstein et al. |
| 6,477,065 | B2 | 11/2002 | Parks |
| 6,495,019 | B1 | 12/2002 | Filas et al. |
| 6,510,976 | B2 | 1/2003 | Hwee |
| 6,521,960 | B2 | 2/2003 | Lee |
| 6,541,819 | B2 | 4/2003 | Lotfi et al. |
| 6,545,360 | B1 | 4/2003 | Ohkubo et al. |
| 6,550,666 | B2 | 4/2003 | Chew et al. |
| 6,551,871 | B2 | 4/2003 | Takamura |
| 6,573,694 | B2 | 6/2003 | Pulkin et al. |
| 6,578,754 | B1 | 6/2003 | Tung |
| 6,592,019 | B2 | 7/2003 | Tung |
| 6,650,169 | B2 | 11/2003 | Faye et al. |
| 6,653,174 | B1 | 11/2003 | Cho et al. |
| 6,681,982 | B2 | 1/2004 | Tung |
| 6,688,985 | B2 | 2/2004 | Weiss et al. |
| 6,713,823 | B1 | 3/2004 | Nickel |
| 6,730,962 | B2 | 5/2004 | Wu |
| 6,744,676 | B2 | 6/2004 | Leung et al. |
| 6,765,272 | B2 | 7/2004 | Natsume |
| 6,791,305 | B2 | 9/2004 | Imai et al. |
| 6,822,882 | B1 | 11/2004 | Jacobs et al. |
| 6,833,585 | B2 | 12/2004 | Kim et al. |
| 6,855,985 | B2 | 2/2005 | Williams et al. |
| 6,873,017 | B2 | 3/2005 | Cai et al. |
| 6,879,137 | B2 | 4/2005 | Sase et al. |
| 6,900,101 | B2 | 5/2005 | Lin |
| 6,911,694 | B2 | 6/2005 | Negoro et al. |

(56) References Cited

U.S. PATENT DOCUMENTS 6,960,512 B2 11/2005 Cheng et al.
6,998,674 B2 2/2006 Osada et al.
7,012,792 B2 3/2006 Yoshida
7,015,544 B2 3/2006 Lotfi et al.
7,019,505 B2 3/2006 Dwarakanath et al.
7,038,438 B2 5/2006 Dwarakanath et al.
7,071,044 B1 7/2006 Krishnan et al.
7,074,684 B2 7/2006 Roy et al.
7,129,143 B2 10/2006 Park
7,186,606 B2 3/2007 Lotfi et al.
7,190,026 B2 3/2007 Lotfi et al.
7,195,981 B2 3/2007 Lotfi et al.
7,211,516 B2 5/2007 Chen et al.
7,214,985 B2 5/2007 Lotfi et al.
7,229,886 B2 6/2007 Lotfi et al.
7,230,302 B2 6/2007 Lotfi et al.
7,230,316 B2 6/2007 Yamazaki et al.
7,232,733 B2 6/2007 Lotfi et al.
7,232,762 B2 6/2007 Chang et al.
7,244,994 B2 7/2007 Lotfi et al.
7,256,674 B2 8/2007 Lotfi et al.
7,262,476 B2 8/2007 Bude et al.
7,276,998 B2 10/2007 Lotfi et al.
7,330,017 B2 2/2008 Dwarakanath et al.
7,335,948 B2 2/2008 Lotfi et al.
7,344,985 B2 3/2008 Chen et al.
7,355,217 B1 4/2008 Brand
7,355,255 B2 4/2008 Chen et al.
7,365,402 B2 4/2008 Ma
7,391,080 B2 6/2008 Arnborg et al.
7,408,211 B2 8/2008 Kao
7,420,247 B2 9/2008 Xu et al.
7,422,967 B2 9/2008 DeLoach et al.
7,422,968 B2 9/2008 Lu et al.
7,426,780 B2 9/2008 Lotfi et al.
7,462,317 B2 12/2008 Lotfi et al.
7,489,007 B2 2/2009 Williams et al.
7,511,350 B2 3/2009 Chen et al.
7,544,558 B2 6/2009 Ren et al.
7,544,995 B2 6/2009 Lotfi et al.
7,576,391 B2 8/2009 Williams et al.
7,605,428 B2 10/2009 Williams et al.
7,626,233 B2 12/2009 Tornblad et al.
7,679,342 B2 3/2010 Lopata et al.
7,683,426 B2 3/2010 Williams et al.
7,683,453 B2 3/2010 Williams et al.
7,710,094 B1 5/2010 Wong et al.
7,719,054 B2 5/2010 Williams et al.
7,737,526 B2 6/2010 Williams et al.
7,759,184 B2 7/2010 Lotfi et al.
7,812,393 B2 10/2010 Williams et al.
7,876,080 B2 1/2011 Dwarakanath et al.
7,892,931 B2 2/2011 Sridhar et al.
7,952,459 B2 5/2011 Lotfi et al.
7,964,484 B2 6/2011 Osada et al.
7,989,963 B2 8/2011 Tam
8,101,479 B2 1/2012 Parker et al.
8,212,315 B2 7/2012 Lotfi et al.
8,212,316 B2 7/2012 Lotfi et al.
8,212,317 B2 7/2012 Lotfi et al.
8,253,195 B2 8/2012 Lotfi et al.
8,253,196 B2 8/2012 Lotfi et al.
8,253,197 B2 8/2012 Lotfi et al.
8,258,575 B2 9/2012 Williams et al.
8,520,402 B1 8/2013 Sivasubramaniam
8,618,580 B2 12/2013 Lin et al.
8,987,815 B2 3/2015 Lotfi et al.
9,299,691 B2 3/2016 Lotfi et al.
2002/0135338 A1 9/2002 Hobrecht et al.
2002/0164844 A1 11/2002 Cai et al.
2002/0175366 A1 11/2002 Lotfi et al.
2002/0185681 A1* 12/2002 Nakano et al. ............... 257/336
2003/0109112 A1 6/2003 Wu
2003/0147286 A1 8/2003 Nakamura et al.
2004/0094806 A1 5/2004 Schillaci et al.
2004/0121547 A1 6/2004 Lee et al.
2004/0227190 A1 11/2004 Cai et al.
2004/0246077 A1 12/2004 Misu et al.
2005/0110080 A1 5/2005 Arnborg et al.
2005/0112822 A1 5/2005 Litwin et al.
2005/0167756 A1 8/2005 Lotfi et al.
2005/0168203 A1 8/2005 Dwarakanath et al.
2005/0168205 A1 8/2005 Dwarakanath et al.
2005/0169024 A1 8/2005 Dwarakanath et al.
2005/0179084 A1 8/2005 Robb et al.
2005/0179472 A1 8/2005 Nakamura et al.
2005/0194639 A1 9/2005 Negoro et al.
2006/0027864 A1 2/2006 Negoro et al.
2006/0038225 A1* 2/2006 Lotfi ..................... H02M 3/156
257/335
2006/0038237 A1 2/2006 Lotfi et al.
2006/0038238 A1 2/2006 Lotfi et al.
2006/0039224 A1 2/2006 Lotfi et al.
2006/0040441 A1 2/2006 Lotfi et al.
2006/0040449 A1 2/2006 Lotfi et al.
2006/0040451 A1 2/2006 Lotfi et al.
2006/0040452 A1 2/2006 Lotfi et al.
2006/0081937 A1 4/2006 Lotfi et al.
2006/0145250 A1 7/2006 Ma
2006/0278931 A1 12/2006 Lee et al.
2007/0224752 A1 9/2007 Lotfi et al.
2007/0284658 A1 12/2007 Lotfi et al.
2008/0001233 A1 1/2008 Kapoor et al.
2008/0061368 A1 3/2008 Williams et al.
2008/0061400 A1 3/2008 Williams et al.
2008/0067585 A1 3/2008 Williams et al.
2008/0067586 A1 3/2008 Williams et al.
2008/0067588 A1 3/2008 Williams et al.
2008/0080111 A1* 4/2008 Lin et al. ........................ 361/56
2008/0142899 A1 6/2008 Morris et al.
2008/0153221 A1 6/2008 Sridhar et al.
2008/0157226 A1 7/2008 Majcherczak et al.
2008/0199999 A1 8/2008 Weijtmans et al.
2008/0242032 A1 10/2008 Chakravarthi et al.
2008/0301929 A1 12/2008 Lotfi et al.
2009/0065964 A1 3/2009 Lotfi et al.
2009/0096435 A1* 4/2009 Ueunten ....................... 323/282
2009/0096511 A1 4/2009 Ueunten
2009/0167267 A1 7/2009 Dwarakanath et al.
2009/0212751 A1 8/2009 Cervera et al.
2009/0261791 A1 10/2009 Lopata et al.
2009/0269899 A1 10/2009 Osada et al.
2009/0296310 A1 12/2009 Chikara
2010/0038727 A1 2/2010 Chakravarthi et al.
2010/0039836 A1 2/2010 Gong et al.
2010/0044789 A1 2/2010 Lotfi et al.
2010/0052049 A1 3/2010 Lotfi et al.
2010/0052050 A1 3/2010 Lotfi et al.
2010/0052051 A1 3/2010 Lotfi et al.
2010/0052052 A1 3/2010 Lotfi et al.
2010/0087036 A1 4/2010 Lotfi et al.
2010/0141228 A1 6/2010 Lopata et al.
2010/0156374 A1 6/2010 Lopata et al.
2010/0164449 A1 7/2010 Dwarakanath et al.
2010/0164650 A1 7/2010 Abou-Alfotouh et al.
2010/0244106 A1 9/2010 Parker et al.
2010/0244152 A1 9/2010 Bahl et al.
2010/0267212 A1 10/2010 Morris
2010/0301496 A1 12/2010 Koduri
2011/0006763 A1* 1/2011 Bakker ......................... 324/251
2011/0031947 A1 2/2011 You
2011/0049621 A1 3/2011 Lopata et al.
2011/0074498 A1 3/2011 Thompson et al.
2011/0095742 A1 4/2011 Lopata et al.
2011/0101933 A1 5/2011 Lopata et al.
2011/0101934 A1 5/2011 Lopata et al.
2011/0101948 A1 5/2011 Lopata et al.
2011/0101949 A1 5/2011 Lopata et al.
2011/0215414 A1 9/2011 Osada et al.
2011/0221000 A1 9/2011 Shima
2011/0241125 A1* 10/2011 Rader, III ......... H01L 23/49541
257/401
2011/0316053 A1* 12/2011 Brand ........................... 257/206
2012/0074922 A1 3/2012 Suzuki et al.

(56) References Cited

U.S. PATENT DOCUMENTS

| | | | | |
|---|---|---|---|---|
| 2012/0091986 | A1* | 4/2012 | Takemae | ............ H01L 21/8252 323/311 |
| 2012/0306011 | A1 | 12/2012 | Lotfi et al. | |
| 2013/0151825 | A1 | 6/2013 | Huynh | |
| 2015/0280558 | A1 | 10/2015 | Lopata et al. | |

FOREIGN PATENT DOCUMENTS

| | | | |
|---|---|---|---|
| TW | 200816374 | A | 4/2008 |
| TW | 200847330 | A | 12/2008 |
| TW | 201120459 | A | 6/2011 |
| TW | 201225298 | A | 6/2012 |

OTHER PUBLICATIONS

Goodman, J. et al., "An Energy/Security Scalable Encryp-tion Processor Using an Embedded Variable Voltage DC/DC Converter," IEEE Journal of Solid-State Circuits, vol. 33, No. 11 (Nov. 1998).

Horowitz, P., et al., "The Art of Electronics," Second Edi-tion, 1989, pp. 288-291, Cambridge University Press, Cambridge, MA.

Lotfi, A.W., et al., "Issues and Advances in High-Frequency Magnetics for Switching Power Supplies," Proceedings of the IEEE, Jun. 2001, vol. 89, No. 6, pp. 833-845.

Ludikhuize, A.W., "A Review of RESURF Technology," Proceedings of IEEE ISPSD 2000, May 22, 2000, pp. 11-18.

Chinese Office Action for CN Application No. 201310616865.6 Mailed Mar. 9, 2016; 8 Pages.

* cited by examiner

SEMICONDUCTOR DEVICE INCLUDING A REDISTRIBUTION LAYER AND METALLIC PILLARS COUPLED THERETO

This application claims the benefit of U.S. Provisional Application No. 61/732,208, entitled "Metal Oxide Semiconductor Device and Method of Forming the Same; Three-Dimensional Decoupled Package for Highly Distributed LDMOS Power Switches for Use in Switch-Mode DC-DC Power Converters; Three-Dimensional Mixed Pillar Routing for Highly Distributed LDMOS Power Switches for Use in Switch-Mode Power Converters; Semiconductor Device Formed with Plural Metallic Layers," filed on Nov. 30, 2012, which is incorporated herein by reference.

TECHNICAL FIELD

The present invention is directed, in general, to semiconductor devices and, more specifically, to a metal oxide semiconductor device and method of forming the same.

BACKGROUND

A lateral power switch/transistor can be fabricated on a silicon wafer in a customized, high speed, laterally diffused metal oxide semiconductor ("LDMOS") process. The lateral power switch is formed of a large number of cells with routing in and out of device terminals allowed on the top side of a wafer. Unlike traditional vertical- and trench-style devices, back-side routing is not typically employed. In addition, with the use of deep sub-micron lithography, the pitch (or half-pitch) of a cell drops below five microns (micrometers ("μm")), which makes source and drain metallizations tighter with less available space to couple to upper-level metal contacts. The upper-level metal contacts are routed to an external package pin located at a periphery of a semiconductor package. This difficulty translates into two adverse challenges.

A first challenge is decreased metal widths, which leads to increased resistance between high-current drain and source terminals of the switch and external package pins. A second challenge is greater amounts of switch drain and source metal overlap, which leads to increased switch output capacitance, commonly referred to as "Coss."

In signal or digital applications, size reduction is not an impediment to routing. If the application is a power management device, however, the segments of the switch are ideally routed to external pins with very low impedance, and also with the same impedance measured from a common reference point. This condition is difficult to achieve since interior portions of the cells are inherently farther away from the periphery than peripheral portions of the cells, resulting in voltage and power losses in the internal connections to the outside package pins, as reflected by the two challenges described above.

A distributed transmission line problem arises when source, drain, and gate lines are electrically distant from their respective single-point input signal generator. Absent a remedy, electrically long connections become, in effect, delay lines, which cause a problem in turning on or off an unusually large, fine-pitch switch. The effect is a gradual and slow turn-on (or turn-off) behavior that propagates from the input signal generator to an effective current sink from one end of a transmission line to the other end, resulting in portions of the lateral power switch remaining on when other portions have been turned off, or vice versa. This results in a potentially destructive condition for a lateral power switch referred to as "shoot through" since the condition causes a supply rail to short-circuit momentarily to local circuit ground, resulting in a potentially destructive current. Typically such a problem is defeated in circuit design by retarding the speed at which driver circuits turn on or turn off such switches. While this solution is viable, it defeats the purpose of utilizing high-speed LDMOS devices with deep sub-micron, fine-pitch structures. Thus, a high-speed interconnection configuration for large, deep sub-micron switches and a corresponding process for forming such switches would be beneficial.

Accordingly, what is needed in the art is a semiconductor device including switches (e.g., an LDMOS device) and method of forming the same that overcomes switching-speed, layout deficiencies, and switch device structures limitations in the prior art. Additionally, there is a need for a compact LDMOS device that can be switched at high speed and is capable of being used to construct a power converter or portions thereof.

SUMMARY OF THE INVENTION

These and other problems are generally solved or circumvented, and technical advantages are generally achieved, by advantageous embodiments of the present invention, including a semiconductor device, and method of forming the same. In one embodiment, the semiconductor device includes a semiconductor die formed with a plurality of laterally diffused metal oxide semiconductor ("LDMOS") cells. The semiconductor device also includes a redistribution layer electrically coupled to the plurality of LDMOS cells and a plurality of metallic pillars distributed over and electrically coupled to the redistribution layer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

Embodiments will be described in a specific context, namely, a switch (e.g., embodied in an LDMOS device), a semiconductor device incorporating the LDMOS device and methods of forming the same. While the principles of the present invention will be described in the environment of a power converter employing an LDMOS device, any application or related semiconductor technology that may benefit from a device that can switch at high speeds on a semiconductor substrate is well within the broad scope of the present invention.

Figure 1:
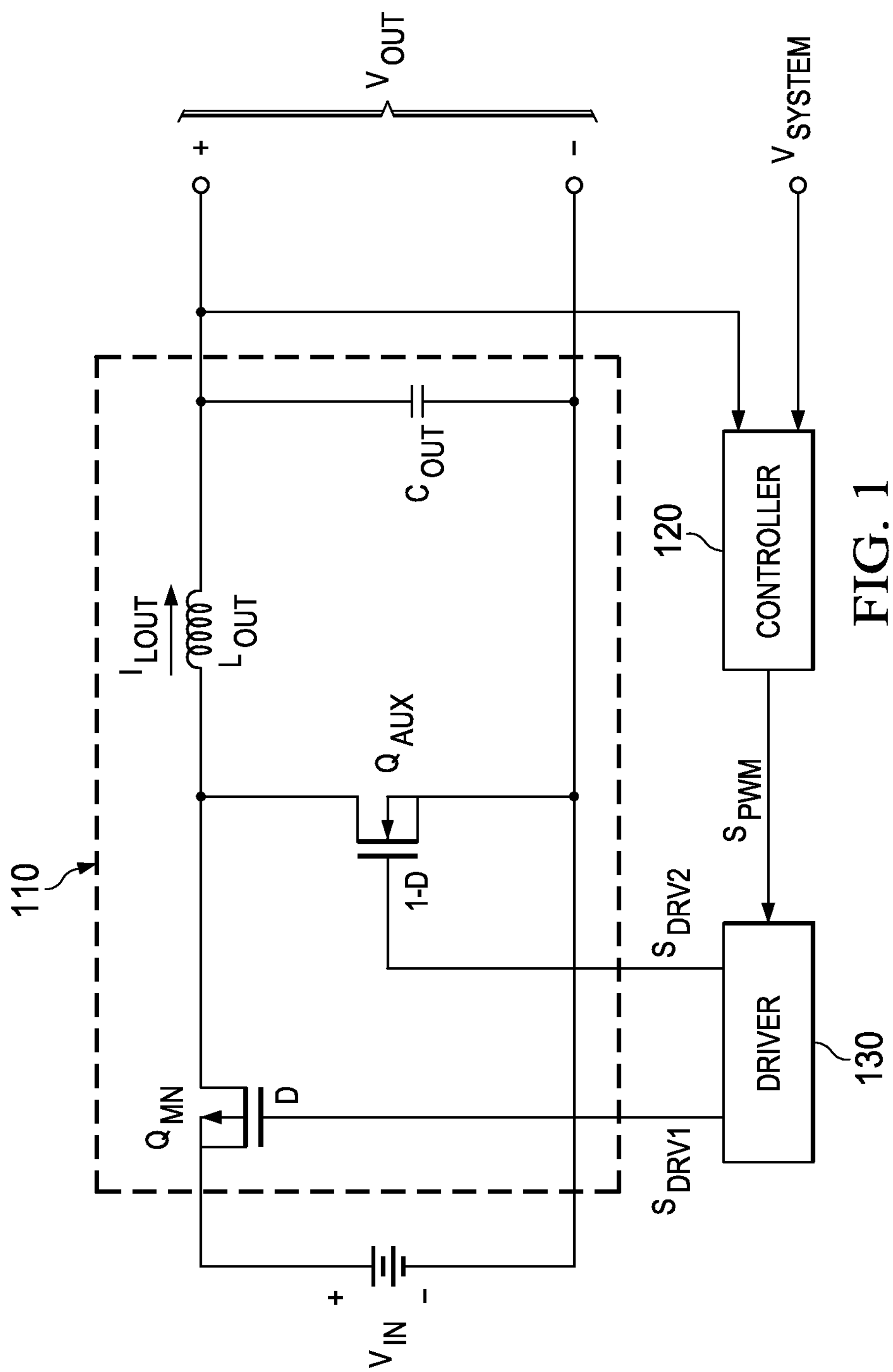
FIG. 1 illustrates a block diagram of an embodiment of a power converter including a semiconductor device.

Referring initially to FIG. 1, illustrated is a block diagram of an embodiment of a power converter including a semiconductor device. The power converter includes a power train 110, a controller 120, and a driver 130, and provides power to a system such as a microprocessor. While in the illustrated embodiment, the power train 110 employs a buck converter topology, those skilled in the art should understand that other converter topologies such as a forward converter topology are well within the broad scope of the present invention.

The power train 110 of the power converter receives an input voltage $V_{in}$ from a source of electrical power (represented by a battery) at an input thereof and provides a regulated output voltage $V_{out}$ to power, for instance, a microprocessor at an output of the power converter. In keeping with the principles of a buck converter topology, the output voltage $V_{out}$ is generally less than the input voltage $V_{in}$ such that a switching operation of the power converter can regulate the output voltage $V_{out}$. A main switch $Q_{mn}$ [e.g., a P-channel metal oxide semiconductor field effect transistor ("MOSFET") embodied in a P-type laterally diffused metal oxide semiconductor ("P-LDMOS") device] is enabled to conduct for a primary interval (generally co-existent with a primary duty cycle "D" of the main switch $Q_{mn}$) and couples the input voltage $V_{in}$ to an output filter inductor $L_{out}$. During the primary interval, an inductor current $I_{Lout}$ flowing through the output filter inductor $L_{out}$ increases as current flows from the input to the output of the power train 110. An ac component of the inductor current $I_{Lout}$ is filtered by the output filter capacitor $C_{out}$.

During a complementary interval (generally co-existent with a complementary duty cycle "1-D" of the main switch $Q_{mn}$), the main switch $Q_{mn}$ is transitioned to a non-conducting state and an auxiliary switch $Q_{aux}$ [e.g., an N-channel MOSFET embodied in an N-type laterally diffused metal oxide semiconductor ("N-LDMOS") device] is enabled to conduct. The auxiliary switch $Q_{aux}$ provides a path to maintain a continuity of the inductor current $I_{Lout}$ flowing through the output filter inductor $L_{out}$. During the complementary interval, the inductor current $I_{Lout}$ through the output filter inductor $L_{out}$ decreases. In general, the respective duty cycle of the main and auxiliary switches $Q_{mn}$, $Q_{aux}$ can be adjusted to maintain a regulation of the output voltage $V_{out}$ of the power converter. Those skilled in the art should understand, however, that the conduction periods for the main and auxiliary switches $Q_{mn}$, $Q_{aux}$ may be separated by a small time interval to avoid cross conduction therebetween and beneficially to reduce the switching losses associated with the power converter.

The controller 120 of the power converter receives a desired power converter characteristic such as a desired system voltage $V_{system}$ from an internal or external source that may be associated with the microprocessor, and the output voltage $V_{out}$ of the power converter. In accordance with the aforementioned characteristics, the controller 120 provides a signal (e.g., a pulse width modulated ("PWM") signal $S_{PWM}$) to control a duty cycle and a frequency of the main and auxiliary switches $Q_{mn}$, $Q_{aux}$ of the power train 110 to regulate the output voltage $V_{out}$ thereof. Any controller adapted to control at least one switch of the power converter is well within the broad scope of the present invention.

The power converter also includes the driver 130 configured to provide drive signals $S_{DRV1}$, $S_{DRV2}$ to the main and auxiliary switches $Q_{mn}$, $Q_{aux}$, respectively, based on the PWM signal $S_{PWM}$ provided by the controller 120. There are a number of known, viable alternatives to implement a driver 130 that include techniques to provide sufficient signal delays to prevent crosscurrents when controlling multiple switches in the power converter. The driver 130 typically includes switching circuitry incorporating a plurality of driver switches that cooperate to provide the drive signals $S_{DRV1}$, $S_{DRV2}$ to the main and auxiliary switches $Q_{mn}$, $Q_{aux}$. Of course, any driver 130 capable of providing the drive signals $S_{DRV1}$, $S_{DRV2}$ to control a switch is well within the broad scope of the present invention.

In an embodiment, the main and auxiliary switches $Q_{mn}$, $Q_{aux}$ are power switches that can be incorporated into a semiconductor device proximate control or signal processing devices that perform the control functions of the controller 120 of the power converter. The control and signal processing devices are typically complementary metal oxide semiconductor ("CMOS") devices such as P-type metal oxide semiconductor ("PMOS") devices and N-type metal oxide semiconductor ("NMOS") devices. The PMOS and NMOS devices may also be referred to as P-channel and N-channel MOSFETs, respectively. Low voltages (e.g., 2.5 volts) are employed with the control and signal processing devices (hence, also referred to as "low voltage devices") to prevent flashover between the fine line structures thereof. The main and auxiliary switches $Q_{mn}$, $Q_{aux}$ of the power train 110 and ones of the plurality of driver switches of the driver 130 may be formed by LDMOS devices that handle higher voltages (e.g., ten volts) and hence are referred to as higher voltage devices. Integrating the control and signal processing devices, power switches and driver switches on a semiconductor substrate provides opportunities for substantial reductions in cost and size of the power converter or other apparatus employing like devices.

Thus, as illustrated in FIG. 1, an input of the controller 120 is coupled to or receives the output voltage $V_{out}$ of a power converter to regulate the output voltage $V_{out}$. A controller 120 may employ an error amplifier constructed with an analog operational amplifier with an inverting input coupled to the output voltage $V_{out}$ of the power converter. A non-inverting input of the error amplifier is coupled to a reference voltage representative of a desired, regulated output voltage of the power converter. A duty cycle of a power switch of the power converter is initiated by a clock signal. To terminate the duty cycle, the output of the error amplifier is compared by an analog comparator with a sloped voltage waveform that is typically a periodic ramp voltage waveform, or a periodic ramp voltage waveform with a superimposed scaled switch or inductor current. When the output of the error amplifier exceeds the sloped voltage waveform, the duty cycle of the power switch is terminated by the analog comparator. The result of this controller structure is a feedback arrangement wherein the analog comparator continuously makes a decision to terminate the power switch duty cycle during the interval of time when the power switch is enabled to conduct. This analog controller architecture enables termination of a power switch duty cycle with fine temporal granularity that is not dependent on a clock frequency or on a computation rate of digital logic. Digital circuitry can also be employed to construct a controller.

Figure 2A:
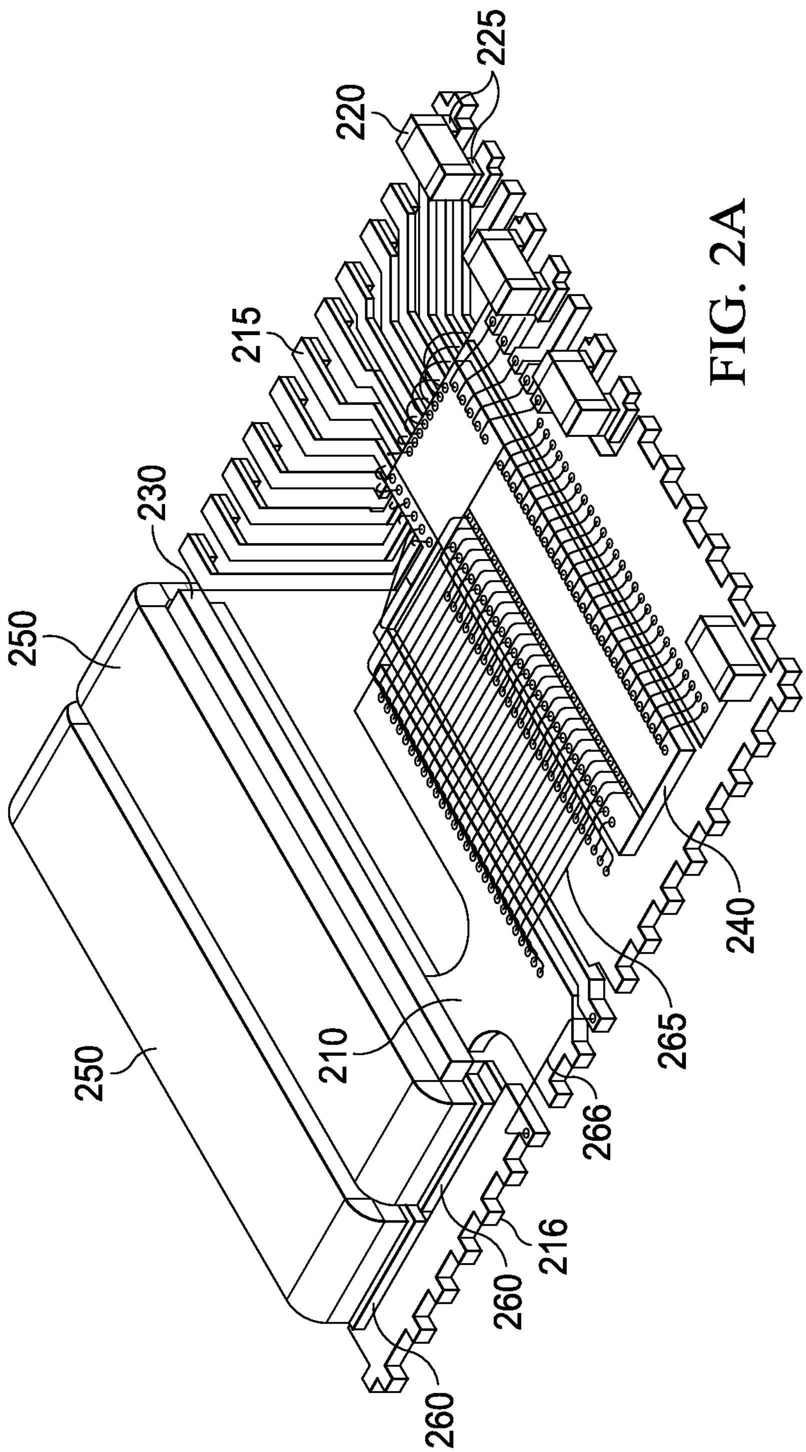
FIGS. 2A and 2B illustrate isometric views of an embodiment of an electronic device/power converter before encapsulation.
Figure 2B:
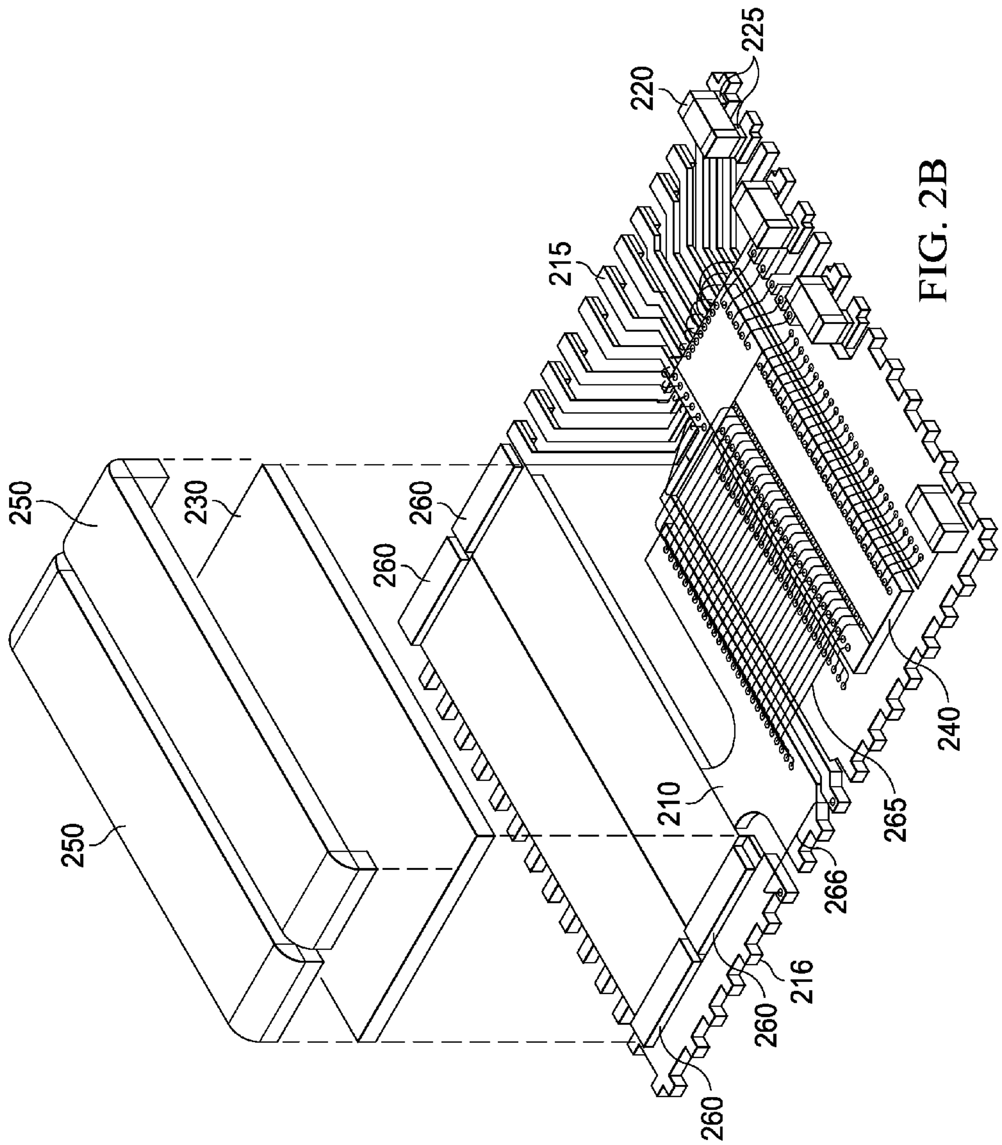

Referring now to FIGS. 2A and 2B, illustrated are isometric views of an embodiment of an electronic device/power converter (e.g., a power module) before encapsulation. The power converter includes a magnetic device (e.g., an inductor), an integrated circuit, and surface-mount components. The power converter may include power conversion circuitry that includes or may be embodied in the magnetic device, the integrated circuit, and at least one of the surface-mount components. The power conversion circuitry may form a power converter that often includes a switching regulator or power converter such as a buck switching regulator with an integrated control circuit for reduced component count, and synchronous rectifiers for high power conversion efficiency. Of course, an embodiment is not limited to a power module, power converter or the like, and may be applicable to other electronic devices.

A conductive substrate (or leadframe) 210 is patterned and etched to form an electrically conductive interconnect layer for the lower portion of a winding for the inductor as well as the electrical interconnections among surface-mount components, the integrated circuit, and the inductor. A typical thickness of the leadframe 210 is about eight mils (thousandths of an inch). While the leadframe 210 is often constructed of copper, alternative electrically conductive materials can be used therefor. The leadframe 210 provides external connections for the power module, as well as a support base for a magnetic material for the inductor. The external connections are formed as fingers of the leadframe 210, referenced as leadframe fingers (two of which are designated 215, 216).

The leadframe 210 is generally constructed with an integral metallic strip surrounding the electrically conductive pattern to provide mechanical support during the manufacturing steps, which metallic strip is discarded later in the manufacturing process. The surrounding metallic strip is generally sheared off after the electronic device has been constructed, for example to provide unconnected traces. The leadframe 210 is generally produced in an array of repeating of patterns (not shown), such as a 16-by-16 array, to form, for example, 256 substantially identical electronic devices.

Forming an array of leadframes 210 is a process well known in the art to reduce a manufacturing cost of producing electronic devices.

Solder paste is selectively applied to the leadframe 210 in a thin layer to areas (designated 225) for screening processes, to provide electrical and mechanical attachment for surface-mount components. The surface-mount components such as capacitors (one of which is designated 220) are placed with their conductive ends in the solder paste. The solder paste may be composed of lead-based as well as lead-free compositions. The array of leadframes 210 with the surface-mount components 220 is reflowed in an oven to mechanically and electrically attach the surface-mount components 220 to the leadframe 210.

The steps as described above generally do not require execution in a highly controlled environment of a clean room. The following steps, however, are preferably performed in a clean-room environment such as typically used for assembly of integrated circuits into a molded plastic package, as is generally well known in the art.

An adhesive (e.g., a die attach adhesive such as Abletherm 2600AT by Ablestik of Rancho Dominguez, Calif.) is dispensed onto the leadframe 210 to hold a magnetic core (e.g., a bar of magnetic material) 230 and an integrated circuit in the form of a semiconductor die 240. The bar of magnetic material 230 and the semiconductor die 240 are positioned on the leadframe 210 over the die-attach adhesive. Thus, a lower surface of the bar of magnetic material 230 faces, and is preferably adhered to, the leadframe 210. The bar of magnetic material 230 is included to enhance the magnetic properties of the inductor and may be about 250 micrometers ("μm") thick, four mils wide and 7.5 mils long. The adhesive is cured, typically in a controlled thermal process, to secure the bar of magnetic material 230 and the semiconductor die 240 to the leadframe 210.

Solder paste is applied to areas (generally designated 260) of the leadframe 210 wherein ends of conductive clips 250 are placed. Again, the solder paste may be composed of lead-based as well as lead-free compositions. The conductive clips 250 (e.g., about 8-12 mils thick) are placed on the leadframe 210 above the bars of magnetic material 230 with their ends in the solder paste. The conductive clips 250 are formed with their ends bent toward the leadframe 210 about ends of the bar of magnetic material 230 without mechanical interference. Thus, an upper surface of the bar of magnetic material 230 faces the conductive clips 250. An insulating gap, for example, about a five mil air gap, is thus preferably left between the upper surfaces of the bars of magnetic material 230 and the lower surfaces of the conductive clips 250, which gap may be filled later by an encapsulant. The conductive clips 250 provide a portion of the electrically conductive inductor winding above each bar of magnetic material 230. The leadframe 210 is heated in a reflow oven to mechanically and electrically bond the conductive clips 250 to the leadframe 210.

Wire bonds that may be formed of gold wire such as a first wire bond 265 are attached to each semiconductor die 240 and to the leadframe 210 to electrically couple pads on the semiconductor die 240 to bonding areas of the leadframe 210, thereby providing electrical circuit connections therebetween. Wire bonds such as a second wire bond 266 may also be used to selectively electrically couple portions of the leadframe 210 to provide circuit interconnections that cannot be easily wired in a single planar layout, thus producing the topological layout functionality for the leadframe 210 of a two-layer printed circuit board (also referred to as "printed wiring board") or substrate.

When the electronic devices are formed in an array as mentioned above, the array is placed in a mold, and an encapsulant such as a molding material, preferably epoxy, is deposited (e.g., injected) thereover as is well known in the art to provide environmental and mechanical protection as well as a thermally conductive covering to facilitate heat dissipation during operation. Other molding materials and processes as well as electronic devices constructed without an encapsulant are well within the broad scope of the present invention.

Figure 3:
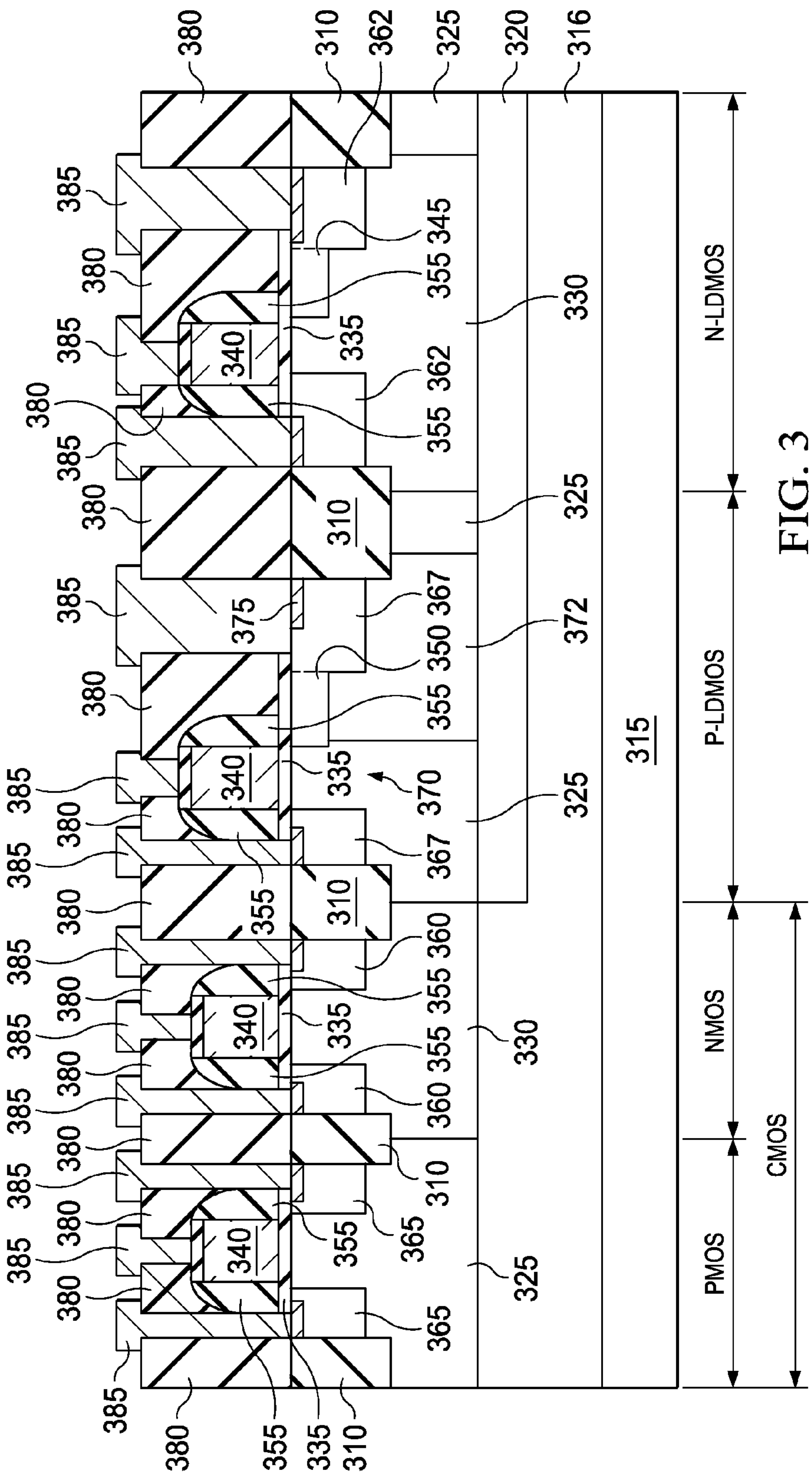
FIG. 3 illustrates a cross-sectional view of an embodiment of a portion of a semiconductor device.

Turning now to FIG. 3, illustrated is a cross-sectional view of an embodiment of a portion of a semiconductor device. Inasmuch as processing steps to construct the semiconductor device illustrated with respect to FIG. 3 are analogous to processing steps described by U.S. Pat. No. 7,230,302 entitled "Laterally Diffused Metal Oxide Semiconductor Device and Method of Forming the Same," by Lotfi, et al., filed Jan. 29, 2004, U.S. Pat. No. 8,212,315 entitled "Integrated Circuit with a Laterally Diffused Metal Oxide Semiconductor Device and Method of Forming the Same," by Lotfi, et al., filed Aug. 28, 2009, U.S. Patent Application Publication No. 2007/0284658, entitled "Laterally Diffused Metal Oxide Semiconductor Device and Method of Forming the Same," by Lotfi, et al., filed Aug. 20, 2007, U.S. Patent Application Publication No. 2012/0306011, entitled "Integrated Circuit with a Laterally Diffused Metal Oxide Semiconductor Device and Method of Forming the Same," by Lotfi, et al., filed Aug. 15, 2012, which are hereby incorporated herein by reference, the steps in the process will not be described at this point in detail. Nonetheless, process steps will be described later herein for construction of a similar device.

The cross-sectional view illustrated in FIG. 3 illustrates individual LDMOS cells of P-LDMOS and N-LDMOS devices that are constructed with a large number of such individual cells. In an embodiment, the pattern of individual cells illustrated in FIG. 3 is repeated with minoring as necessary to produce a P-LDMOS or N-LDMOS device with a suitable current rating for an application. A substrate is thereby formed, e.g., with a plurality of heavily doped source regions and heavily doped drain regions.

The semiconductor device is formed in a semiconductor die including shallow trench isolation regions 310 within a substrate 315 (e.g., a P-type substrate) to provide dielectric separation between PMOS, NMOS, P-LDMOS and N-LDMOS devices. An epitaxial layer 316 (e.g., a P-type epitaxial layer) is grown on and partially diffuses within a surface of the substrate 315, preferably doped between $1\cdot10^{14}$ and $1\cdot10^{16}$ atoms/cm$^3$. A buried layer (e.g., an N-type buried layer) 320 is recessed within the substrate 315 in the area that accommodates the P-LDMOS device and the N-LDMOS device.

The semiconductor device also includes wells (e.g., N-type wells) 325 formed in the substrate 315 in the areas that accommodate the PMOS device and the P-LDMOS device, and under the shallow trench isolation regions 310 above the N-type buried layer 320 (for the P-LDMOS). The N-type wells 325 are formed to provide electrical isolation for the PMOS device and the P-LDMOS device and operate cooperatively with the N-type buried layer 320 (in the case of the P-LDMOS device) and the shallow trench isolation regions 310 to provide the isolation. As illustrated, the N-type well 325 above the N-type buried layer 320 does not cover the entire area that accommodates the P-LDMOS device in the substrate 315 between the shallow trench isolation regions 310 thereof. The N-type wells 325 for the P-LDMOS are constructed as such for the reasons as set forth herein.

The semiconductor device includes additional wells (e.g., P-type wells) 330 formed in the substrate 315 between the shallow trench isolation regions 310 substantially in the areas that accommodate the NMOS device and N-LDMOS device. While the P-type well 330 above the N-type buried layer 320 covers the entire area that accommodates the N-LDMOS device in the substrate 315 between the shallow trench isolation regions 310 thereof, it is well within the broad scope of the present invention to define the P-type well 330 to cover a portion of the area that accommodates the N-LDMOS device in the substrate 315. The semiconductor device also includes gates 340 for the PMOS, NMOS, P-LDMOS and N-LDMOS devices located over a gate dielectric layer 335 and including gate sidewall spacers 355 about the gates 340 thereof.

The N-LDMOS device includes lightly doped voltage withstand enhancement regions (e.g., N-type lightly doped regions) 345 for the drain thereof. The P-LDMOS device also includes lightly doped voltage withstand enhancement regions (e.g., P-type lightly doped regions) 350 for the drain thereof. In the present embodiment and for analogous reasons as stated above, the N-type and P-type lightly doped regions 345, 350 provide higher voltage ratings for the N-LDMOS and P-LDMOS devices, respectively. As a result, not only can the N-LDMOS and P-LDMOS devices handle higher voltages from the drain-to-source thereof, but the devices can handle a higher voltage from a source-to-gate thereof when the source is more positive than the gate 340. It is recognized that the width of the N-type and P-type lightly doped regions 345, 350 may be individually varied to alter breakdown voltage characteristics of the respective N-LDMOS and P-LDMOS devices without departing from the scope of the present invention. Additionally, the N-type and P-type lightly doped regions 345, 350 may be formed in a manner similar to the respective N-LDMOS and P-LDMOS devices illustrated and described with respect to FIGS. 2 through 15 in U.S. Pat. No. 7,230,302, cited previously hereinabove.

The semiconductor device also includes heavily doped regions (e.g., N-type heavily doped regions) 360 for the source and drain of the NMOS device that preferably have a different doping concentration profile than heavily doped regions (e.g., N-type heavily doped regions) 362 for the source and drain of the N-LDMOS device. The N-type heavily doped regions 360 for the NMOS device are formed within the P-type well 330 thereof and, as alluded to above, form the source and the drain for the NMOS device. Additionally, the N-type heavily doped regions 362 for the N-LDMOS device are formed within the P-type well 330 thereof. Also, the N-type heavily doped region 362 of the drain for the N-LDMOS device is adjacent to the N-type lightly doped drain region 345 thereof.

The semiconductor device also includes heavily doped regions (e.g., P-type heavily doped regions) 365 for the source and drain of the PMOS device that preferably have a different doping concentration profile than heavily doped regions (e.g., P-type heavily doped regions) 367 for the source and drain of the P-LDMOS device. The P-type heavily doped regions 365 for the PMOS device are formed within the N-type well 325 thereof and, as alluded to above, form the source and the drain for the PMOS device. Additionally, the P-type heavily doped regions 367 for the P-LDMOS device are formed within the N-type well 325 or in regions adjacent to the N-type well 325 thereof and form a portion of the source and the drain for the P-LDMOS device. Also, the P-type heavily doped region 367 of the drain for the P-LDMOS device is adjacent to the P-type lightly doped region 350 thereof.

In the illustrated embodiment, the N-type well 325 above the N-type buried layer 320 does not cover the entire area that accommodates the P-LDMOS device in the substrate 315 between the shallow trench isolation regions 310 thereof. In particular, the N-type well 325 is located under and within a channel region 370, and the N-type well 325 and N-type buried layer 320 are oppositely doped in comparison to the P-type lightly and heavily doped regions 350, 367. Thus, doped regions (e.g., P-type doped regions) 372 of a same doping type as the lightly doped regions 350 extend between the P-type heavily doped regions 367 of the drain and the N-type well 325 of the P-LDMOS device and have a doping concentration profile less than a doping concentration profile of the P-type heavily doped regions 367. While the P-type heavily doped regions 367 preferably have the same doping concentration profiles, it is well within the broad scope of the present invention that the P-type heavily doped region 367 for the source has a different doping concentration profile than the counterpart of the drain. The same principle applies to other like regions of the devices of the semiconductor device. The doped regions 372 of same doping type as the lightly doped regions 350 together separate the heavily doped regions 367 of the drain from the channel regions 370 formed in the oppositely doped N-type wells 325.

The P-type doped regions 372 may happen to be embodied in the substrate 315 which has a doping concentration profile between $1 \cdot 10^{14}$ and $1 \cdot 10^{16}$ atoms/$cm^3$. Employing the substrate 315 as the P-type doped regions 372 provides an opportunity to omit a masking and a processing step in the manufacture of the semiconductor device. In yet another alternative embodiment, the P-type doped regions 372 may be formed by an ion implantation process prior to implanting the P-type heavily doped regions 367 for the source and the drain of the P-LDMOS device. Of course, the P-type doped regions 372 may be formed with any doping concentration profile less than the P-type heavily doped regions 367. Incorporating the P-type doped regions 372 into the P-LDMOS device further increases a breakdown voltage between the P-type heavily doped regions 367 and the N-type well 325 of the P-LDMOS device. The P-LDMOS device, therefore, exhibits a higher drain-to-source voltage handing capability due to the higher breakdown voltage thereof and provides a higher source-to-gate voltage handling capability as well when the source is more positive than the gate 340. It should be understood that while the doped regions have been described with respect to the P-LDMOS device, the principles are equally applicable to the N-LDMOS device and, for that matter, other transistors of analogous construction.

The P-LDMOS and N-LDMOS devices illustrated and described with respect to FIG. 3 are referred to as asymmetrical devices. In other words, the asymmetrical nature of the source and drain of the semiconductor device of FIG. 3 provide for an asymmetrical device. Of course, those skilled in the art should understand that the dimensions of the source and drain (including the lightly and heavily doped regions thereof) may vary and still fall within the broad scope of the present invention. The semiconductor device also includes metal contacts 385 defined by dielectric regions 380 formed over silicide layers (one of which is designated 375) for the gate, source, and drain of the PMOS, NMOS, P-LDMOS, and N-LDMOS devices.

As introduced herein, a semiconductor device (also referred to as a "power semiconductor device") includes one or more decoupling capacitors placed under a semiconductor die including a MOSFET embodied in an LDMOS device (also referred to as a "power MOSFET" or "enhanced MOSFET"), preferably in a distributed fashion, to reduce an impedance of a voltage source employed for the drivers. The drivers can be distributed on the periphery of the semiconductor die to substantially equalize timing of drive signals coupled to individual MOS cells for MOS devices and LDMOS cells for LDMOS devices. It is generally understood that an LDMOS device is formed by coupling sources and drains of a large number of small LDMOS cells in parallel in a common die (e.g., 100,000 or more cells), and driving the individual gates of the LDMOS cells in parallel from a common circuit node. A design challenge is to match the timing of signals coupled to the individual gates so that the LDMOS cells are turned on or off substantially simultaneously. Inability to maintain synchronization of the signals to the individual gates can result in semiconductor device failure. In conventional designs, high-frequency characteristics of gate signals are suppressed so that the resulting lower-frequency signals arrive substantially simultaneously.

An embodiment is now described for a structure to efficiently route signals into and out of an LDMOS device formed within a semiconductor die. In an embodiment, a plurality of LDMOS cells are formed within the semiconductor die. Distributed circumferential signal paths are formed within the semiconductor die with distributed three-dimensional decoupling using metallic pillars (e.g., elongated copper pillars) that can be formed with an aspect ratio (e.g., equal to or greater 1 to 1), to extract current from the drain or source contacts (or from emitter or collector contacts) of the LDMOS device to distributed decoupling devices. This structure does not rely on an intermediary conventional package pin and solder joint to a board with a single point of decoupling. The drain and source contacts are contacted, but need not be routed, through traditional top-level chip metallization as used in conventional integrated circuit devices. Rather, a grid of metallic pillars is used that contact a conductive, patterned leadframe such as a conductive, patterned leadframe formed on an upper surface of a printed circuit board in multiple locations with a plurality of small decoupling devices (e.g., decoupling capacitors). The decoupling devices are distributed and placed in a third dimension beneath the printed circuit board. The decoupling devices are placed on a conductive, patterned leadframe on a lower surface of the printed circuit board below the semiconductor die. The conductive, patterned leadframe on the upper surface of the printed circuit board is coupled to the conductive, patterned leadframe on the lower surface of the printed circuit board by a plurality of vias. The effect of an electrically long transmission line is thus defeated by using multiple, distributed, decoupling devices that are placed in the third dimension via the leadframes and the vias below the grid of metallic pillars. Alternatively, a conductive, patterned leadframe may be packaged with the semiconductor die and then placed on a printed circuit board.

An alternative bumped structure with an under-bump metallization scheme would place bumps in each location. A bump is typically formed using deposition methods such as vapor deposition of solder material or by ball bumping with wire-bonding equipment. The manufacturing implications for such a manufacturing process may be too costly to be deemed practical as described in U.S. Pat. No. 7,989,963, entitled "Transistor Circuit Formation Substrate," by Simon Tam, filed Mar. 14, 2008. The use of pillars and their connection to a leadframe in a package as described in U.S. Pat. No. 6,681,982, entitled "Pillar Connections for Semiconductor Chips and Method of Manufacture," by Tung, filed Jun. 12, 2002, U.S. Pat. No. 6,510,976, entitled "Method for Forming a Flip Chip Semiconductor Package," by Hwee, filed May 18, 2001, U.S. Pat. No. 6,550,666, entitled "Method for Forming a Flip Chip on Leadframe Semiconductor Package," by Chew, filed Aug. 21, 2001, U.S. Pat. No. 6,578,754, entitled "Pillar Connections for Semiconductor Chips and Method of Manufacture," by Tung, filed Apr. 27, 2000, and U.S. Pat. No. 6,592,019, entitled "Pillar Connections for Semiconductor Chips and Method of Manufacture," by Tung, filed Apr. 26, 2001, is a more widely established and cost-effective manufacturing process upon which a practical solution to the distributed routing problem can be achieved. Each of these patents is incorporated herein by reference.

An embodiment of a power semiconductor device is now described. In one aspect, a plurality of drivers (e.g., gate drivers) is positioned on the periphery of the power semiconductor die to equalize gate timing and to provide low gate-drive impedance for a driver. Physical structures are produced on metallic strips and on the semiconductor die to improve a redistribution layer ("RDL") and the switch output capacitance $C_{oss}$. The metallic strips such as aluminum strips are formed and positioned to route gate signals to individual LDMOS cells to reduce gate resistance and improve equalization of timing of gate-drive signals. A gate-drive bias voltage "VDDR" bus and ground ("GND" or "PGND") rails are bumped to reduce gate-drive supply impedance.

This structure enables gate-drive signals to arrive at the respective gates of the LDMOS cells at effectively the same time. Decoupling devices for the gate-drive bias voltage bus are placed in paths lying directly under the semiconductor die in a distributed way. The result is that low impedance is presented to signals conducted along gate-drive transmission lines formed as metallic strips.

In an embodiment, the metallic strips for the gate-drive signals extend on the semiconductor die from the periphery for connections to the LDMOS cells in a central region thereof. The metallic strips are employed for the gate-drive connections from the die periphery to the LDMOS cells. Metallic pillars are formed as electroplated metallic (e.g., copper) columns to couple an external decoupling device positioned under the semiconductor die to a point thereon. In an embodiment, at least one decoupling device is positioned directly under the semiconductor die. A pillar and a decoupling device are coupled to an end of ones of the metallic strips for the gate-drive signals. In an embodiment, potting is formed over to provide structural support and protection for the metallic pillars.

Figure 4:
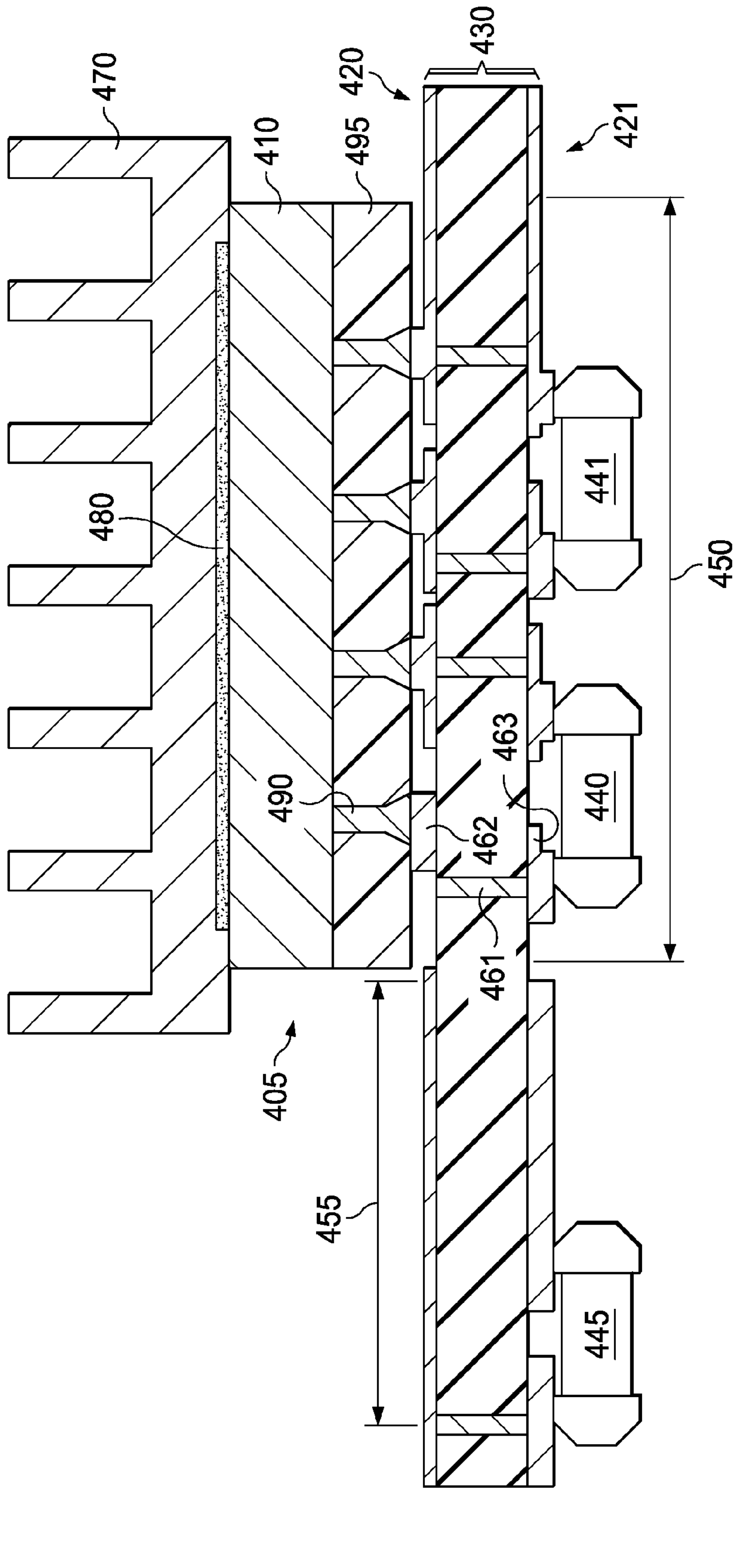
FIG. 4 illustrates an elevation view of an embodiment of a semiconductor device showing an inverted semiconductor die coupled to a plurality of decoupling devices by metallic pillars.

Turning now to FIG. 4, illustrated is an elevational view of an embodiment of a semiconductor device 405 showing an inverted semiconductor die 410 coupled to a plurality of decoupling devices (e.g., decoupling or chip capacitors 440, 441) by metallic pillars (such as an elongated copper pillar or pillar 490). Localized decoupling is achieved by use of the metallic pillars 490 and the decoupling capacitors 440, 441 at positions needing decoupling such as at positions at the periphery of the semiconductor die 410. Placement of one or more decoupling capacitors 440, 441 can be made substantially below a corresponding pillar 490, either directly above or directly below the semiconductor die 410, to reduce circuit path inductance. Placement of a decoupling device (e.g., decoupling or chip capacitor 445) outside a low inductance zone 450 that is substantially under the semiconductor die 410 (e.g., in a zone 455 that is outside the semiconductor die area) produces a higher inductance that may reduce the performance of the decoupling capacitor 445. In the low inductance zone 450, the decoupling capacitors 440, 441 are located entirely under the semiconductor die area of the semiconductor device 405. The metallic pillars 490 can also be used to couple to high-current source and drain terminals of the LDMOS cells of a LDMOS device located in a more centralized region of the semiconductor die 410.

In FIG. 4, a photoresist (e.g., a half mil (~12 μm) photoresist) is spun onto a top surface of the semiconductor die 410 and etched to form holes in which the metallic pillars 490 are formed. The photoresist is then removed so that cantilevered, conductive pillars remain. On the semiconductor die 410, aluminum is deposited first, followed by a tin-copper or flash/seed layer copper deposit and electroplating. To provide mechanical stability, the metallic pillars 490 are surrounded with plastic 495 (e.g., an encapsulant such as epoxy or a polyimide) with an end of each metallic pillar 490 exposed on a surface of the plastic 495. The metallic pillars 490 may be formed in, and may extend from, a polyimide layer. The metallic pillars 490 contact lands of a conductive patterned leadframe 420 defined by artwork on an upper surface of a printed circuit board 430. The metallic pillars 490 are reflow soldered to the conductive patterned leadframe 420. Vias (e.g., one of which is designated 461) are constructed in the printed circuit board 430 to provide a coupling of the metallic pillars 490 to a conductive patterned leadframe 421 on a lower surface of the printed circuit board 430 and to terminals of the decoupling capacitors 440, 441, 445. The decoupling capacitors 440, 441, 445 are reflow soldered with an array of solder bumps (e.g., one of which is designated 463) to lands of the conductive patterned leadframe 421 on the lower surface of printed circuit board 430. The lands are small geometric structures such as circular areas in the patterned leadframe conducive to a reflow soldering operation to attach a component. An array of solder bumps (e.g., one of which is designated 462) is positioned on lands of the conductive patterned leadframe 420 on the upper surface of printed circuit board 430. Thus, the decoupling capacitors 440, 441, 445 are placed on lands a short vertical distance from nodes on the periphery of the semiconductor die 410 to produce low impedance to local circuit ground for these nodes. The metallic pillars 490 are coupled by the solder bumps 462 to the conductive patterned leadframe 420.

The semiconductor die 410 is flipped before attachment to the printed circuit board 430 as illustrated in FIG. 4, and as a result the metallic pillars 490 under the semiconductor die 410 provide electrical contacts with the "top" side thereof. Since the device is a high-power device, a heat sink 470 is mounted on a "lower" surface of the semiconductor die 410 (via an adhesive 480), which is illustrated above the semiconductor die 410 in the top portion of FIG. 4, so that the decoupling capacitors 440, 441, 445 can be mounted on the printed circuit board 430 below the top side of the flipped semiconductor die 410. The heat sink 470 thus contacts the lower surface of the semiconductor die 410. Accordingly, the metallic pillars 490 enable the decoupling capacitors 440, 441, 445 to be placed on the printed circuit board 430 in close proximity to the top side of the semiconductor die 410, and the vias 461 are formed through the printed circuit board 430 to couple the semiconductor die 410 to the array of decoupling capacitors 440, 441, 445 under the printed circuit board 430. In this manner, a distributed decoupling function is provided for the power semiconductor device 405. In an embodiment, the same or a different leadframe can be used to couple to the grid of solder bumps or pillars and other circuit elements. An example leadframe is 6 millimeters ("mm")×6 mm. The structure illustrated in FIG. 4 can be potted/encapsulated (e.g., in epoxy) and the resulting assembly can be coupled to a leadframe, for instance, with a clip inductor as described by in U.S. Pat. No. 7,688,172, entitled "Magnetic Device Having a Conductive Clip," by Lotfi, et al., filed Oct. 5, 2005, which is incorporated herein by reference.

Thus, an inverted semiconductor (e.g., silicon) die is coupled to an upper surface of a printed wiring or circuit board by elongated metallic pillars, and decoupling devices are coupled to a lower surface of the printed circuit board below the semiconductor die. In an embodiment, at least one of a plurality of decoupling devices are coupled to a lower surface of the printed circuit board directly below the semiconductor die. With this structure, reduced circuit impedance is produced by a metallic path between the semiconductor die and at least one decoupling devices. The inverted semiconductor die, the printed circuit board, and at least one decoupling chip device can be readily assembled in a cost-effective reflow soldering process. This structure avoids the need to produce a plurality of alternating, small-footprint, metallic source and drain pads on an exposed surface of the semiconductor die structure that would otherwise be needed to provide a low-inductance connection to a printed circuit board to which the semiconductor die is attached, thereby facilitating layout of the printed circuit board. Alternatively as illustrated and described below, the conductive patterned leadframe 420 may be packaged with the semiconductor die 410 and metallic pillars 490 within a packaged semiconductor device and then placed on a printed circuit board 430 with the array of decoupling capacitors 440, 441, 445 thereunder (see, e.g., FIG. 18 for the packaged semiconductor device).

Figure 5:
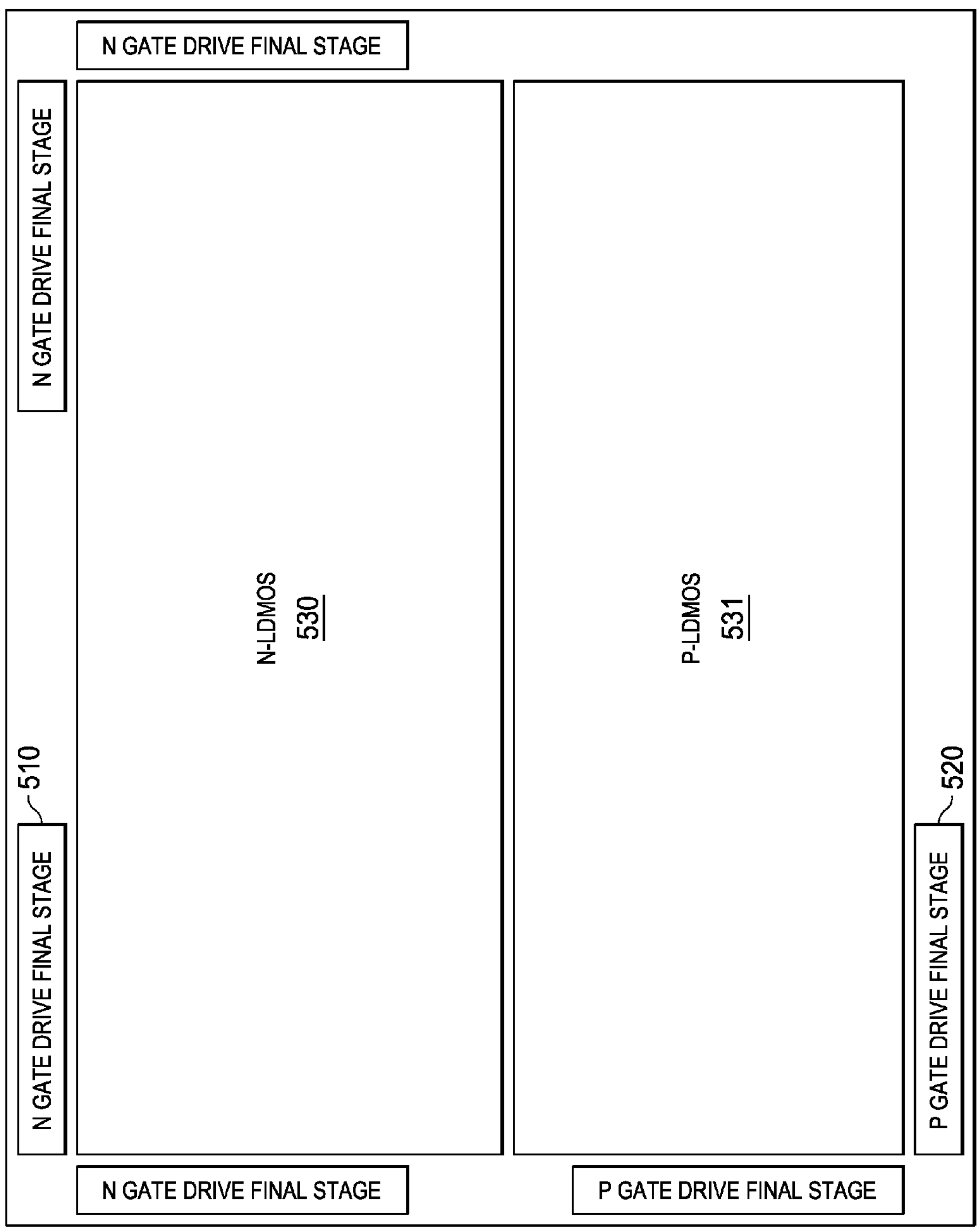
FIG. 5 illustrates a plan view of an embodiment of a semiconductor device formed with a circumferential ring distribution system.

Turning now to FIG. 5, illustrated is a plan view of an embodiment of a semiconductor device formed with a circumferential ring distribution system. An N-LDMOS device 530 and a P-LDMOS device 531 represent a pair of LDMOS devices that form a power stage of, for example, a buck or boost dc-dc power converter. As stated previously hereinabove, each LDMOS device is formed of a large number of individual LDMOS cells. FIG. 5 shows the N-LDMOS device 530 and the P-LDMOS device 531 and drive final stages such as the N gate-drive final stage 510 and the P gate-drive final stage 520 that are on the periphery of the semiconductor die (of the power semiconductor device). A conventional design employs only one structure for the N gate-drive final stage 510 and only one structure for the P gate-drive final stage 520 located on one end of the semiconductor die. Distributing a plurality of drive final stages around a periphery of the semiconductor die for each of the LDMOS device 530 and the P-LDMOS device 531 substantially improves timing of the drive signals coupled to the individual LDMOS cells. Within each drive final stage is a totem-pole arrangement of P-MOS cells coupled in series with N-MOS cells driven by a cascaded buffer. The drive final stages are electrically coupled in parallel.

Of the large number (e.g., thousands) of LDMOS cells that make up each LDMOS device, the gate-drive signals on the control or gate terminals should arrive at substantially the same time and with substantially the same amplitude. Attenuating high-frequency characteristics of the gate-drive signals with a capacitor to improve relative simultaneity compromises efficiency of high-frequency operation. A plurality of decoupling devices are included in the design to provide low impedance for the gate-drive bias voltage VDDG bus for the gate drivers, not to slow down the gate drivers. The decoupling devices reduce the impedance of the gate-drive bias voltage VDDG bus that is supplied to the distributed drivers. Some propagation delay variation for gate-drive signals still remains, but the largest part thereof is removed by the distributed gate-drive structure.

Figure 6:
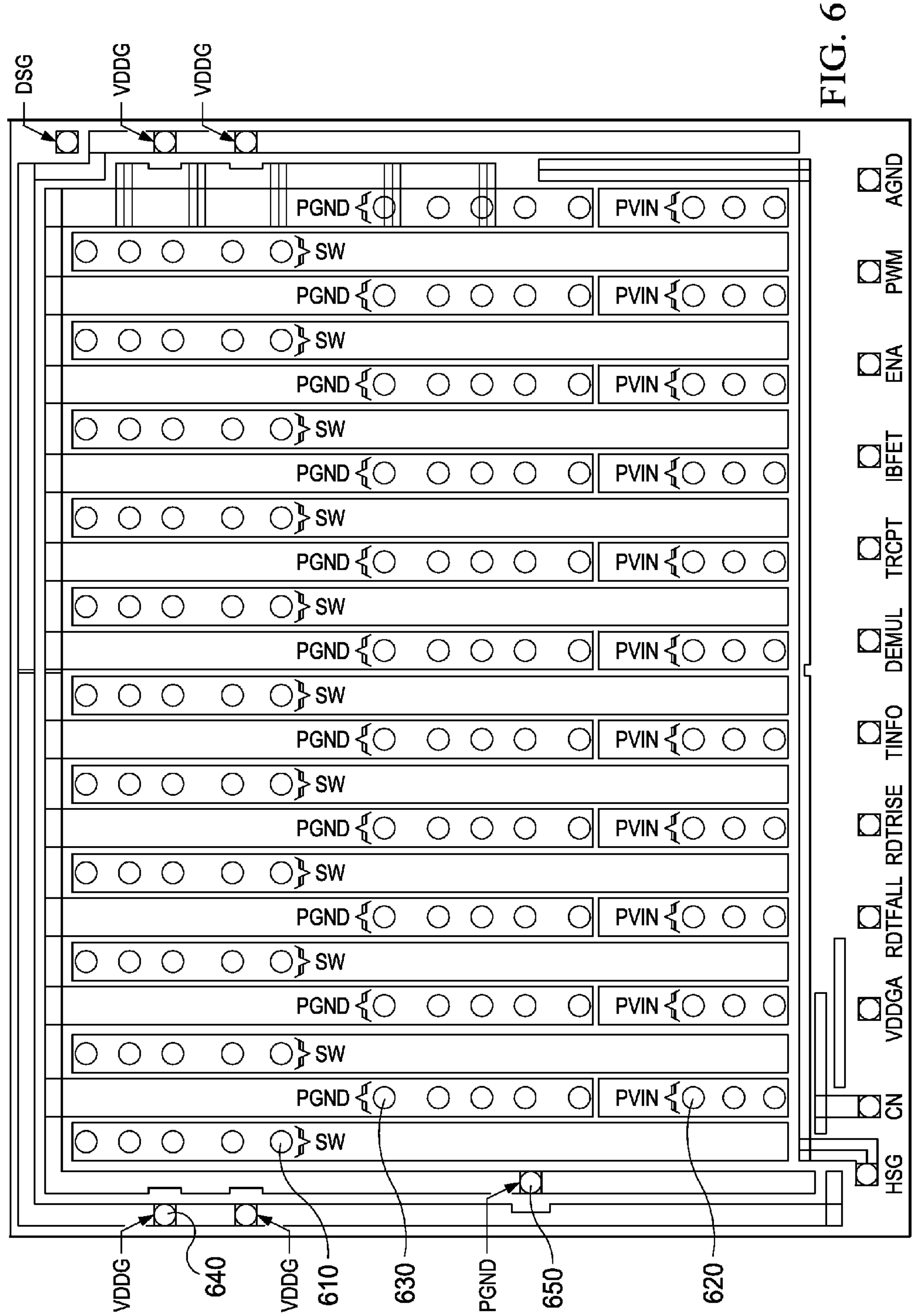
FIG. 6 illustrates a plan view of an embodiment of a redistribution layer formed as a deposition on a semiconductor die.

Turning now to FIG. 6, illustrated is a plan view of an embodiment of a redistribution layer formed as a deposition on a semiconductor die. The redistribution layer (e.g., a copper redistribution layer) distributes power and ground nodes across the surface of the semiconductor die, as well as other circuit nodes coupled to the LDMOS cells. The redistribution layer is also employed to distribute control and monitoring signals to the gate drivers.

The small round circles (labeled "SW," "PGND," "PVIN," etc.) are locations of elongated metallic (e.g., copper) pillars that couple the LDMOS cells and other circuit nodes to a conductive (e.g., copper) patterned leadframe 420 that was described previously hereinabove with reference to FIG. 4 or a leadframe 1179 described below with reference to FIG. 17D. The small round circles labeled "SW" (one of which is designated 610) form a circuit node coupling the drains of the P- and N-LDMOS cells together and to an external output inductor such as the output inductor $L_{out}$ illustrated in FIG. 1. The small round circles labeled "PVIN," (one of which is designated 620) provide a positive bias voltage to the sources of the LDMOS cells forming the high-side P-LDMOS device, and the small round circles labeled "PGND," (one of which is designated 630) provide local circuit ground to the sources of the LDMOS cells forming the low-side N-LDMOS device. At the periphery of the redistribution layer, the small round circles labeled "VDDG," (one of which is designated 640) supplies positive bias voltage to the gate-drive inverters (also referred to as "gate drivers" or "drivers") that drive the gates of the LDMOS cells, and the small round circle labeled "PGND," (one of which is designated 650) supplies local circuit ground to the gate-drive inverters.

Figure 7:
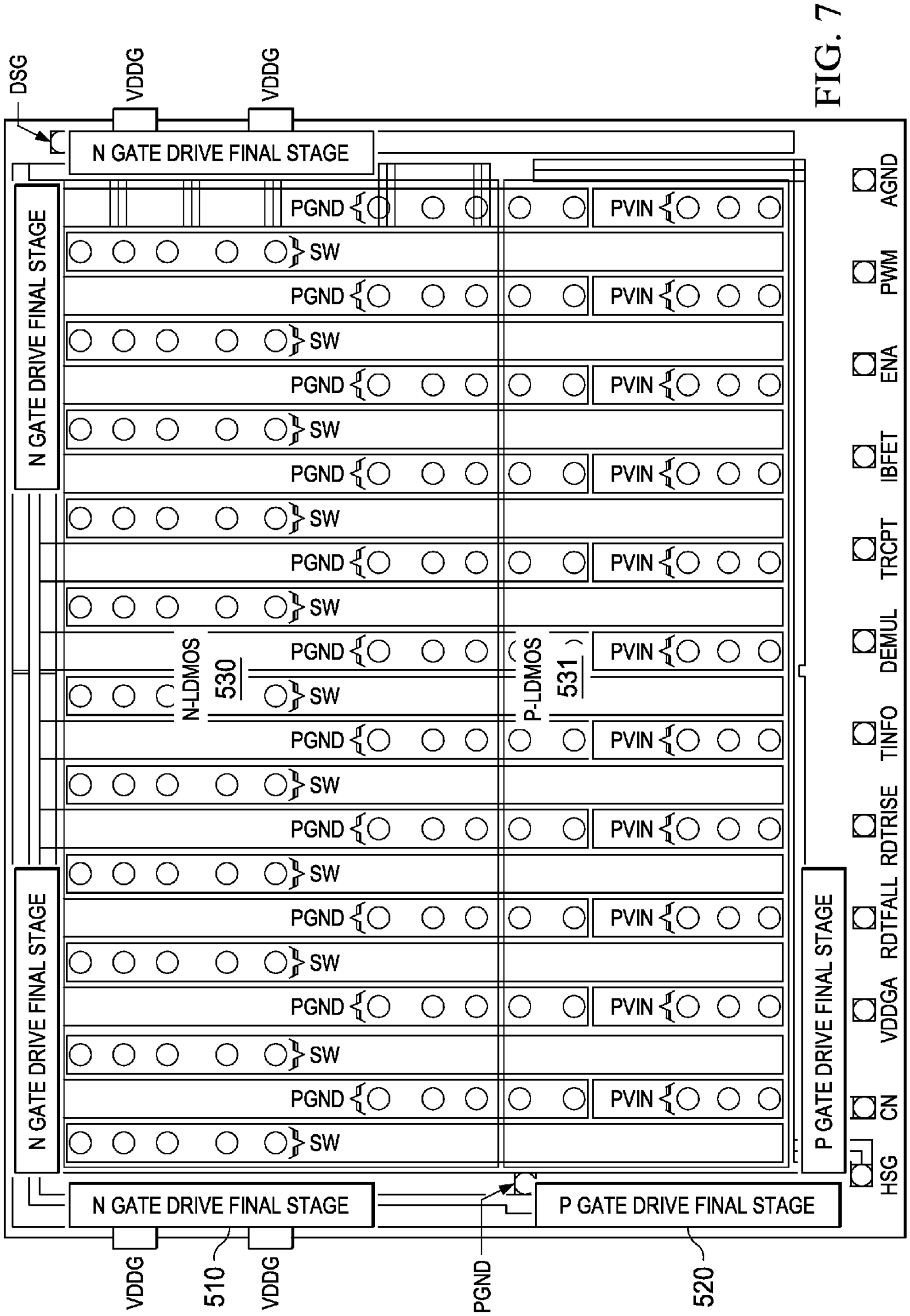
FIG. 7 illustrates a plan view of the redistribution layer illustrated in FIG. 6 with an overlay of an outline showing an N-LDMOS device and a P-LDMOS device.

Turning now to FIG. 7, illustrated is a plan view of the redistribution layer illustrated in FIG. 6 with an overlay of an outline showing the N-LDMOS device 530 and the P-LDMOS device 531 (see FIG. 5). In addition, outlines showing the locations of the N gate-drive final stage 510 and P gate-drive final stage 520 are also shown. In an embodiment, the N-LDMOS device 530 is formed with 220,000 stripes, each stripe representing an N-LDMOS cell being about 20 microns wide and about 2-3 microns in channel length. In an embodiment, the P-LDMOS device 531 is formed with 120,000 stripes of about the same size.

Figure 8:
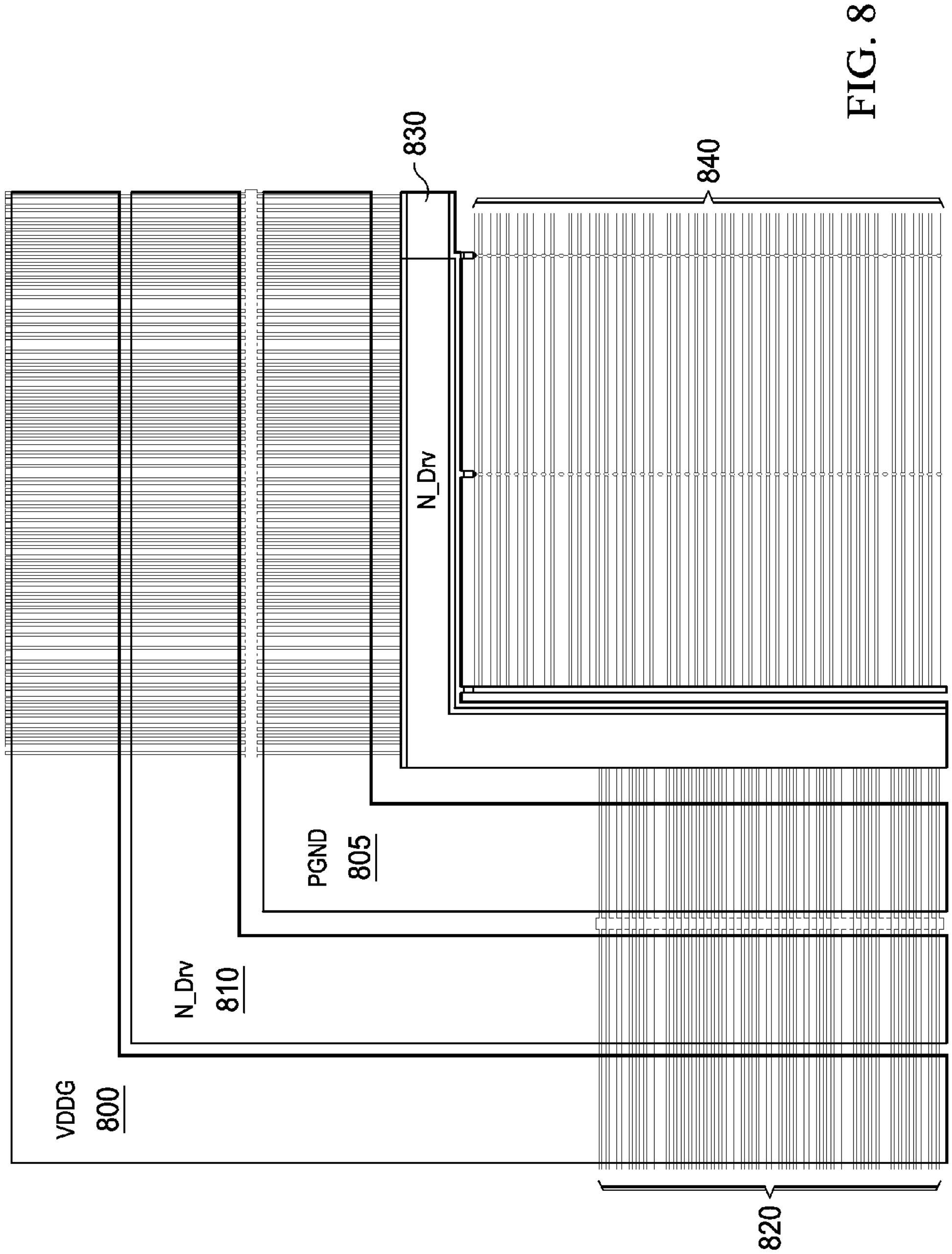
FIGS. 8 and 9 illustrate magnified plan views of the redistribution layer illustrated in FIG. 6.
Figure 9:
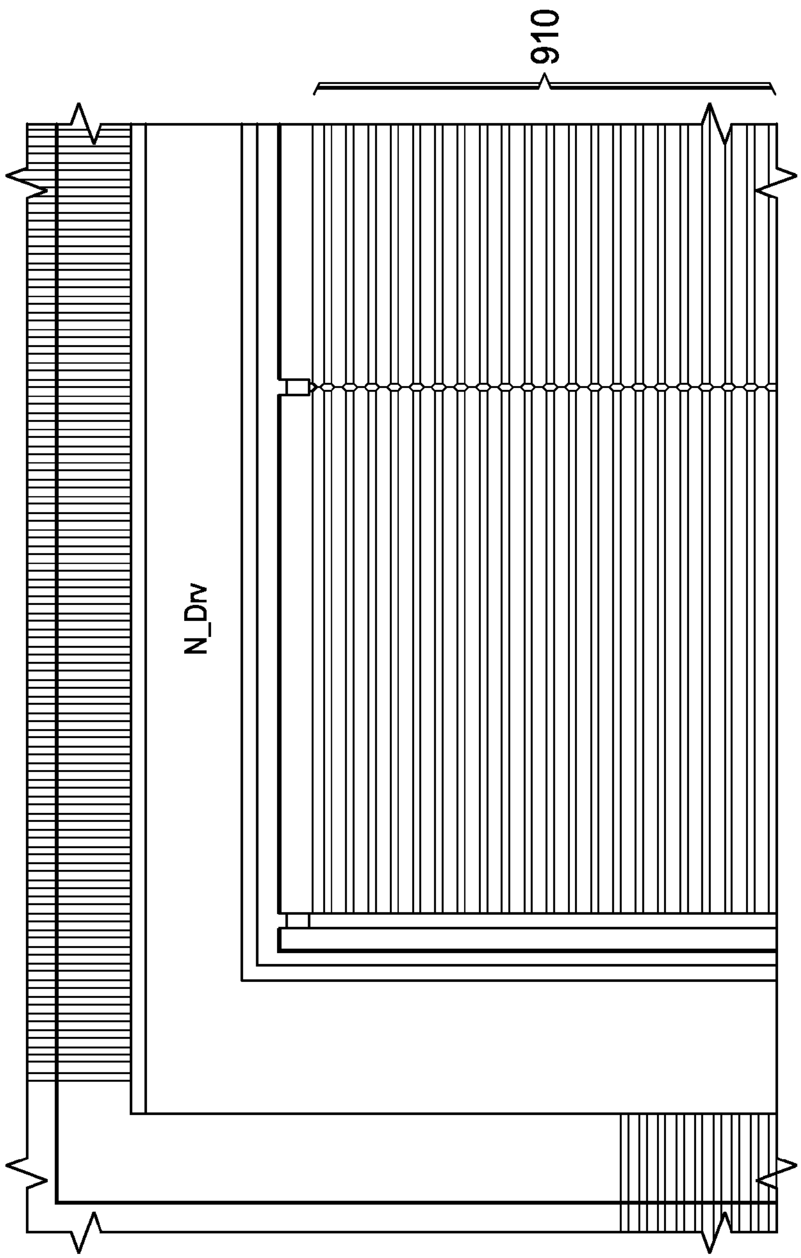

Turning now to FIGS. 8 and 9, illustrated are magnified plan views of the redistribution layer illustrated in FIG. 6. Around the periphery are three paths for the gate-drive inverters that drive the gates of the N-LDMOS and P-LDMOS cells. A path 800 provides the positive gate-drive bias voltage VDDG bus for the gate-drive inverters, and a path 805 provides local circuit ground for the inverters. A path N_Drv 810 is the gate-drive signals produced by the gate-drive inverters. A path N_Drv 830 is on another copper/metallic layer and is electrically common with the path N_Drv 810. The path N_Drv 830 is coupled to the gates of the N-LDMOS cells. The paths 820 are further metallizations (e.g., 20 μm metallizations) under the redistribution layer, and the paths 840 are representations of 20 μm metallizations coupled to gate polysilicon layers or strips (generally referred to as "gates") of the N-LDMOS cells. FIG. 9 illustrates gate polysilicon strips 910 of the N-LDMOS cells. It should be understood that the gates may be formed from other materials such as an electrically conductive metallic material.

Figure 10:
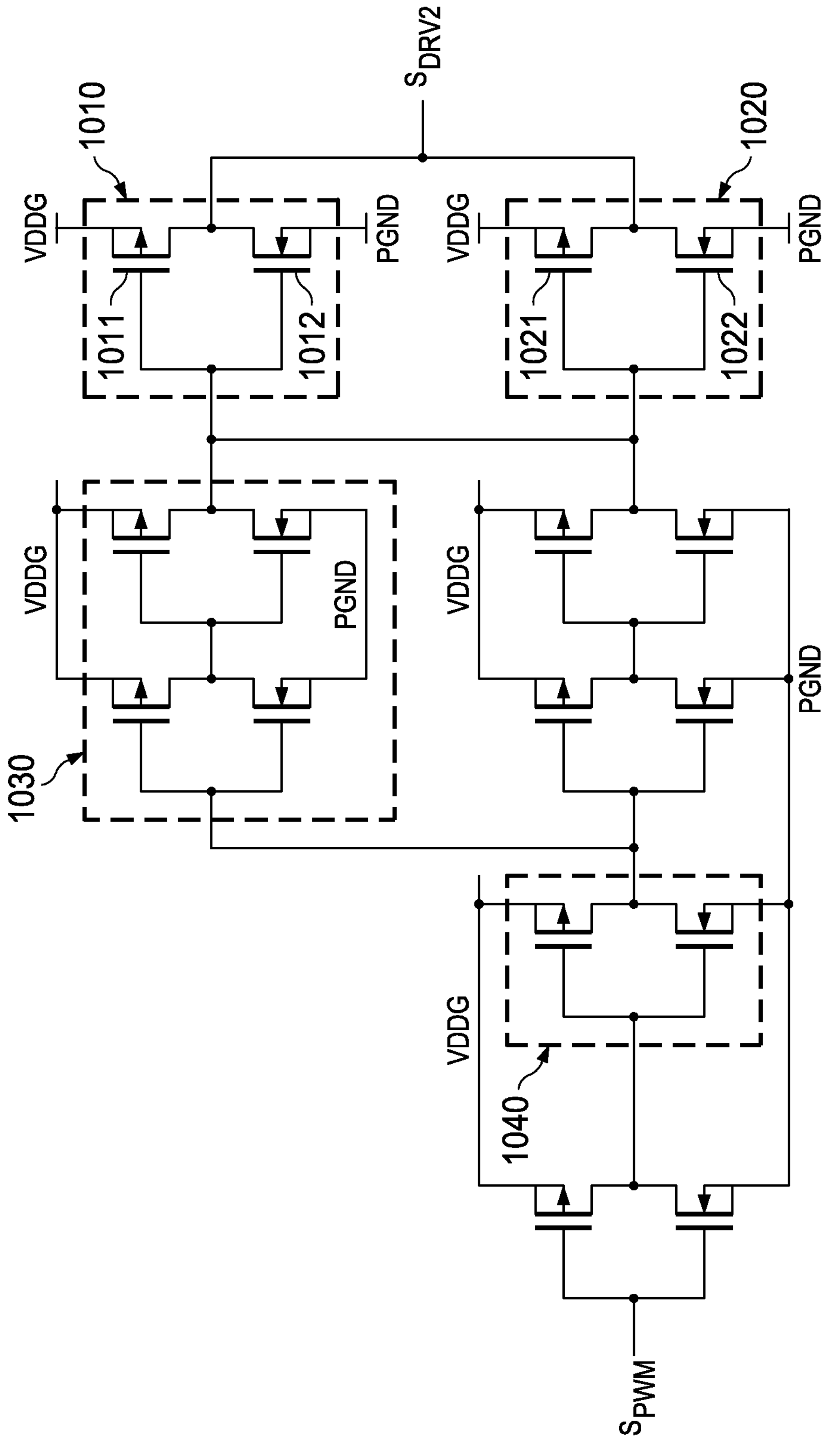
FIG. 10 illustrates a schematic view of an embodiment of an N-type metal oxide semiconductor ("NMOS") inverter chain configured to produce a large amplitude gate-drive signal illustrated in FIG. 1 for an N-LDMOS device from a pulse width modulated ("PWM") signal.

Turning now to FIG. 10, illustrated is a schematic view of an embodiment of an NMOS inverter chain configured to produce a large amplitude gate-drive signal $S_{DRV2}$ illustrated in FIG. 1, for an N-LDMOS device from a PWM signal $S_{PWM}$. An even number (e.g., four) sequence of inverters as illustrated in FIG. 10 produces the large amplitude gate-drive signal $S_{DRV2}$ with a same sense from the low amplitude duty-cycle signal $S_{PWM}$. The NMOS inverter chains are labeled "N gate drive final stage" on FIGS. 5 and 7, and are distributed around the periphery of the device.

The output stage of the inverter chain is formed with a parallel-drive arrangement of first and second inverters 1010, 1020. The first inverter 1010 is formed with PMOS device 1011 and NMOS device 1012. The second inverter 1020 is formed with PMOS device 1021 and a NMOS device 1022. The first inverter 1010 is driven by a third inverter 1030 which is formed with smaller MOS devices, typically about one third the size of the MOS devices in the first inverter 1010. Similarly, the third inverter 1030 is driven by a fourth inverter 1040 formed with MOS devices that are about one third the size of the MOS devices in the third inverter 1030. In this manner the low-level input signal, the PWM signal $S_{PWM}$ illustrated in FIG. 1 is successively amplified in stages formed with successively larger MOS devices to produce the gate-drive signal $S_{DRV2}$ illustrated in FIG. 1 of sufficient amplitude to drive the auxiliary switch $Q_{aux}$ illustrated in FIG. 1.

A PMOS inverter chain corresponding to the NMOS inverter chain illustrated in FIG. 10 can be constructed with an even number of inverter stages to produce a large amplitude, same-sense gate-drive signal for a P-LDMOS device from the low-amplitude input signal $S_{PWM}$. The PMOS inverter chain would thus be operated in a complementary time period to the NMOS inverter chain, and with sufficient time separation to avoid shoot-through currents in the series-circuit arrangement of a main switch $Q_{mn}$ and the auxiliary switch $Q_{aux}$ illustrated in FIG. 1. While the NMOS and PMOS inverter chains are described employing NMOS and PMOS devices, it should be understood that N-LDMOS and P-LDMOS devices may be used to advantage.

Thus, as illustrated and described hereinabove with reference to the accompanying drawings, a semiconductor device and method of forming the same have been introduced. In one embodiment, the semiconductor device includes a semiconductor die formed with a plurality of LDMOS cells, a redistribution layer electrically coupled to the plurality of LDMOS cells, a plurality of metallic pillars (e.g., copper pillars formed as electroplated columns) distributed over and electrically coupled to the redistribution layer, and a conductive patterned leadframe electrically coupled to the redistribution layer by the plurality of metallic pillars. The semiconductor device further includes a gate driver electrically coupled to the redistribution layer and to gates of the plurality of LDMOS cells through the redistribution layer. The semiconductor device is potted with an encapulant with portions of the conductive patterned leadframe being exposed to serve as external contacts for the semiconductor device. Ones of the external contacts are coupled to a printed circuit board and ones of the external contacts are coupled to a plurality of decoupling devices (e.g., through vias on an opposing surface of the printed circuit board). At least one of the plurality of decoupling devices is located under the semiconductor die. Ones of the external contacts are coupled to gate drivers electrically coupled to the redistribution layer and to gates of the plurality of LDMOS cells through the redistribution layer and ones of the external contacts are coupled to drains or sources of the plurality of the LDMOS cells through the redistribution layer.

Figure 11:
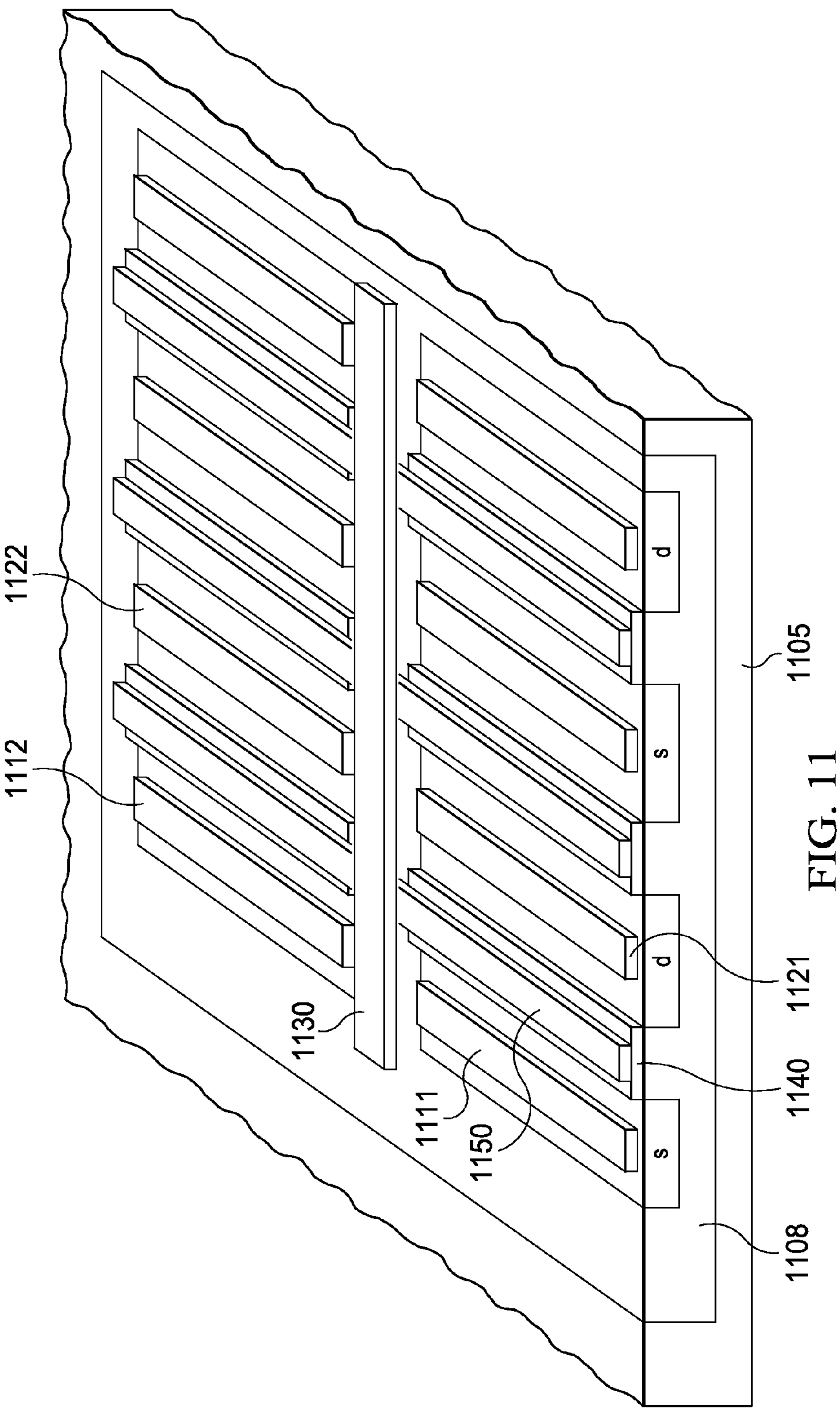
FIG. 11 illustrates a simplified three-dimensional view of an embodiment of a portion of a partially constructed N-LDMOS device embodied in a semiconductor device, or portions thereof.

Turning now to FIG. 11, illustrated is a simplified three-dimensional view of an embodiment of a portion of a partially constructed N-LDMOS device embodied in a semiconductor device, or portions thereof. In accordance with standard practices in the semiconductor industry, various features in this and subsequent drawings are not drawn to scale. The dimensions of the various features may be arbitrarily increased or decreased for clarity of the discussion herein, and like reference numbers may be employed for analogous features of different devices that make up the semiconductor device.

The N-LDMOS device is formed in a semiconductor die including a lightly doped P substrate 1105 and a P-well 1108 implanted in the lightly doped P substrate 1105. The P-well 1108 includes a sequence of doped source regions "s" and drain regions "d" in an alternating pattern, laid out as parallel strips in the P-well 1108 or directly on the lightly doped P substrate 1105 when the optional P-well 1108 is not implanted. Source metallic (e.g., aluminum) strips (ones of which are designated 1111, 1112) are formed in a substantially planar first metallic (e.g., aluminum) layer M1 and lie over and electrically contact the doped source regions "s," but not to each other. Correspondingly, drain metallic (e.g., aluminum) strips (ones of which are designated 1121, 1122) are also formed in the first metallic layer M1 and lie over and electrically contact the doped drain regions "d," but not to each other. Thus, a plurality of alternating source and drain metallic strips are formed in the first metallic layer M1 above the lightly doped P substrate 1105 and parallel to and forming an electrical contact (e.g., through a silicide layer) with respective ones of a plurality of source and drain regions. Gate oxide strips (one of which is designated 1140) isolate polysilicon gate strips (one of which is designated 1150) from the underlying P-well 1108 or from the lightly doped P substrate 1105 when the optional P-well 1108 is not implanted. Thus, a plurality of gate polysilicon strips 1150 are formed over the lightly doped P substrate 1105 between and parallel to ones of the plurality of source and drain regions and oriented parallel to the plurality of alternating source and drain metallic strips. Not shown in FIG. 11 are additional and differently doped strips formed in the P-well 1108 or in the lightly doped P substrate 1105 that lie between and separate the doped source regions "s" and the doped drain regions "d". A gate metallic (e.g., aluminum) strip 1130 in the first metallic layer M1 is positioned over, aligned perpendicular to, and is electrically coupled to the gate polysilicon strips 1150.

Figure 12:
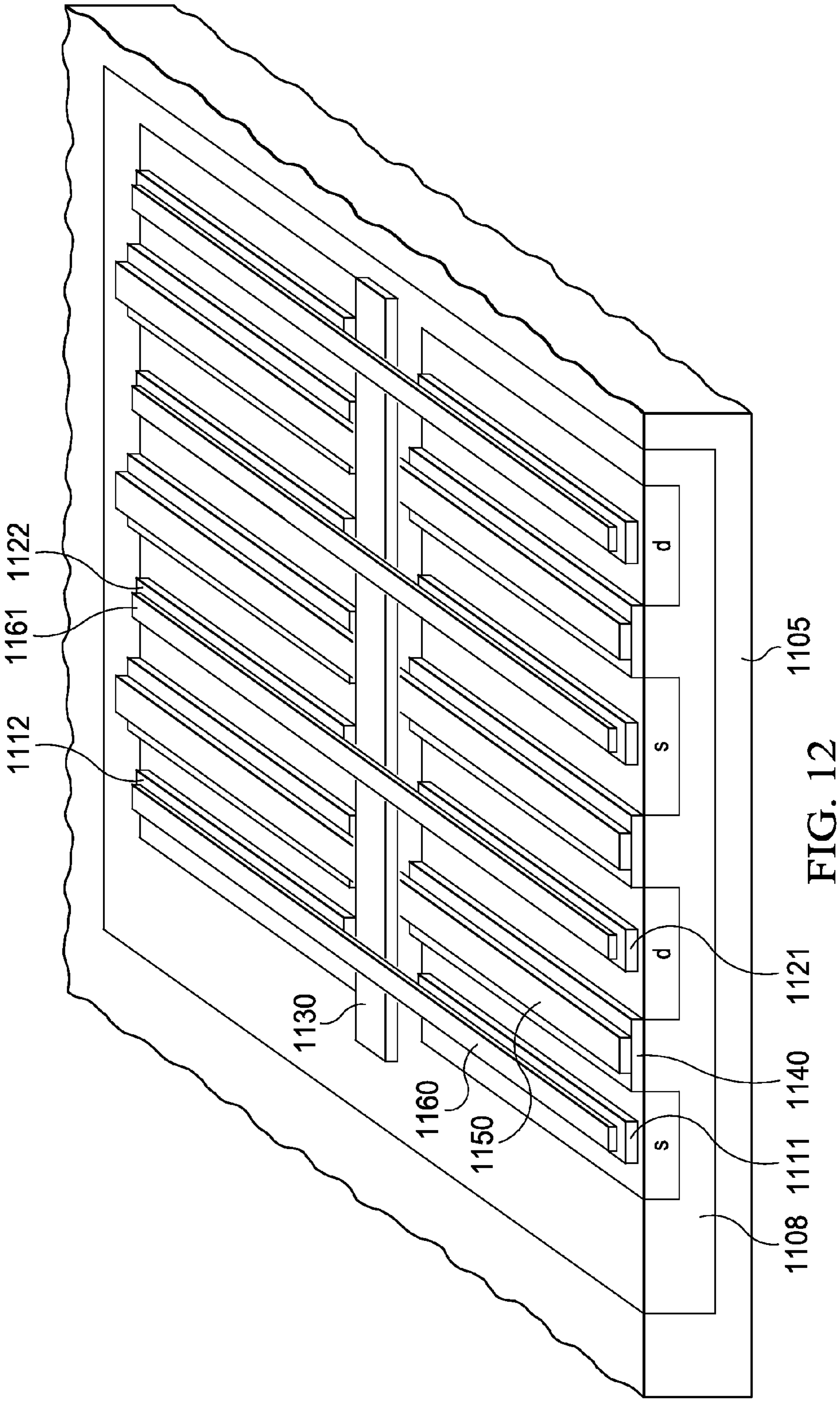
FIG. 12 illustrates a simplified three-dimensional view of a portion of the partially constructed N-LDMOS device after formation of a substantially planar second metallic layer.

Turning now to FIG. 12, illustrated is a simplified three-dimensional view of a portion of the partially constructed N-LDMOS device after formation of a substantially planar second metallic (e.g., aluminum) layer M2. The second metallic layer M2 is formed in strips such as source metallic (e.g., aluminum) strips (one of which is designated 1160) and drain metallic (e.g., aluminum) strips (ones of which is designated 1161) that lie over respective source metallic strips 1111, 1112 and drain metallic strips 1121, 1122 formed in the first metallic layer M1. An isolation or insulating layer of silicon oxynitride (see, e.g., FIG. 19) separates and electrically isolates the first metallic layer from the second metallic layer. The source metallic strips 1160 in the second metallic layer M2 layer that lie over the source metallic strips 1111, 1112 in the first metallic layer M1 are coupled thereto by electrically conductive vias. Similarly, the drain metallic strips 1161 in the second metallic layer M2 layer that lie over the drain metallic strips 1121, 1122 in the first metallic layer M1 are coupled thereto by electrically conductive vias. Thus, a second plurality of alternating source and drain metallic strips are formed in the second metallic layer M2 above the first metallic layer M1 overlying and parallel to ones of the first plurality of alternating source and drain metallic strips. The first plurality of source and drain metallic strips are electrically coupled by vias to the respective second plurality of alternating source and drain metallic strips. The source and drain metallic strips 1160, 1161 in the second metallic layer M2 are not coupled to the gate metallic strip 1130 in the first metallic layer M1 that intersects and is electrically coupled to the gate polysilicon strips 1150.

Figure 13:
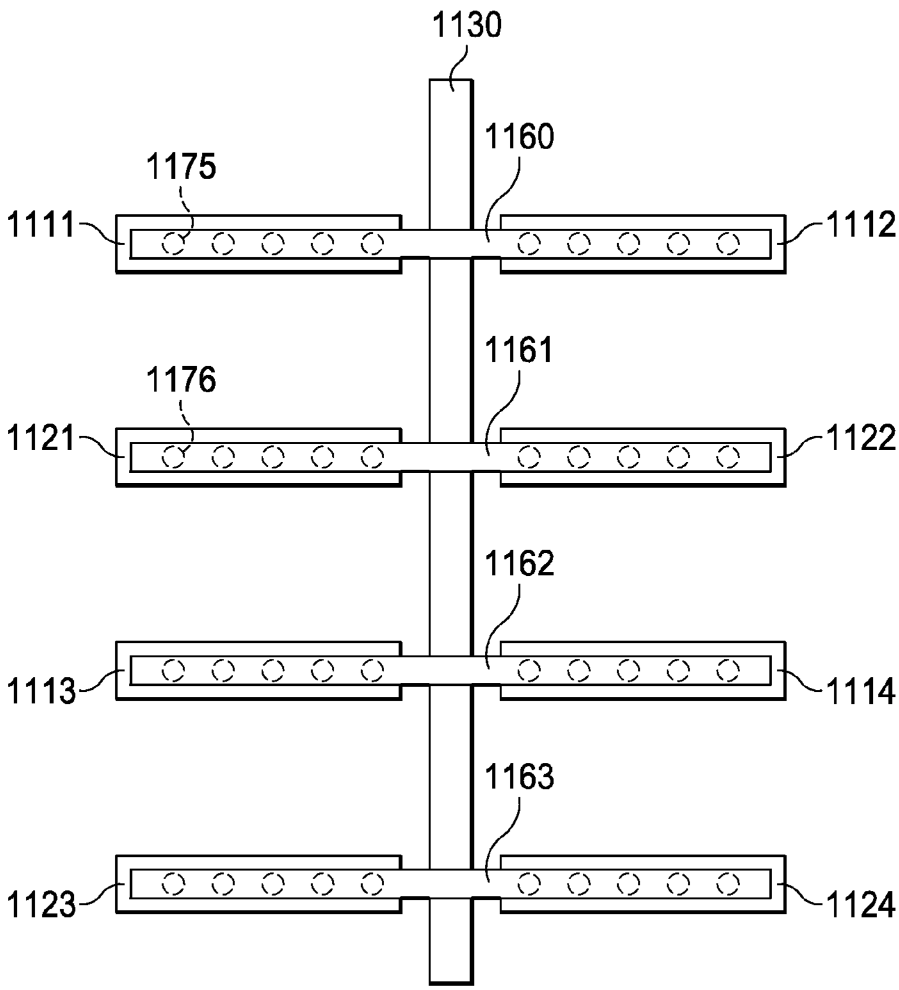
FIG. 13 illustrates a simplified plan view of a portion of the partially constructed N-LDMOS device after formation of the second-metallic layer.

Turning now to FIG. 13, illustrated is a simplified plan view of a portion of the partially constructed N-LDMOS device after formation of the second-metallic layer M2.

FIG. 13 illustrates vias (one of which is designated 1175) that electrically couple source metallic strips 1111, 1112, 1113, 1114 in the first metallic layer M1 to source metallic strips 1160, 1162 in the second metallic layer M2. Similarly, vias (one of which is designated 1176) electrically couple drain metallic strips 1121, 1122, 1123, 1124 in the first metallic layer M1 to drain metallic strips 1161, 1163 in the second metallic layer M2. The vias 1175, 1176 penetrate an isolation or insulating layer (see, e.g., insulating layers 1915 in FIG. 19) that separate and electrically isolates (insulates) the first metallic layer M1 from the second metallic layer M2. It is noted that, in an embodiment, vias do not electrically couple the gate metallic strip 1130 in the first metallic layer M1 to either the source metallic strips 1160, 1162 or the drain metallic strips 1161, 1163 in the second metallic layer M2.

Figure 14:
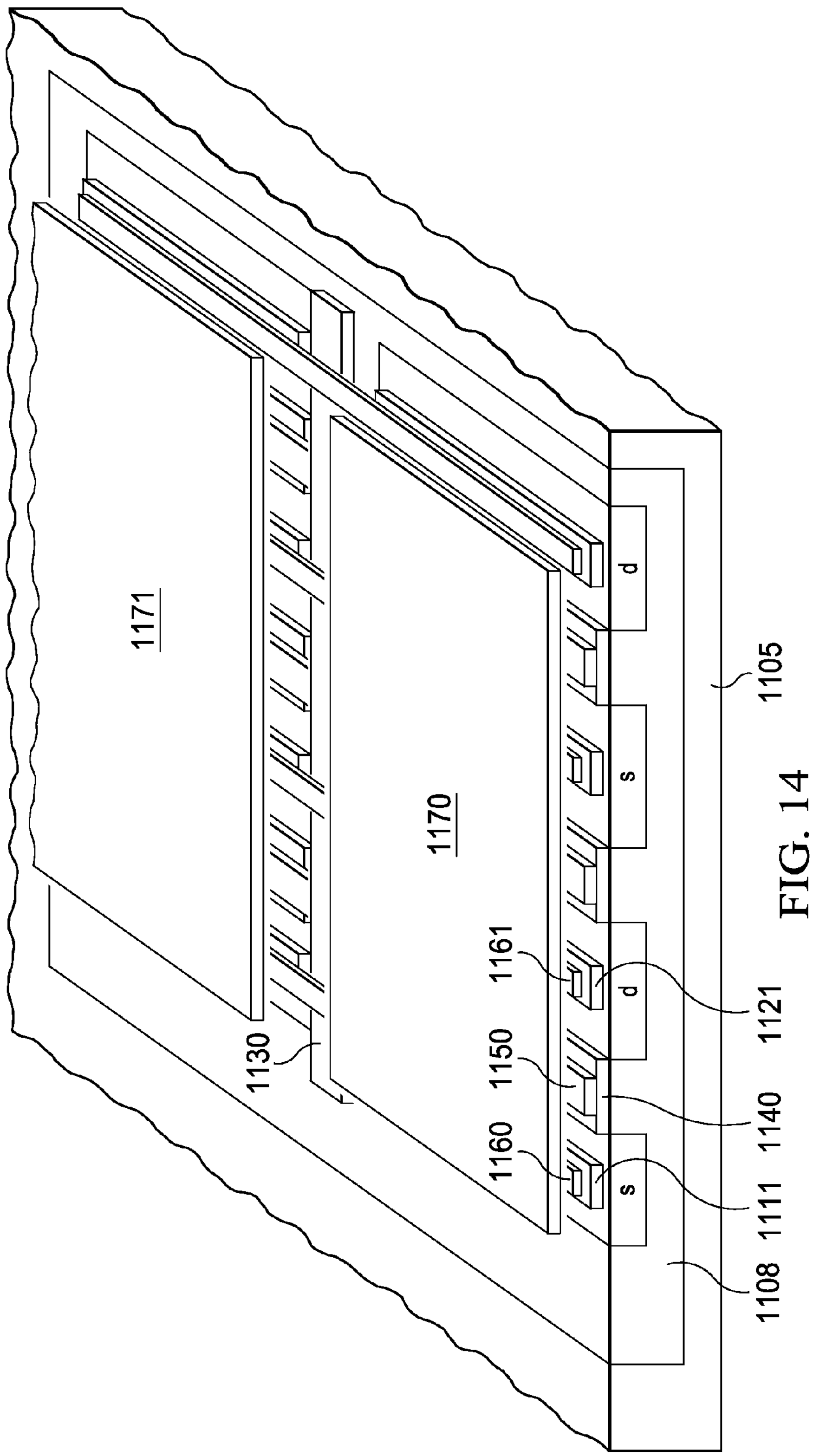
FIG. 14 illustrates a simplified three-dimensional view of a portion of the partially constructed N-LDMOS device after formation of a substantially planar third metallic layer.

Turning now to FIG. 14, illustrated is a simplified three-dimensional view of a portion of the partially constructed N-LDMOS device after formation of a substantially planar third metallic (e.g., aluminum) layer M3. The third metallic layer M3 overlies the second metallic layer M2. FIG. 14 illustrates N-LDMOS device source contact 1170 formed in the third metallic layer M3, and N-LDMOS device drain contact 1171, also formed in the third metallic layer M3. An isolation or insulating layer of silicon oxynitride (see, e.g., FIG. 19) separates and electrically isolates the second metallic layer from the third metallic layer. The N-LDMOS device drain contact 1171 is shared with a P-LDMOS device drain contact formed on the same die (also referred to as an "N-LDMOS/P-LDMOS device drain contact" 1171). The N-LDMOS device source contact 1170 is electrically coupled to the source metallic strips (one of which is designated 1160) in the second metallic layer M2 by vias (e.g., aluminum vias not shown in FIG. 14). The N-LDMOS/P-LDMOS device drain contact 1171 is electrically coupled to the drain metallic strips (one of which is designated 1161) in the second metallic layer M2 by vias (e.g., aluminum vias not shown in FIG. 14). Thus, the source and drain contacts formed in the third metallic layer M3 are electrically coupled by vias to ones of the second plurality of alternating source and drain metallic strips in the second metallic layer M2 and substantially cover the plurality of source and drain regions.

Figure 15:
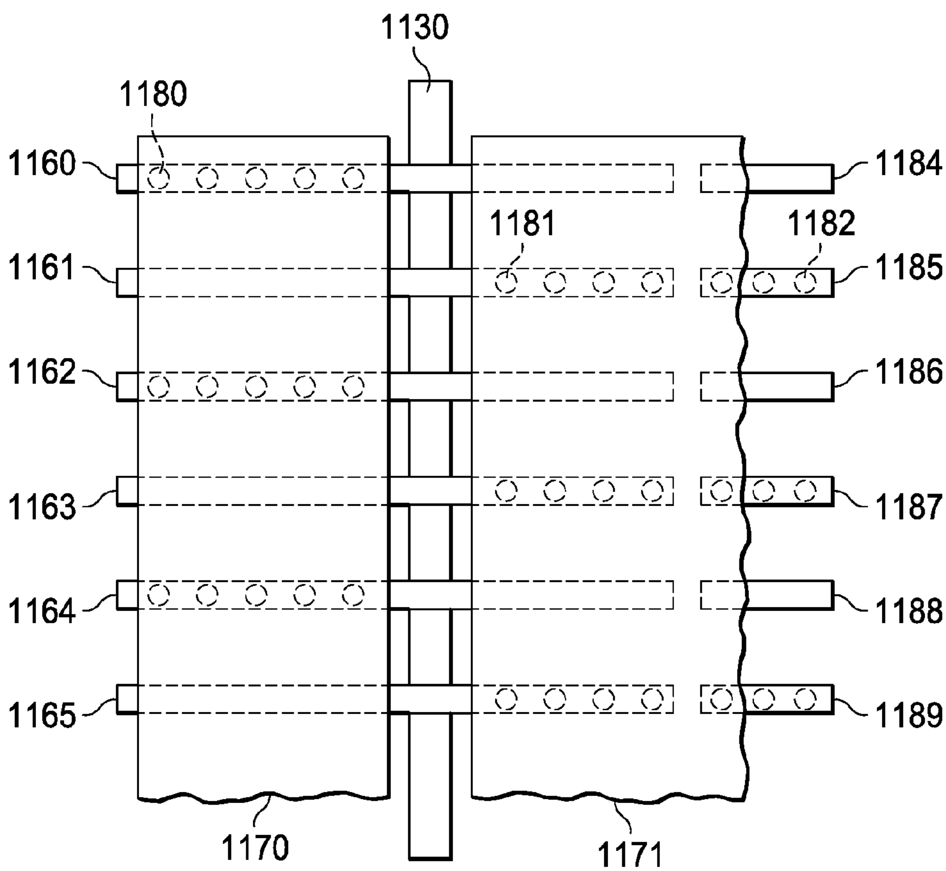
FIG. 15 illustrates a simplified plan view of a portion of the partially constructed N-LDMOS device after formation of the third metallic layer.

Turning now to FIG. 15, illustrated is a simplified plan view of a portion of the partially constructed N-LDMOS device after formation of the third metallic layer M3. FIG. 15 illustrates vias (one of which is designated 1180) that electrically couple the N-LDMOS device source contact 1170 formed in the third metallic layer M3 to the source metallic strips 1160, 1162, 1164 in the second metallic layer M2. Also illustrated in FIG. 15 are vias (one of which is designated 1181) that electrically couple the N-LDMOS/P-LDMOS device drain contact 1171 formed in the third metallic layer M3 to drain metallic strips 1161, 1163, 1165 in the second metallic layer M2. Also shown are vias (one of which is designated 1182) that electrically couple the N-LDMOS/P-LDMOS device drain contact 1171 formed in the third metallic layer M3 to P-LDMOS device drain metallic strips 1185, 1187, 1189 in the second metallic layer M2 of a P-LDMOS device. P-LDMOS source metallic strips 1184, 1186, 1188 in the second metallic layer M2 of the P-LDMOS device are electrically coupled by vias to a P-LDMOS device source contact in the third metallic layer M3 (not shown in FIG. 15). The vias 1180, 1181, 1182 penetrate an isolation or insulating layer (see, e.g., insulating layers 1915 in FIG. 19) that separate and electrically isolates (insulates) the second metallic layer M2 from the third metallic layer M3. Also illustrated in FIG. 15 is the gate metallic strip 1130 in the first metallic layer M1 that intersects and is electrically coupled to the gate polysilicon strips 1150 (see FIG. 14).

Figure 16:
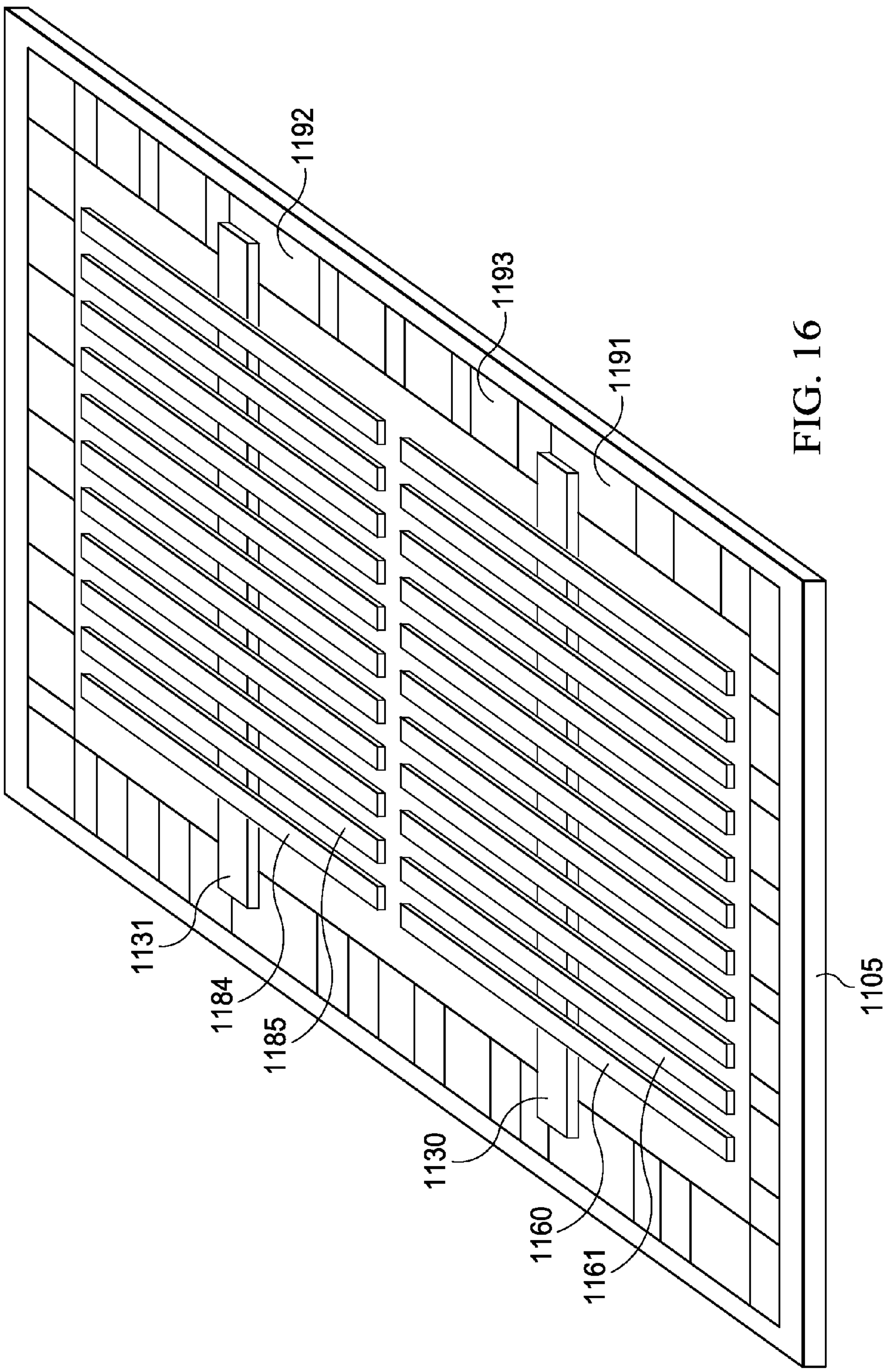
FIG. 16 illustrates a simplified three-dimensional view of an embodiment of a partially constructed semiconductor device including N-LDMOS and P-LDMOS devices illustrating a geometry of the source metallic strips and the drain metallic strips in a second metallic layer thereof.

Turning now to FIG. 16, illustrated is a simplified three-dimensional view of an embodiment of a partially constructed semiconductor device including N-LDMOS and P-LDMOS devices illustrating a geometry of the source metallic strips and the drain metallic strips in the second metallic layer M2 thereof. FIG. 16 illustrates gate drivers at the periphery of the semiconductor die coupled to the N-LDMOS and P-LDMOS devices such as an N-gate driver 1191 and P-gate driver 1192. Thus, the N-LDMOS device has a plurality of N-gate drivers (such as N-gate driver 1191) and P-LDMOS device has a plurality of P-gate drivers (such as P-gate driver 1192) around the periphery of the semiconductor die. Also illustrated in FIG. 16 are logic circuit elements located at the periphery of the semiconductor die such as logic circuit element 1193. The metallizations on the second metallic layer M2 overlie and are electrically coupled to respective metallizations on the first metallic layer M1 by vias as previously described hereinabove. For simplicity of illustration, portions of the first metallic layer M1 underlying the second metallic layer M2 are not illustrated in FIG. 16. Also shown in FIG. 16 are gate metallic strips 1130, 1131 in the first metallic layer M1 that intersect and are electrically coupled to the gate polysilicon strips (not shown) of the N-LDMOS and P-LDMOS devices. For purposes of consistency with the previous FIGUREs, the source metallic strip 1160 and the drain metallic strip 1161 in the second metallic layer M2 of the N-LDMOS device and the source metallic strip 1184 and the drain metallic strip 1185 in the second metallic layer M2 of the P-LDMOS device are designated in FIG. 16.

Figure 17:
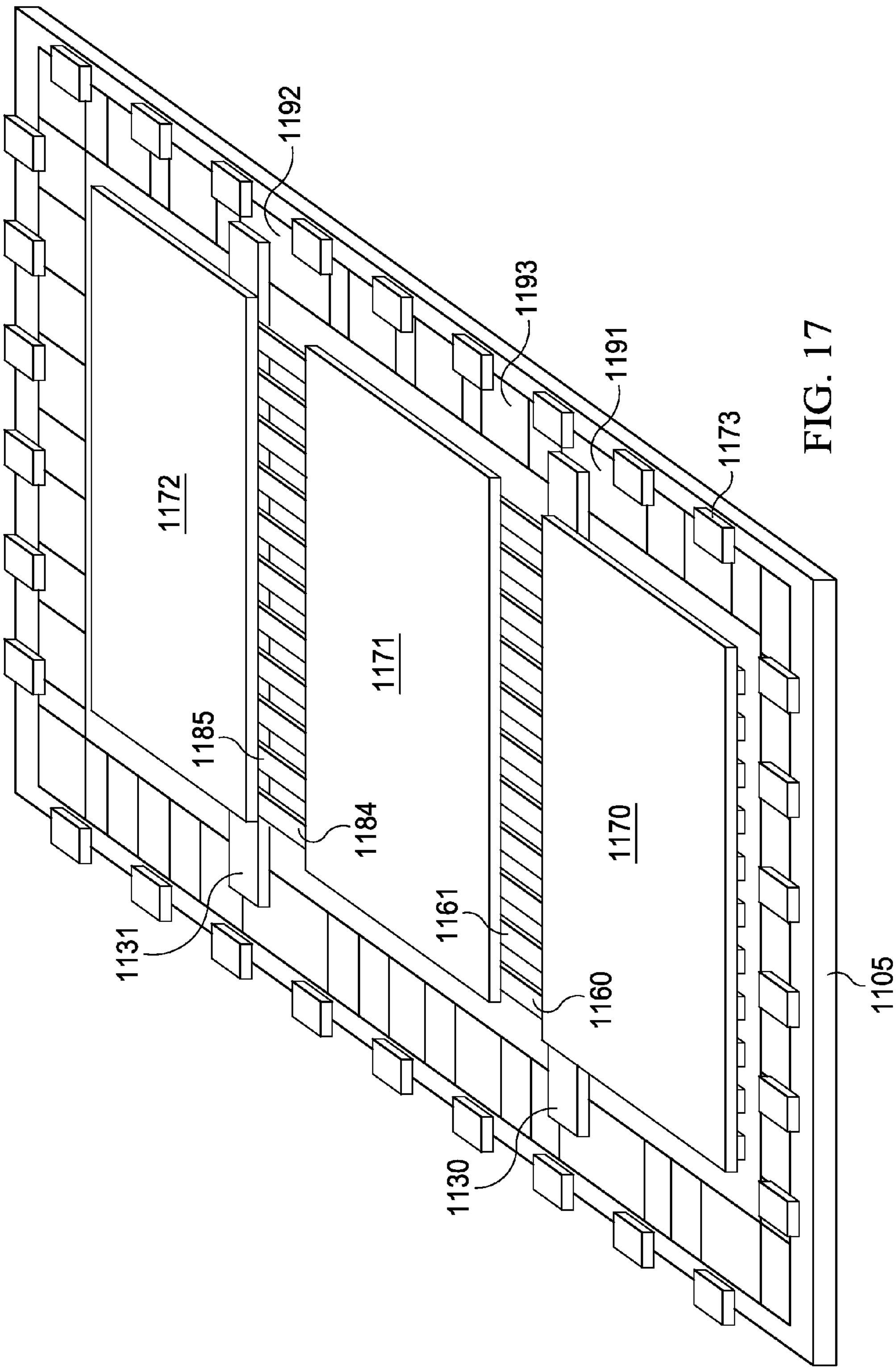
FIG. 17 illustrates a simplified three-dimensional view of the partially constructed semiconductor device including N-LDMOS and P-LDMOS devices illustrating a geometry of source and drain contacts in the third metallic layer.

Turning now to FIG. 17, illustrated is a simplified three-dimensional view of the partially constructed semiconductor device including N-LDMOS and P-LDMOS devices illustrating a geometry of source and drain contacts (i.e., conductive regions) in the third metallic layer M3. The lightly P-doped substrate 1105 is illustrated in FIG. 17, but the optional P-well located in an upper portion thereof is not shown. The N-LDMOS/P-LDMOS device drain contact 1171 is positioned between the N-LDMOS device source contact 1170 and a P-LDMOS device source contact 1172 in the third metallic layer M3. FIG. 17 also illustrates gate driver and logic circuit element contacts (one of which is designated 1173) that are located at the periphery of the semiconductor device in the third metallic layer M3.

Figure 17A:
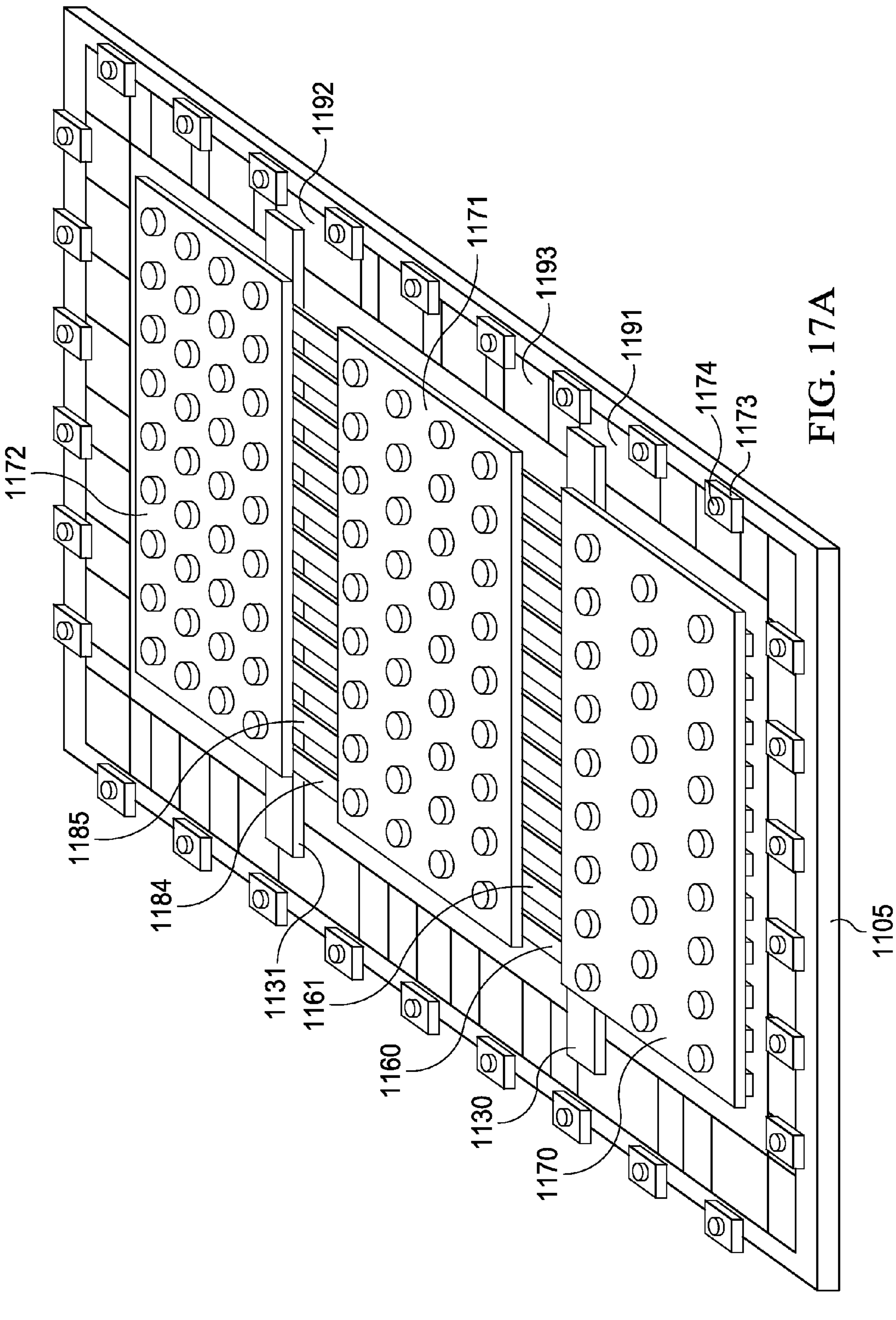
FIG. 17A illustrates a simplified three-dimensional view of the partially constructed semiconductor device including N-LDMOS and P-LDMOS devices illustrating a geometry of vias for a redistribution layer.

Turning now to FIG. 17A, illustrated is a simplified three-dimensional view of the partially constructed semiconductor device including N-LDMOS and P-LDMOS devices illustrating a geometry of vias (e.g., copper vias one of which is designated 1174) for a redistribution layer (e.g., a copper redistribution layer). The copper vias 1174 provide electrical contact between the third metallic layer M3 and the redistribution layer. The copper vias 1174 penetrate an isolation or insulating layer (see, e.g., first polyimide layer 1935 in FIG. 19) that separate and electrically isolates (insulates) the third metallic layer M3 from the redistribution layer.

Figure 17B:
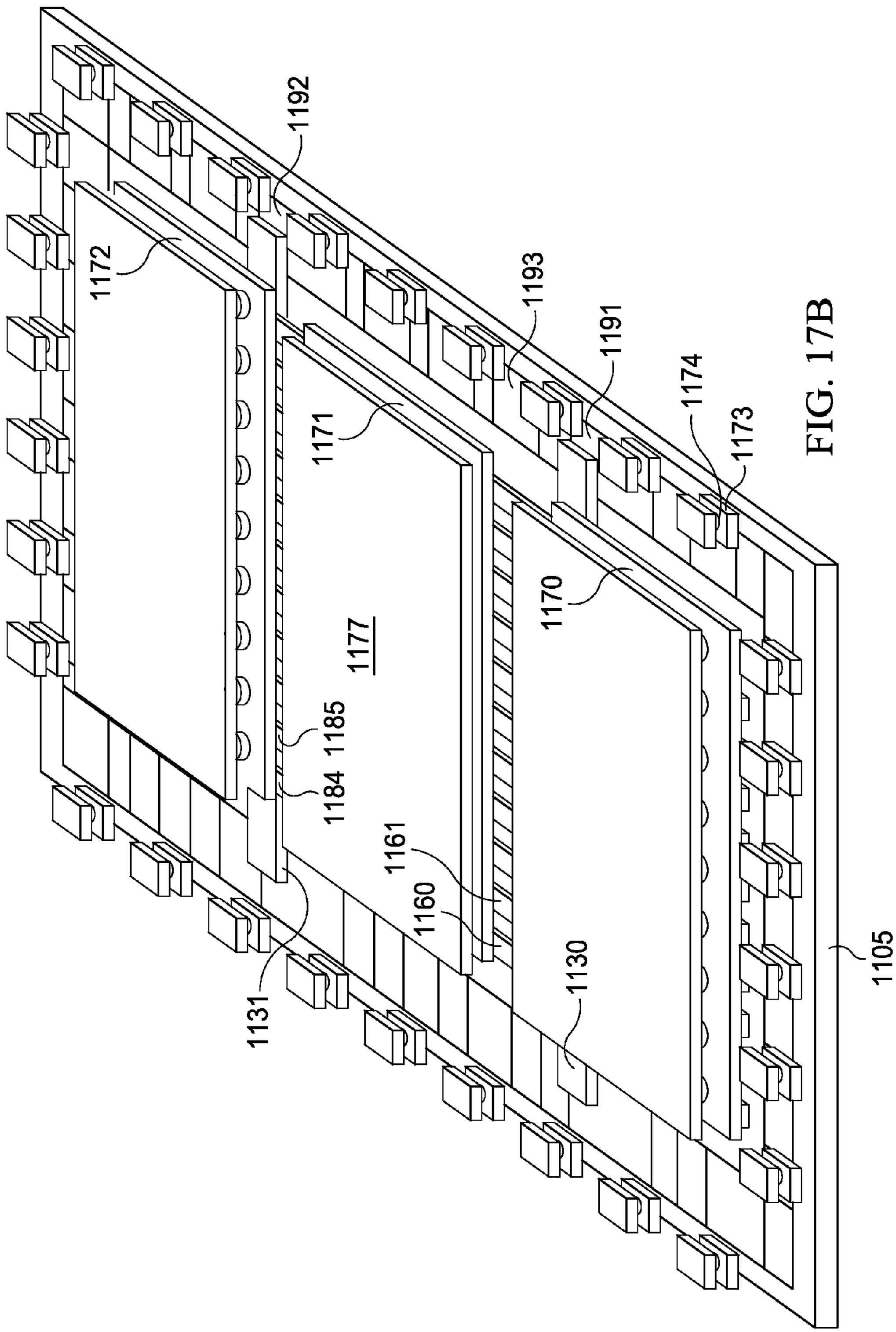
FIG. 17B illustrates a simplified three-dimensional view of the partially constructed semiconductor device including N-LDMOS and P-LDMOS devices illustrating a geometry of a redistribution layer.

Turning now to FIG. 17B, illustrated is a simplified three-dimensional view of the partially constructed semiconductor device including N-LDMOS and P-LDMOS devices illustrating a geometry of a redistribution layer (e.g., a copper redistribution layer) 1177. The redistribution layer 1177 is shown as patterned over respective metallizations on the third metallic layer M3 and electrically coupled to the metallizations on the third metallic layer M3 by the copper vias 1174 (see FIG. 17A). Again, the redistribution layer 1177 is separated from the third metallic layer M3 by an isolation or insulating layer (see FIG. 19).

Figure 17C:
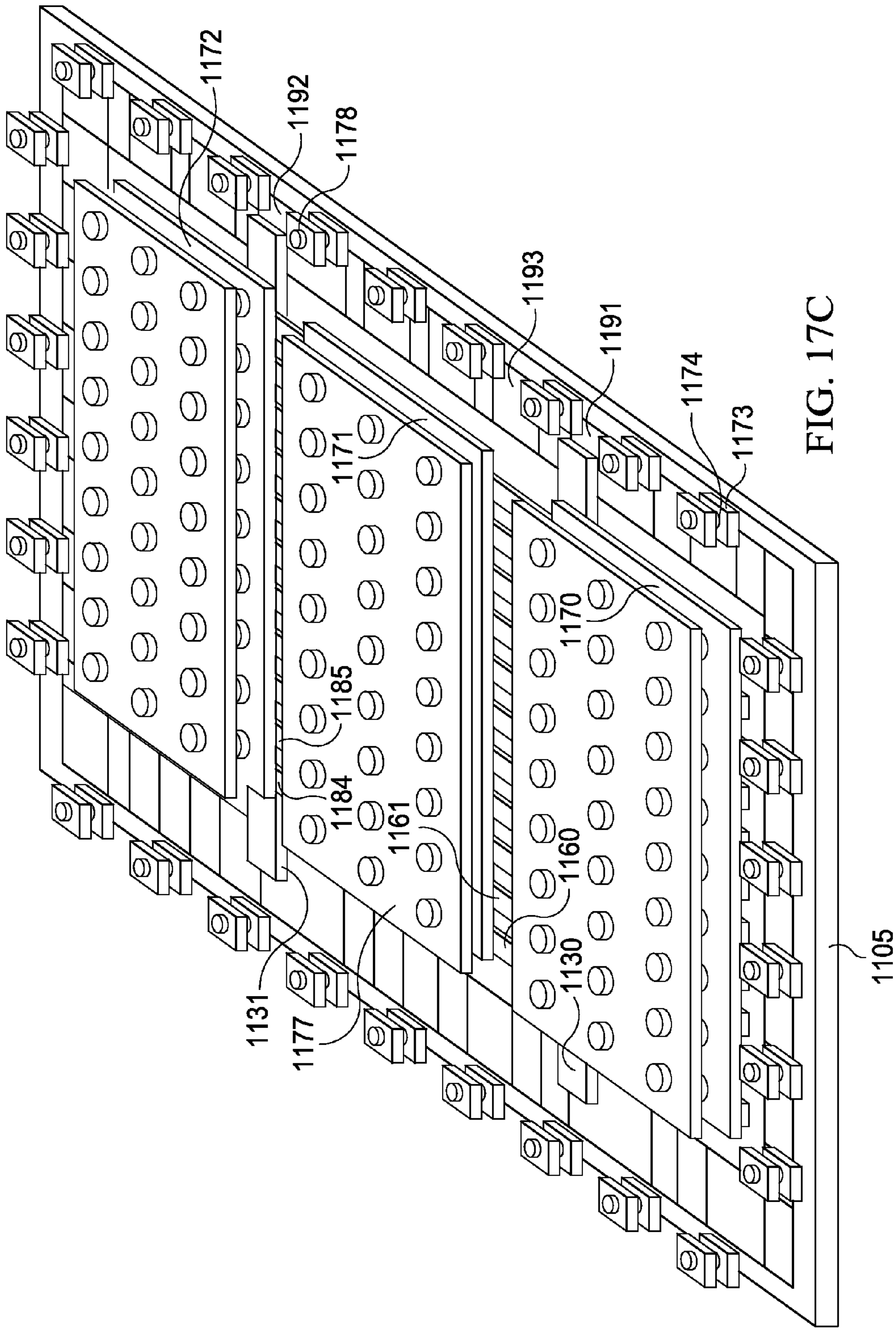
FIG. 17C illustrates a simplified three-dimensional view of the partially constructed semiconductor device including N-LDMOS and P-LDMOS devices illustrating a geometry of pillars for the redistribution layer.

Turning now to FIG. 17C, illustrated is a simplified three-dimensional view of the partially constructed semiconductor device including N-LDMOS and P-LDMOS devices illustrating a geometry of pillars (e.g., copper pillars one of which is designated 1178) for the redistribution layer 1177. The copper pillars 1178 provide electrical contact between the redistribution layer 1177 and a conductive patterned leadframe.

Figure 17D:
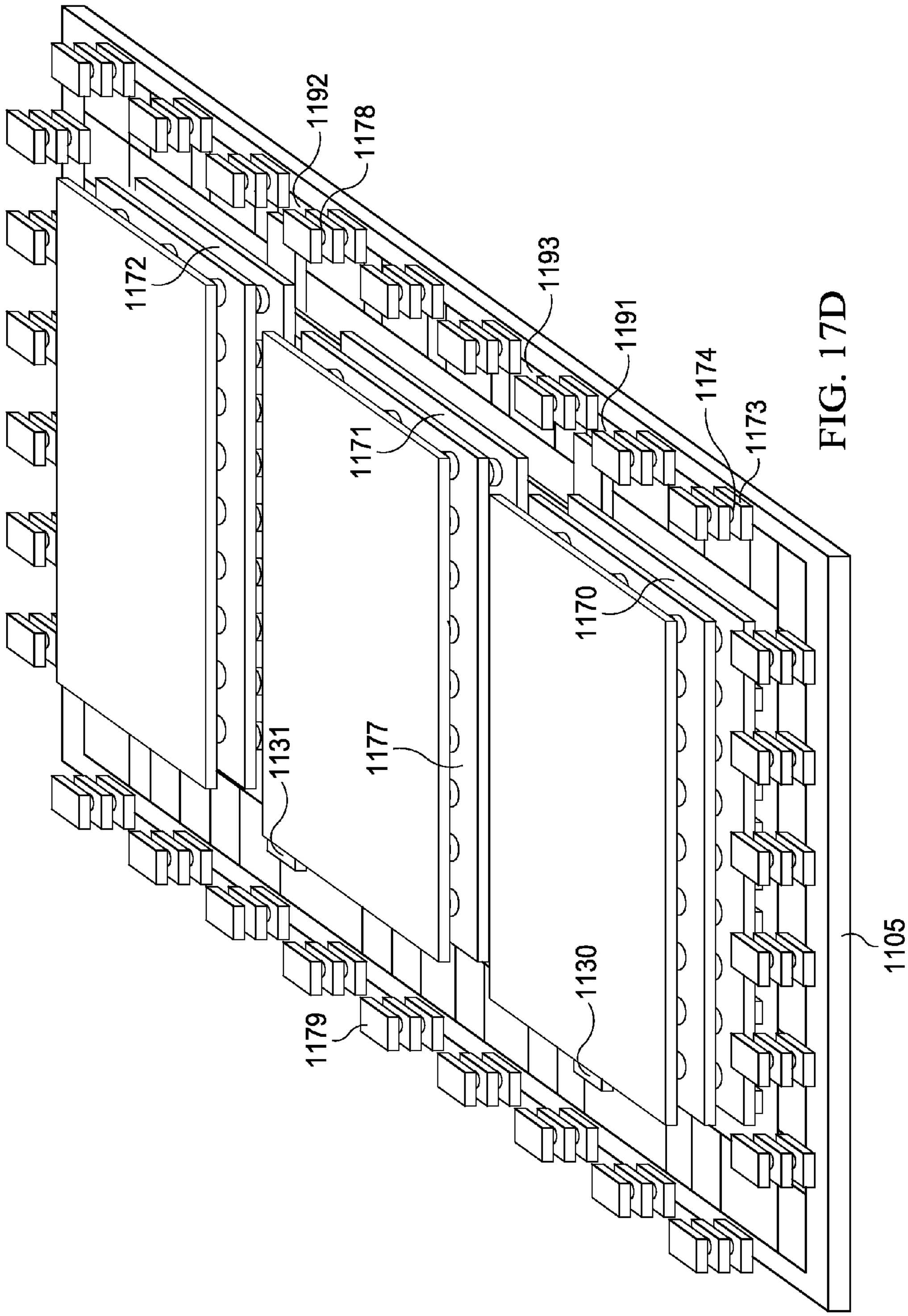
FIG. 17D illustrates a simplified three-dimensional view of the partially constructed semiconductor device including N-LDMOS and P-LDMOS devices illustrating a geometry of a conductive patterned leadframe.

Turning now to FIG. 17D, illustrated is a simplified three-dimensional view of the partially constructed semiconductor device including N-LDMOS and P-LDMOS devices illustrating a geometry of a conductive patterned leadframe 1179. The leadframe 1179 is shown as patterned over the redistribution layer 1177 and electrically coupled to the redistribution layer 1177 by the copper pillars 1178 (see FIG. 17C).

Figure 18:
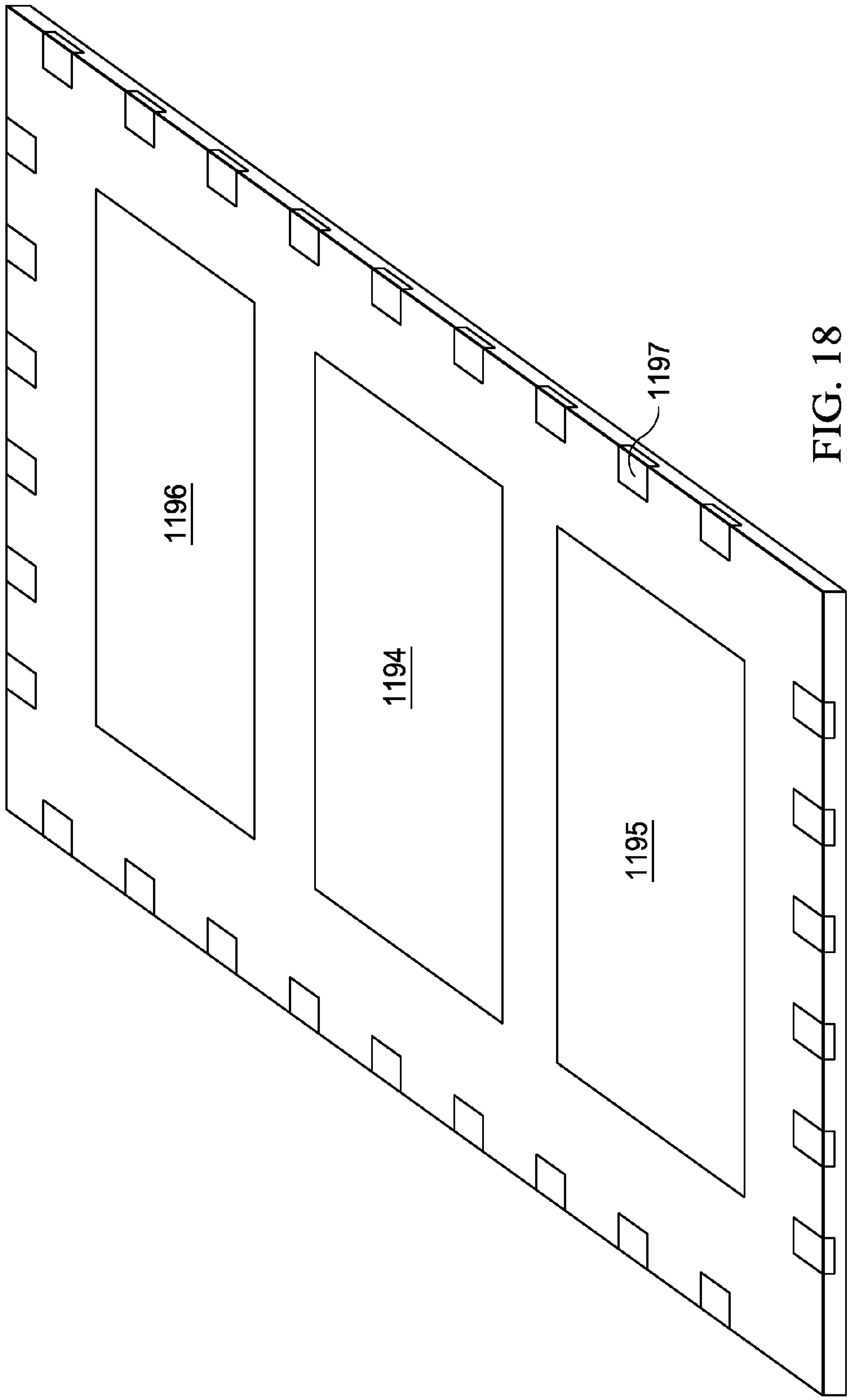
FIG. 18 illustrates a three-dimensional external view of an embodiment of a potted semiconductor device including N-LDMOS and P-LDMOS devices.

Turning now to FIG. 18, illustrated is a three-dimensional external view of an embodiment of a potted semiconductor device (with an encapsulant such as epoxy) including N-LDMOS and P-LDMOS devices. Portions of the leadframe 1179 (see FIG. 17D) are exposed to serve as external contacts for the semiconductor device. An external N-LDMOS/P-LDMOS device drain contact 1194 is positioned between an external N-LDMOS device source contact 1195 and an external P-LDMOS device source contact 1196, and external gate driver and logic circuit element contacts (one of which is designated 1197) are located about a periphery of the semiconductor device. A potting material employable in an embodiment is an encapsulant such as epoxy, but other potting materials including potting materials with enhanced thermal characteristics are contemplated within the broad scope of the present invention. The external electrical contact surfaces of the semiconductor device can be coated with a copper flash/seed layer and then electroplated with copper to form an easily solderable metallic surface. The external surface can also be plated with a thin layer of gold or other inert metal or alloy to provide a further level of passivation for a soldering or other attachment process. As illustrated and described with respect to FIG. 4, the potted or packaged semiconductor device of FIG. 18 may be placed on a printed circuit board proximate a decoupling device to provide the advantages as set forth above.

Figure 19:
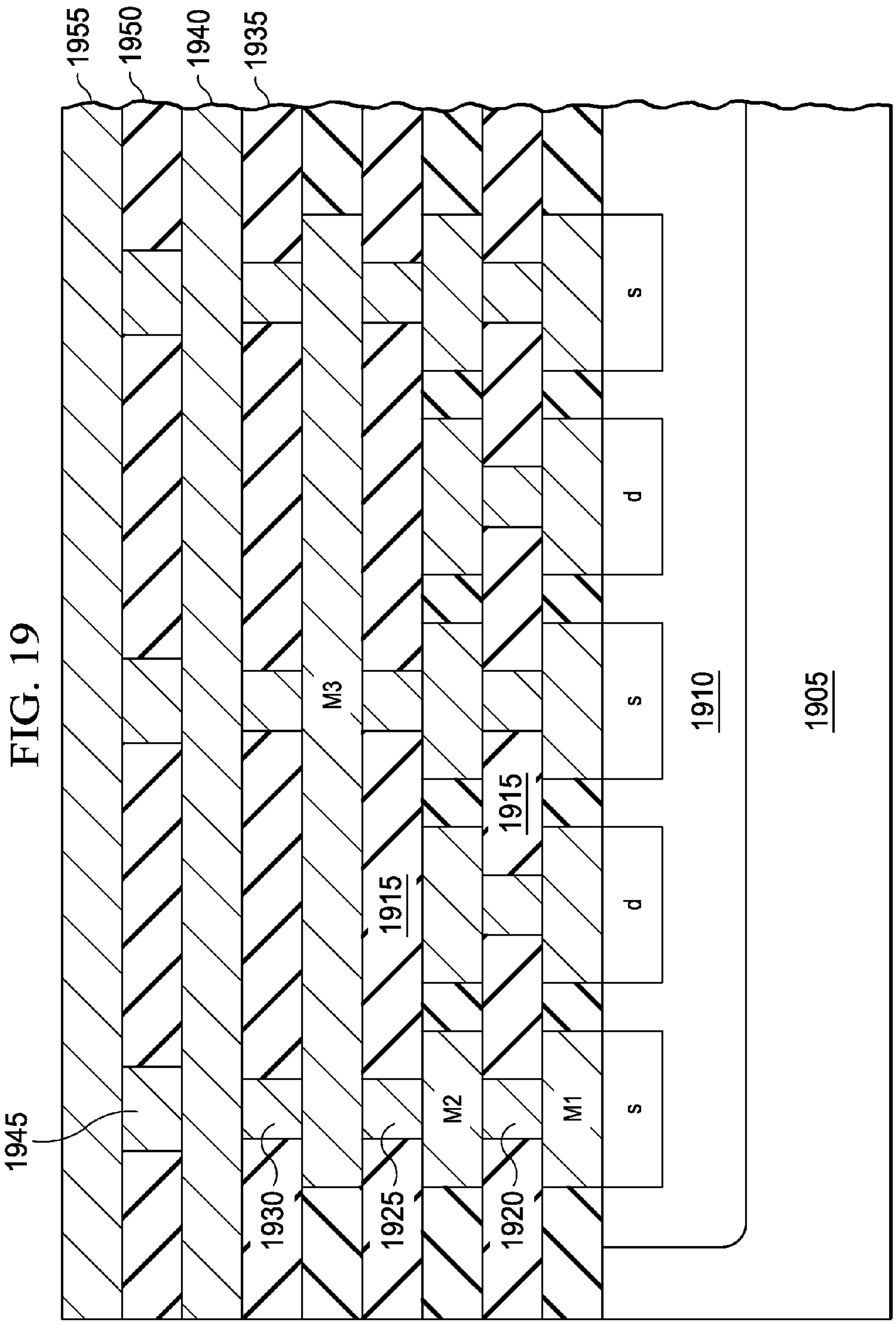
FIG. 19 illustrates an elevational view of an embodiment of a portion of a semiconductor device including N-LDMOS and/or P-LDMOS devices.

Turning now to FIG. 19, illustrated is an elevation view of an embodiment of a portion of a semiconductor device including N-LDMOS and/or P-LDMOS devices. The N-LDMOS and/or P-LDMOS devices are formed in a semiconductor die including a well 1910 located above a lightly doped substrate 1905 with the doped source regions "s" and drain regions "d" located therein. First, second and third metallic layers M1, M2, M3 are separated and insulated from one another by silicon oxynitride layers (generally designated 1915) and lie above and are in electrical contact with the doped source regions "s" and doped drain regions "d". Vias (one of which is designated 1920) provide electrical contact between metallizations on the first and second metallic layers M1, M2. Vias (one of which is designated 1925) provide electrical contact between metallizations on the second and third metallic layers M2, M3. Copper vias (one of which is designated 1930) are formed in a first polyimide layer 1935 to provide electrical contact between the third metallic layer M3 and a copper redistribution layer 1940 that is formed above the first polyimide layer 1935. Copper pillars (one of which is designated 1945) are formed in a second polyimide layer 1950 to provide electrical contact between the copper redistribution layer 1940 and a copper leadframe 1955 that is formed above the second polyimide layer 1950. It should be understood that the specified materials for the respective layers are only examples and other materials bearing similar properties may be employed to advantage.

Thus, as illustrated and described hereinabove with reference to the accompanying drawings, a semiconductor device and method of forming the same have been introduced. In one embodiment, the semiconductor device includes a semiconductor die formed with a plurality of LDMOS cells, a metallic layer (e.g., plurality of copper layers forming a redistribution layer) electrically coupled to the plurality of LDMOS cells, and gate drivers (e.g., ones of the gate drivers including driver switches formed as MOS devices) positioned along a periphery of the semiconductor die and electrically coupled to gates of the plurality of LDMOS cells through the metallic layer. The metallic layer is employed to couple ones of the gate drivers to a gate-drive bias voltage and to control and monitoring signals. The semiconductor device also includes a plurality of metallic pillars distributed over and electrically coupled to the metallic layer, and a conductive, patterned leadframe electrically coupled to the plurality of metallic pillars. The semiconductor device is potted with an encapulant with portions of the conductive patterned leadframe being exposed to serve as external contacts for the semiconductor device. Ones of the external contacts are coupled to a plurality of decoupling devices through vias on an opposing surface of a printed circuit board. Ones of the external contacts are coupled to the gate drivers ones of the external contacts are coupled to drains or sources of the plurality of the LDMOS cells through the metallic layer.

Figure 20:
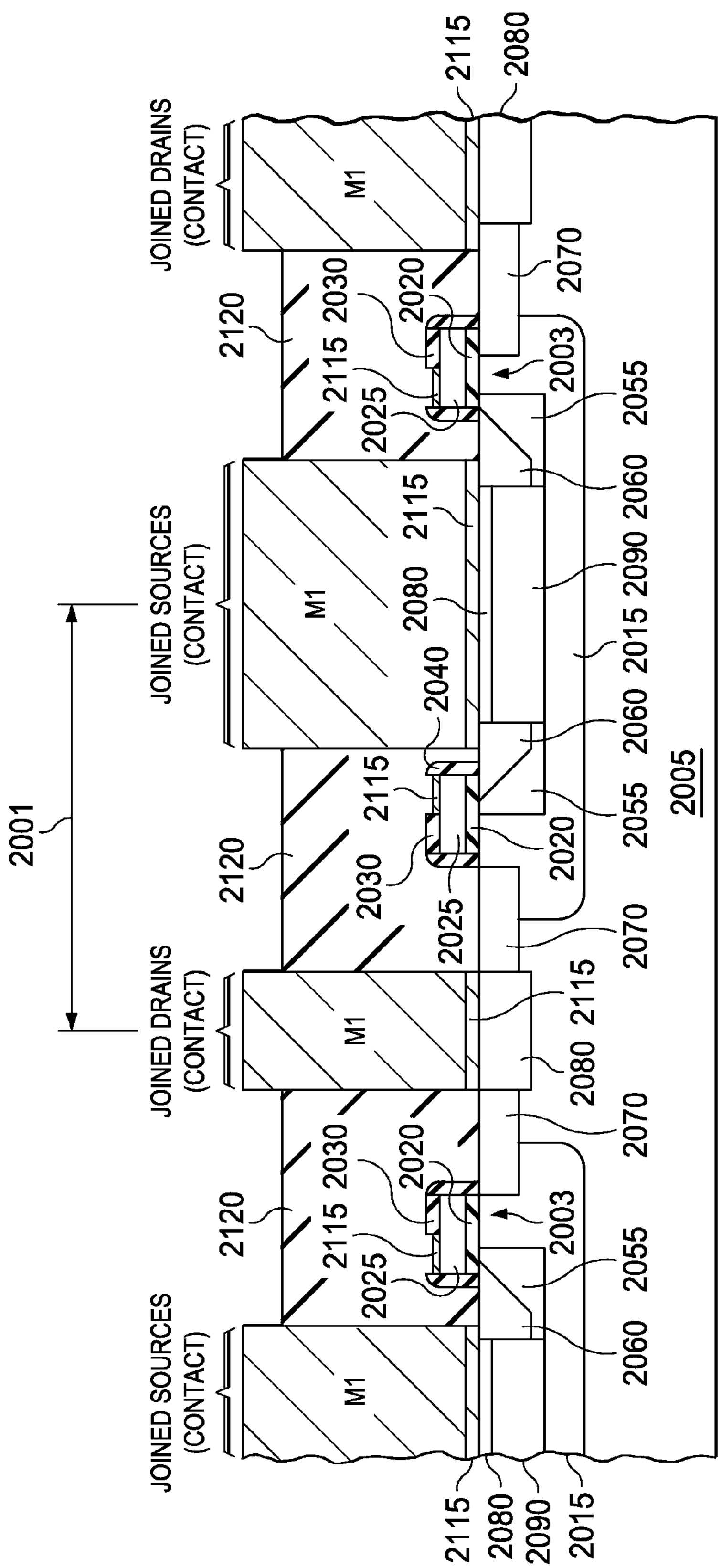
FIG. 20 illustrates a cross-sectional view of an embodiment of an N-LDMOS device embodied in a semiconductor device, or portions thereof.

Turning now to FIG. 20, illustrated is a cross-sectional view of an embodiment of an N-LDMOS device embodied in a semiconductor device, or portions thereof. While some of the layers of the N-LDMOS device will be introduced with respect to FIG. 20, a more detailed explanation of the process to construct the layers will be described with respect to FIG. 21, et seq. The N-LDMOS device is formed in a semiconductor die including a P-doped semiconductor substrate (also referred to as a "substrate") 2005 and, on a surface thereof, an optional epitaxial layer can be grown (e.g., a lightly doped P-type epitaxial layer, not shown). Although in the illustrated embodiment the substrate 2005 is a P-type substrate, one skilled in the art understands that the substrate 2005 could be an N-type substrate without departing from the scope of the present invention.

The N-LDMOS device is formed of a plurality of N-LDMOS cells, such as N-LDMOS cell 2001 illustrated in FIG. 20. The N-LDMOS device includes P-type wells 2015 and heavily doped P-type regions 2090 formed thereover. Heavily doped N-type regions 2060, 2080 are formed on either side of or above the heavily doped P-type regions 2090. The heavily doped N-type regions 2060 are formed with a lower doping density than the heavily doped N-type regions 2080, particularly in a lateral direction away from the heavily doped N-type region 2080. The heavily doped N-type regions 2060, 2080 provide an ohmic junction through a silicide layer 2115 formed thereover. The silicide layer 2115 provides a heavily conductive junction between the heavily doped N-type regions 2060, 2080 and a first metallic (e.g., aluminum) layer M1 to ultimately provide source contacts (designated "joined sources (contact)") for the N-LDMOS device. The heavily doped N-type region 2080 that lies over the heavily doped P-type region 2090 is thin (e.g., about 10 to 100 Å) so that the resulting P-N junction that is thereby formed between the heavily doped N-type region 2080 and the heavily doped P-type region 2090 will be substantially an ohmic junction highly conductive in both directions. Accordingly, the P-N junction formed therebetween will not be operable as a diode. Similarly, the silicide layer 2115 provides a heavily conductive junction between the heavily doped N-type regions 2080 and the first metallic layer M1 to ultimately provide drain contacts (designated "joined drains (contact)") for the N-LDMOS device. The first metallic layers M1 for the sources and drains are separated by an insulating layer such as amorphous silicon oxynitride ("$Si_xO_yN_z$") layers 2120.

P-type regions 2055 are formed adjacent to the heavily doped N-type regions 2060 and the heavily doped P-type regions 2090 within the P-type wells 2015. Channel regions 2003 are formed under the gates between the heavily doped N-type regions 2060 and lightly doped N-type regions 2070. The P-type regions 2055 are formed in the P-type wells 2015 by ion injection at an angle off vertical under the gates that will be formed above the channel regions 2003 and are used to control a threshold voltage of the N-LDMOS device.

The gates are formed with gate polysilicon layers 2025 with underlying and overlying gate oxide layers 2020, 2030 and sidewall spacers (one of which is designated 2040) thereabout. The gate polysilicon layers 2025 above the channel regions 2003 control a level of conductivity therein. The underlying gate oxide layers 2020 form an isolation layer between the gate polysilicon layers 2025 and the P-type wells 2015 and the P-type regions 2055. A portion of the overlying gate oxide layers 2030 is removed over the gate polysilicon layers 2025 and a silicide layer 2115 is formed thereover to reduce gate resistance.

Thus, the gate polysilicon layers 2025 (with the silicide layers 2115) form gate polysilicon strips 1150 across many N-LDMOS cells of the N-LDMOS device and are coupled to gate metallic strips 1130 in the first metallic layer M1 (see, e.g., FIG. 11). The gate metallic strips 1130 are routed to a plurality of gate drivers located at the periphery of the semiconductor device (see, e.g., FIG. 16). A substantially time-aligned switching signal to the gates of the N-LDMOS cells is thereby enabled by coupling the gate metallic strips 1130 in the first metallic layer M1, which have a substantially greater electrical conductivity than the gate polysilicon strips 1150, to the plurality of gate drivers.

Providing a time-aligned switching signal to the plurality of gates of individual N-LDMOS cells is an important design consideration in view of substantial effective capacitance that is created between the gates and the sources and drains, which requires a substantial gate-drive current to achieve a rapid switching transition. Failure to produce a temporally-aligned gate-drive signal to the gates of the individual N-LDMOS cells can enable some of the N-LDMOS cells to be turned on before others, which forces the early-switched cells to conduct high-current pulses during the temporally misaligned switching transitions. Temporally misaligned high-current pulses expose the N-LDMOS cells to device failure.

The illustrated structures also enable N-LDMOS and P-LDMOS devices to be formed with substantially the same structure in a common semiconductor die, and enable each LDMOS type to be coupled with a low-inductance, high-current path to an external circuit. Each LDMOS is formed with a single, large, source contact, and both with a single, large, and shared drain contact (see, e.g., FIG. 17), which can simplify circuit board layout and attachment issues to an external circuit. The large source and drain contacts are readily overlaid with a copper redistribution layer of substantially the same footprint as the large source and drain contacts (see, e.g., FIG. 17B), and ultimately a leadframe (see, e.g., FIG. 17D), which provides further improvement in conductivity and coupling a packaged semiconductor device (see, e.g., FIG. 18) to an external circuit. The source contacts and the shared drain contacts overlie substantially the entire active area of the N-LDMOS and P-LDMOS devices, with little die area wasted by high current contacts that do not overlie active switching areas.

With respect to the N-LDMOS cell 2001, the source (or source region) is embodied in at least the heavily doped N-type region 2060 and the drain (or drain region) is embodied in the lightly doped N-type region 2070 (e.g., a lightly doped drain ("LDD") region) and an adjacent heavily doped N-type region 2080 opposite the channel region 2003. The gate resides above the channel region 2003 with the layers as introduced herein. The LDD region provides a higher breakdown voltage for the N-LDMOS devices over conventional designs. These regions are formed in the sequence "heavily doped source region," "gate," "lightly doped drain region," and "heavily doped drain region." A similar structure is employed in the P-LDMOS devices as described with respect to FIG. 88, et seq.

Figure 21:
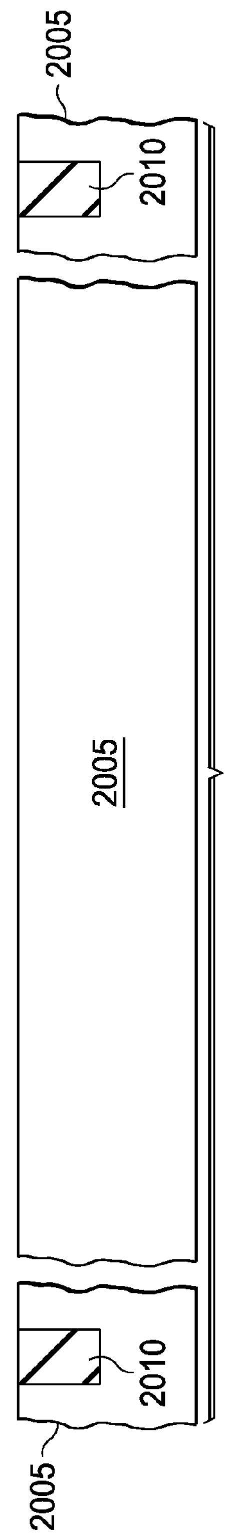
FIGS. 21 through 87 illustrate cross-sectional views of an embodiment of forming an N-LDMOS device embodied in a semiconductor device, or portions thereof.
Figure 87:
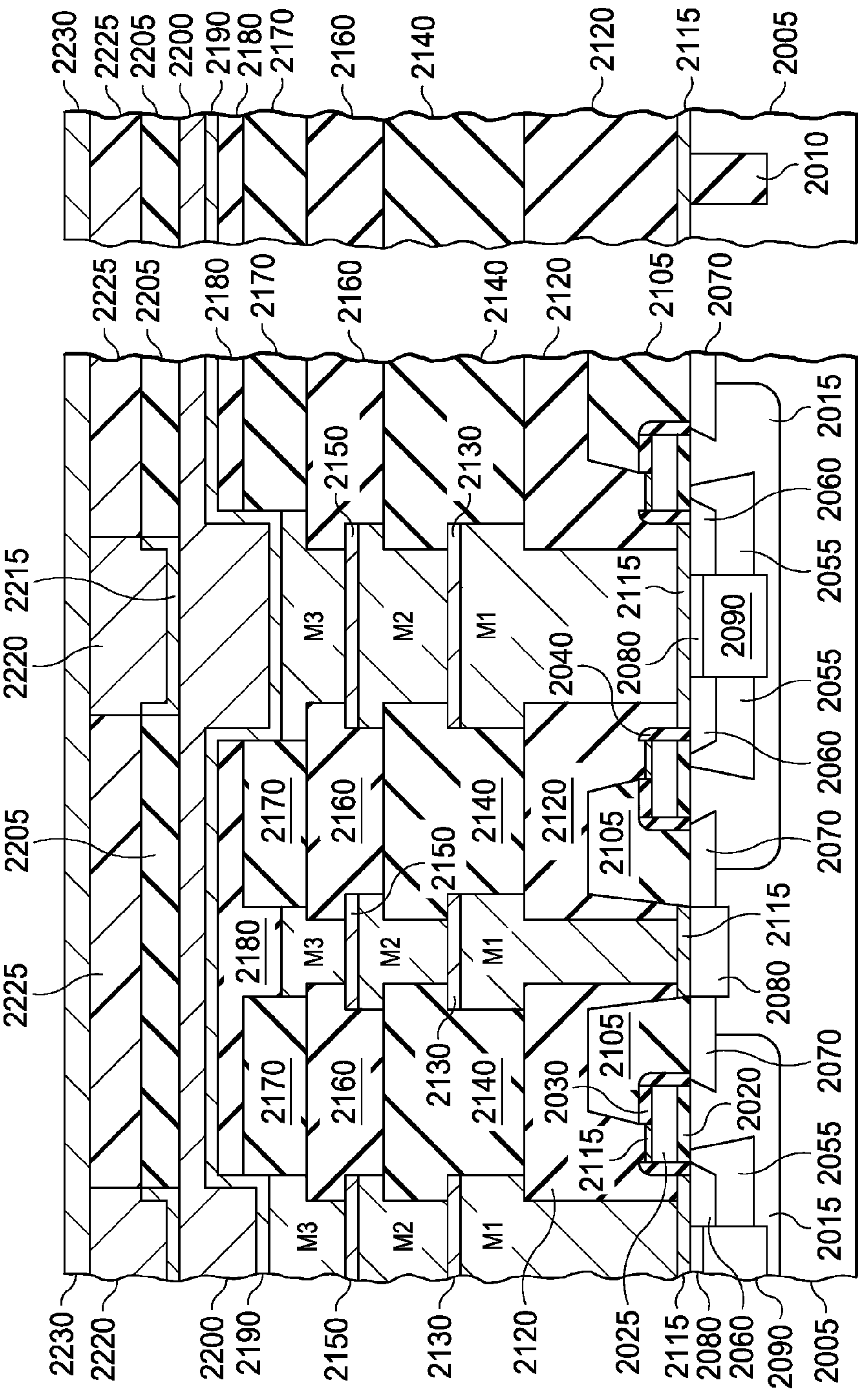

Turning now to FIGS. 21 through 87, illustrated are cross-sectional views of an embodiment of forming an N-LDMOS device embodied in a semiconductor device, or portions thereof. Beginning with FIG. 21, the N-LDMOS device is formed in a semiconductor die including a P-doped semiconductor substrate (also referred to as a "substrate") 2005 and, on a surface thereof, an optional epitaxial layer can be grown (e.g., a lightly doped P-type epitaxial layer, not shown). The substrate 2005 is preferably lightly P-doped (e.g., with boron) between about $1 \cdot 10^{14}$ and $1 \cdot 10^{16}$ atoms/cm$^3$. The optional epitaxial layer grown on the substrate 2005 may not be needed, particularly if the substrate 2005 is a lightly doped P-type substrate. Although in the illustrated embodiment the substrate 2005 is a P-type substrate, one skilled in the art understands that the substrate 2005 could be an N-type substrate without departing from the scope of the present invention.

The substrate 2005 is formed with isolation regions (e.g., shallow trench isolation regions 2010). The shallow trench isolation regions 2010 may also be formed within a substrate or within an epitaxial layer grown thereon to provide dielectric isolation between devices implemented on the substrate or on the epitaxial layer. The shallow trench isolation regions 2010 are formed by applying, patterning, and etching the substrate 2005 with a photoresist to define the respective regions therein. An example photoresist is an AZ Electronic Materials photoresist. The shallow trench isolation regions 2010 are then etched and backfilled with a dielectric such as silicon dioxide, silicon nitride, a combination thereof, or any other suitable dielectric material. Then the epitaxial layer of the substrate 2005 and the shallow trench isolation regions 2010 are planarized by a lapping process such as a chemical-mechanical planarization ("CMP") lapping process to planarize the device while limiting surface damage to the die. The steps of masking, etching, backfilling with dielectric, and lapping are well known in the art and will not hereinafter be described in further detail.

The P-type substrate 2005 is divided into dielectrically separated areas by the shallow trench isolation regions 2010 to accommodate in the illustrated embodiment a plurality of N-LDMOS and P-LDMOS devices as well as gate drivers and other PMOS and NMOS devices embedded in control circuits located thereon that operate as low-voltage devices. The low-voltage devices are operable within, for instance, a controller of a power converter (e.g., within control and signal-processing devices that may be formed on a surface of the semiconductor device). Additionally, the P-type substrate 2005 can accommodate the N-LDMOS and P-LDMOS devices that operate as higher voltage devices within, for instance, a power train, as well as a driver of a power converter (i.e., power switches and driver switches).

Figure 22:
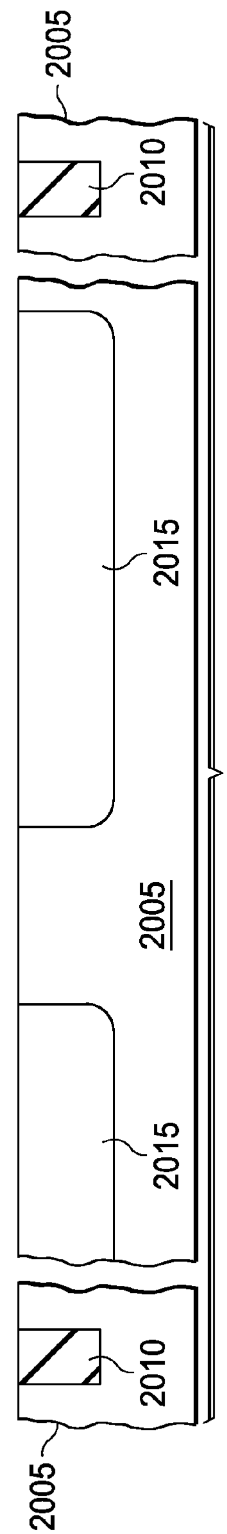

Turning now to FIG. 22, P-type wells 2015 are formed by applying and patterning a photoresist mask (not shown), followed by etching of the photoresist mask to define regions to be occupied by the P-type wells 2015. The P-type wells 2015 are formed by an ion implantation process (e.g., at a controlled energy of about 100 to 300 kiloelectron volts ("keV")) of an appropriate P-type dopant specie such as boron, and results in a doping concentration profile preferably in a range of about $1 \cdot 10^{17}$ to $2 \cdot 10^{19}$ atoms/cm$^3$.

Figure 23:
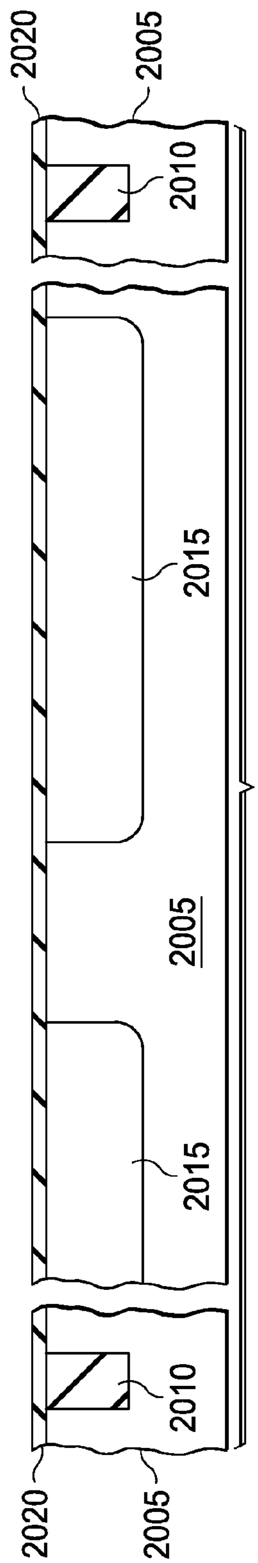

Turning now to FIG. 23, a gate oxide layer 2020 (an insulating layer) is formed over the surface of the semiconductor device of a thickness consistent with the intended operating voltage of the gates. The gate oxide layer 2020 is typically silicon dioxide, for instance, formed by placing the wafer on which the silicon device is being formed in an oven and reacting the exposed surface of the wafer with oxygen or other suitable material (such as to produce a high-κ (dielectric constant) stack) for 10 to 100 minutes at 500 to 900° C.) with a thickness of about 30 to 50 Angstroms ("Å") for devices employing about 0.25-micrometer ("μm") feature sizes and operating at low gate voltages (e.g., 2.5 volts). Assuming the gate-to-source voltage limit of the N-LDMOS and P-LDMOS devices is limited to a voltage (e.g., of about 2.5 volts), then the gate oxide layer 2020 can be formed with a gate dielectric layer thickness as set forth above. Preferably, the gate oxide layer 2020 is constructed with a uniform thickness to provide a gate-to-source voltage rating for the devices of approximately 2.5 volts that completely or nearly completely saturates the forward-conduction properties of the device. Of course, the aforementioned gate voltage ranges for the devices are provided for illustrative purposes only, and other voltage ranges are contemplated within the broad scope of the present invention.

Figure 24:
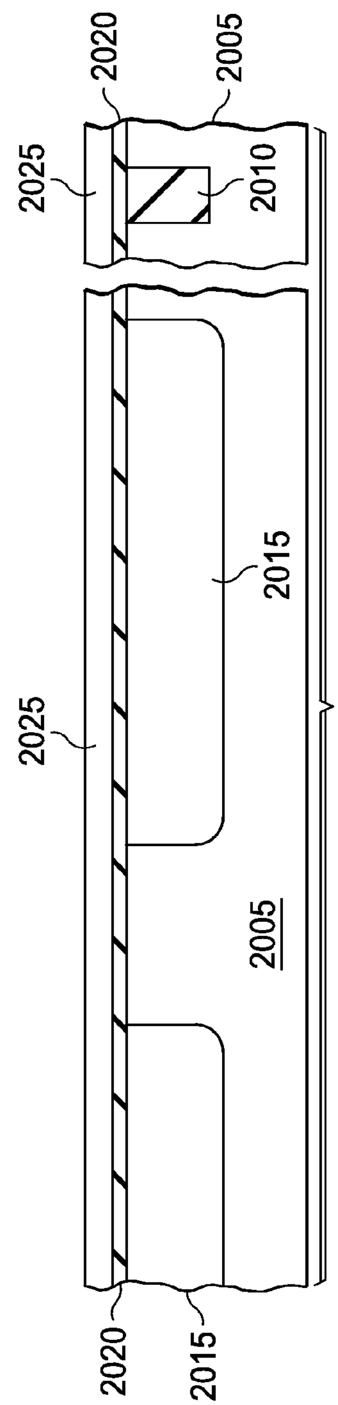

Turning now to FIG. 24, a gate polysilicon layer 2025 is deposited over a surface of the gate oxide layer 2020 and is doped N-type (or P-type) in a later processing step to obtain a suitable level of conductivity using an appropriate doping specie such as arsenic with a doping density in a range of about $1\cdot10^{19}$ to $5\cdot10^{20}$. The gate polysilicon layer 2025 is annealed in an oven at an elevated temperature (e.g., at a temperature of 800 to 1000 degrees Celsius ("° C.") for 2 to 60 minutes) to properly diffuse and activate the dopant. The gate polysilicon layer 2025 may have a range of thicknesses that may range from about 100 to about 500 nanometers, but may be even smaller or larger depending on an application.

Figure 25:
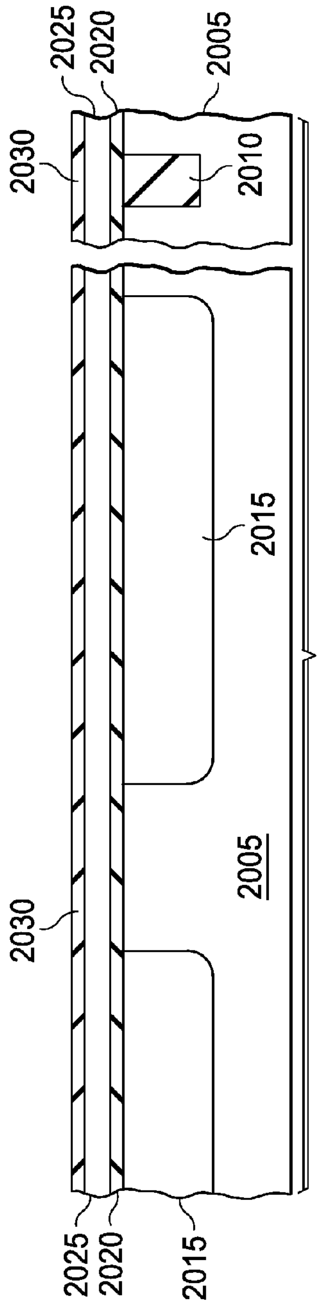

Turning now to FIG. 25, an overlying gate oxide layer 2030 (an insulating layer) is formed over an upper surface of the gate polysilicon layer 2025 by placing the wafer on which the silicon device is being formed in an oven and reacting the exposed surface of the gate polysilicon layer 2025 with oxygen at an elevated temperature (e.g., at a temperature of 500-900° C. for 1 to 60 minutes). The overlying gate oxide layer 2030 can be formed with a thickness of about 50 to 500 Å.

Figure 26:
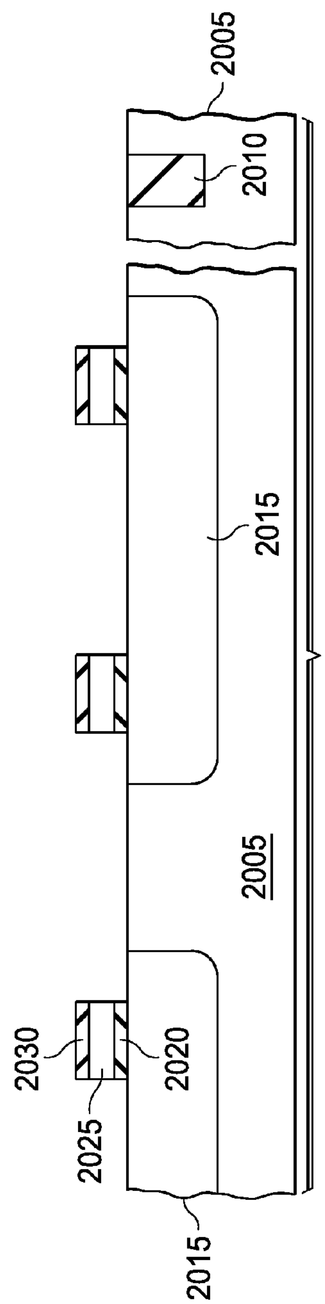

Turning now to FIG. 26, the gate oxide layer 2020, the gate polysilicon layer 2025, and the overlying gate oxide layer 2030 are patterned and etched to define and form horizontal dimensions therefor. A photoresist mask is employed with an etch to define the lateral dimensions of the gate polysilicon layer 2025, and the gate oxide layer 2020 and the overlying gate oxide layer 2030. Only one of the gates is designated with the reference numbers for the gate polysilicon layer 2025 and the gate oxide layers 2020, 2030 in the following FIGUREs. An example photoresist is AZ Electronic Materials photoresist. The steps of patterning and etching to define and form horizontal dimensions of the gate polysilicon layer 2025 and the gate oxide layers 2020, 2030 are well known in the art and will not hereinafter be described in further detail. In an alternative embodiment, the gate polysilicon layer 2025 can include or otherwise be formed with a wide range of materials including various metals, other doped semiconductors, or other conductive materials. It is noted that the horizontal dimensions of the gate polysilicon layer 2025 and the gate oxide layers 2020, 2030 as well as a number of other structures for both a N-LDMOS and P-LDMOS devices formed on the same silicon can be masked and etched in the same processing steps.

Figure 27:
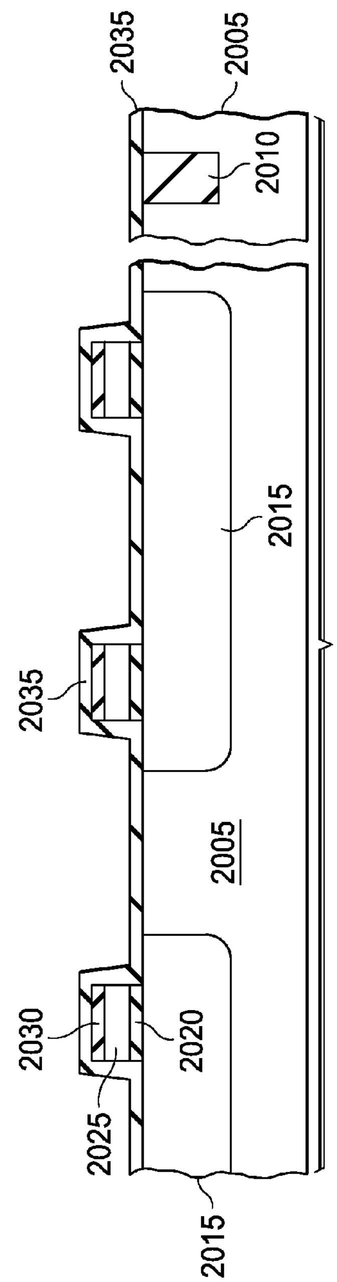

Turning now to FIG. 27, an overlying layer of silicon nitride ("$Si_3N_4$") 2035 (an insulating layer) has been deposited over the semiconductor device. The deposition of the overlying layer of silicon nitride 2035 over the semiconductor device is a well-known process in the art and will not herein be described in further detail.

Figure 28:
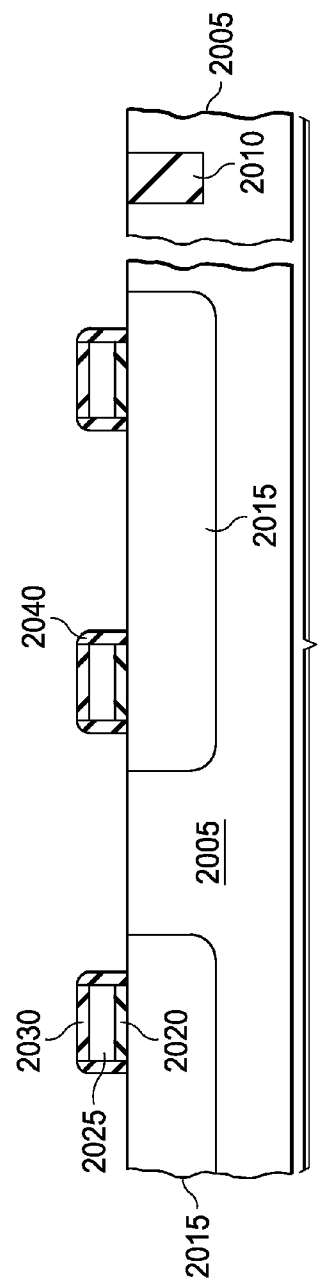

Turning now to FIG. 28, the overlying layer of silicon nitride 2035 is etched back almost everywhere with exception of the vertically thick portions of the silicon nitride layer 2035 adjacent to the lateral walls formed by the gate polysilicon layer 2025 and the underlying and overlying oxide layers 2020, 2030. In this manner, sidewall spacers (one of which is designated 2040) are formed from the silicon nitride layer 2035 adjacent to the gate polysilicon layer 2025 and the underlying and overlying oxide layers 2020, 2030 in a self-aligned process without the need to mask and etch a photoresist.

Figure 29:
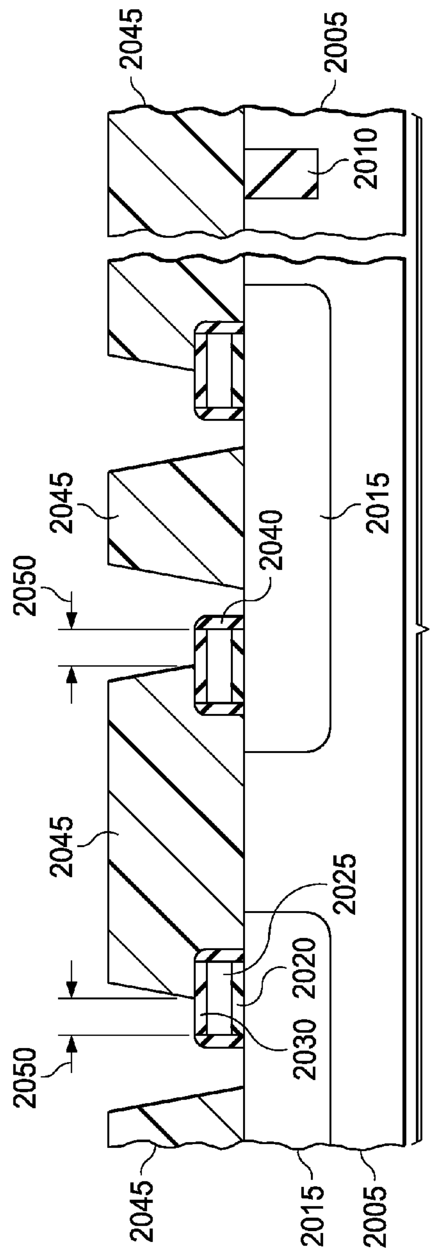

Turning now to FIG. 29, a photoresist 2045 has been applied, patterned, and etched to define source regions for the N-LDMOS device to enable P-type ions such as boron ions to be implanted into selected regions of the semiconductor device in a later processing step. The photoresist is etched to expose half a gate width, which is about 0.2 μm (designated 2050) to accommodate tolerance issues in patterning and etching the photoresist. Thus, the lateral location of P-type ion implantations is controlled by a photoresist mask using techniques well known in the art. The steps of applying, patterning, and etching a photoresist are well known in the art and will not be described herein in further detail.

Figure 30:
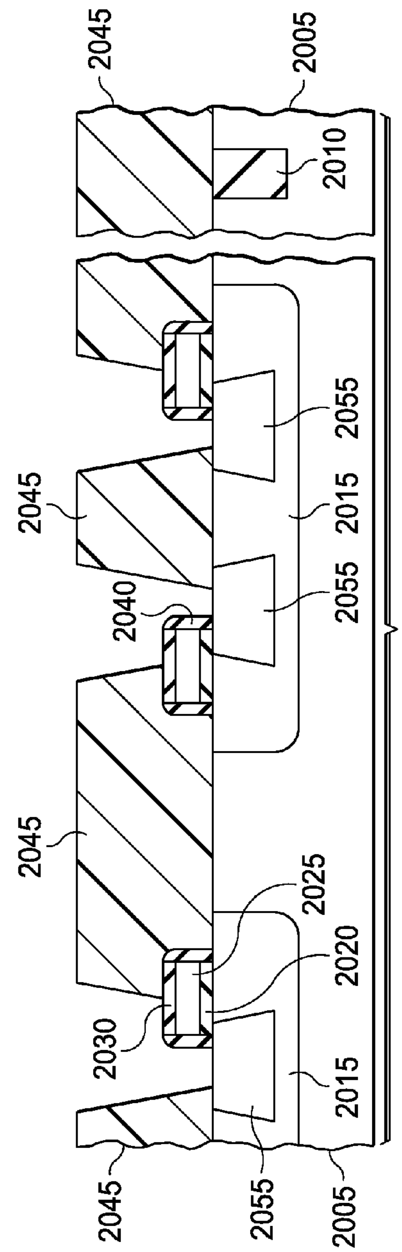

Turning now to FIG. 30, P-type ions have been implanted (e.g., about $5\cdot10^{17}$ to $1\cdot10^{19}$ atoms/$cm^3$ at a controlled energy of about 20 to 100 keV) to form P-type regions 2055. The P-type regions 2055 are ion-implanted with a suitable atomic species such as boron to achieve a usable gate threshold voltage for the N-LDMOS device that is being formed.

Figure 31:
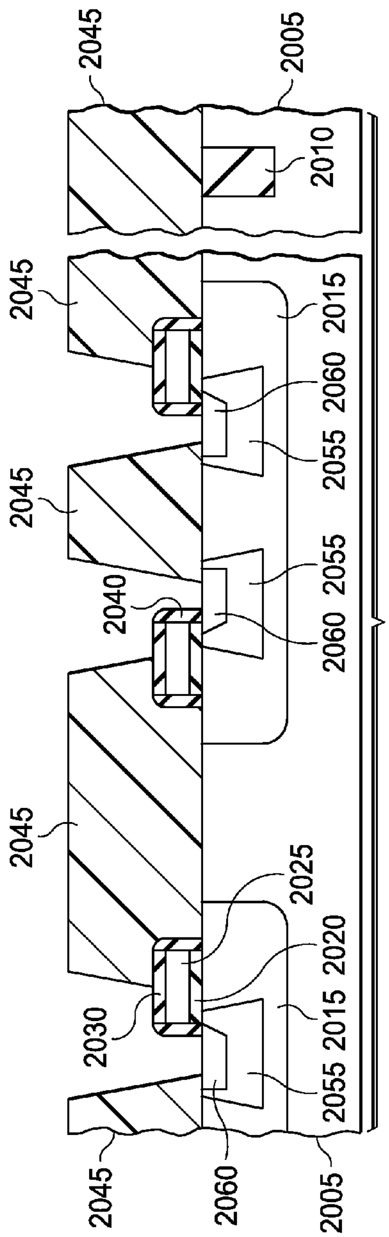
Figure 32:
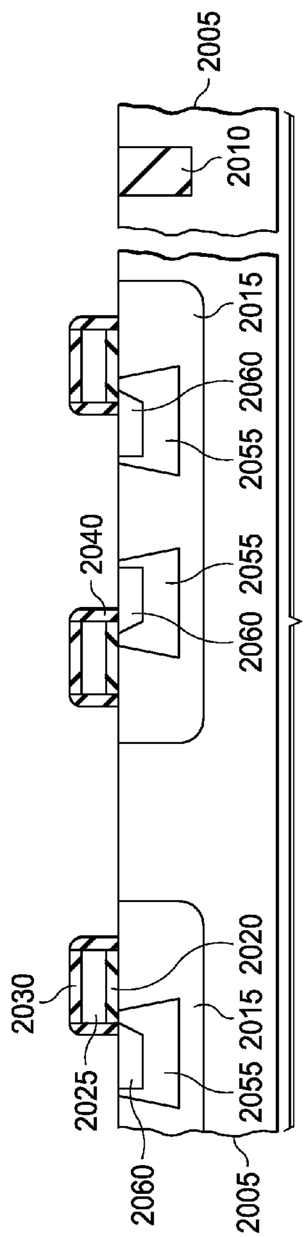

Turning now to FIG. 31, N-type ions (e.g., arsenic) have been implanted to form heavily doped N-type regions 2060. The heavily doped N-type regions 2060 are implanted (e.g., at a controlled energy of about 5 to 50 keV) with a doping concentration profile preferably in a range of $5\cdot10^{18}$ to $1\cdot10^{20}$ atoms/$cm^3$ to achieve a low source resistance for the N-LDMOS device that is being formed. After stripping the photoresist 2045 as illustrated in FIG. 32, the semiconductor device is annealed (e.g., in an oven at a temperature of 700 to 1000° C. for 1 to 60 minutes) to transform the P-type regions 2055 and the heavily doped N-type regions 2060 into active substrate sites.

Figure 33:
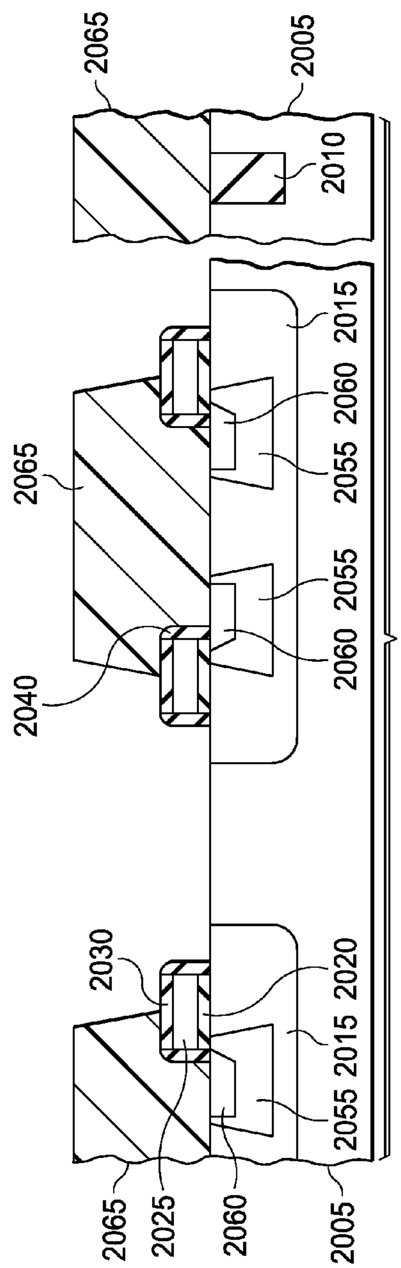
Figure 34:
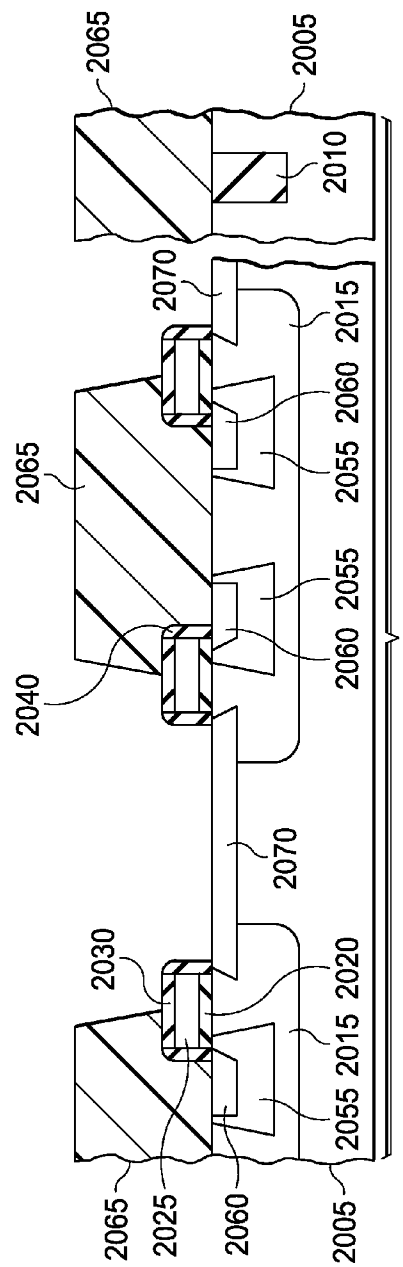

Turning now to FIG. 33, a photoresist 2065 is applied, patterned, and etched so that at a later processing step N-type ions can be selectively implanted in areas between the gates formed by the gate polysilicon layer 2025 and the underlying and overlying oxide layers 2020, 2030. As illustrated in FIG. 34, N-type ions (e.g., arsenic ions) are implanted between the gates to form lightly doped N-type regions 2070. In an embodiment, the implant density of the lightly doped N-type regions 2070 is preferably in the range of $1\cdot10^{17}$ to $1\cdot10^{19}$ atoms/$cm^3$, and is implanted at a controlled energy of 10 to 200 keV.

Figure 35:
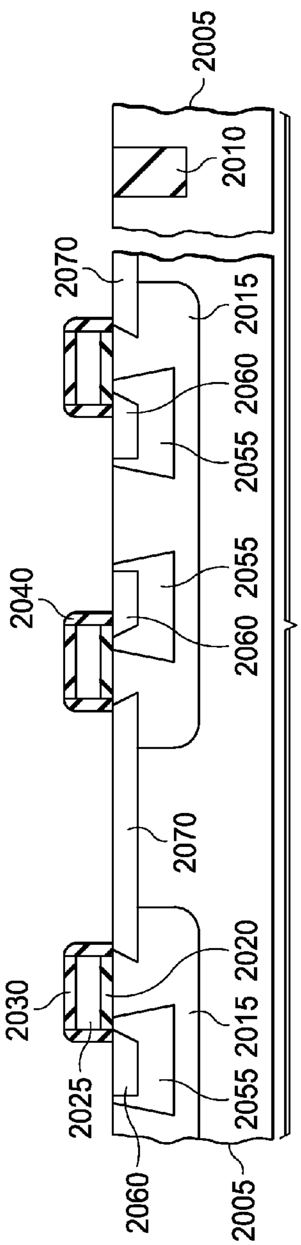
Figure 36:
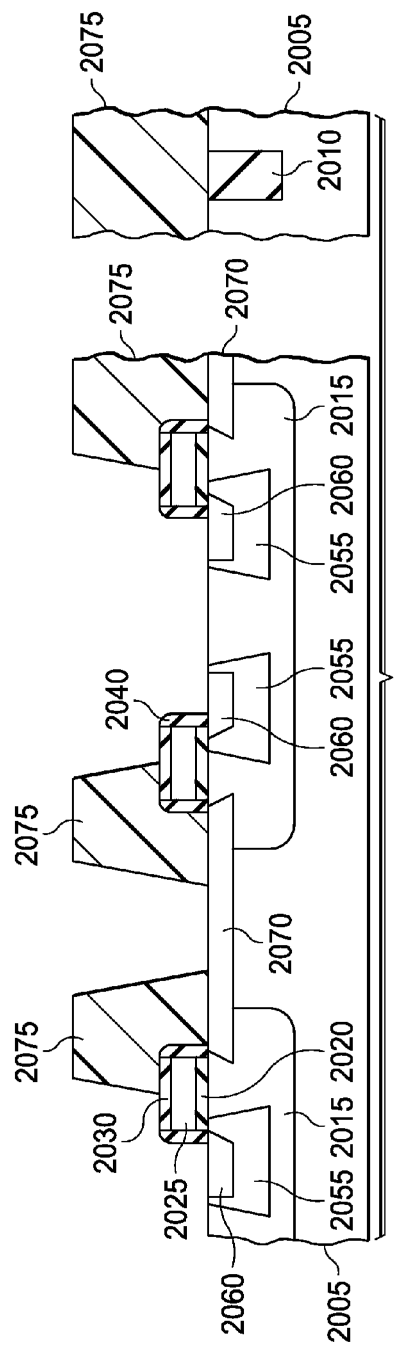

After stripping the photoresist 2065 as illustrated in FIG. 35, the semiconductor device is annealed in an oven to transform the lightly doped N-type regions 2070 into active substrate sites (e.g., at a temperature of 700 to 1000° C. for 1-60 minutes). Turning now to FIG. 36, a photoresist 2075 is applied, patterned, and etched for later selective implantation of ions in areas between the gates formed by the gate polysilicon layer 2025 and the underlying and overlying oxide layers 2020, 2030.

Figure 37:
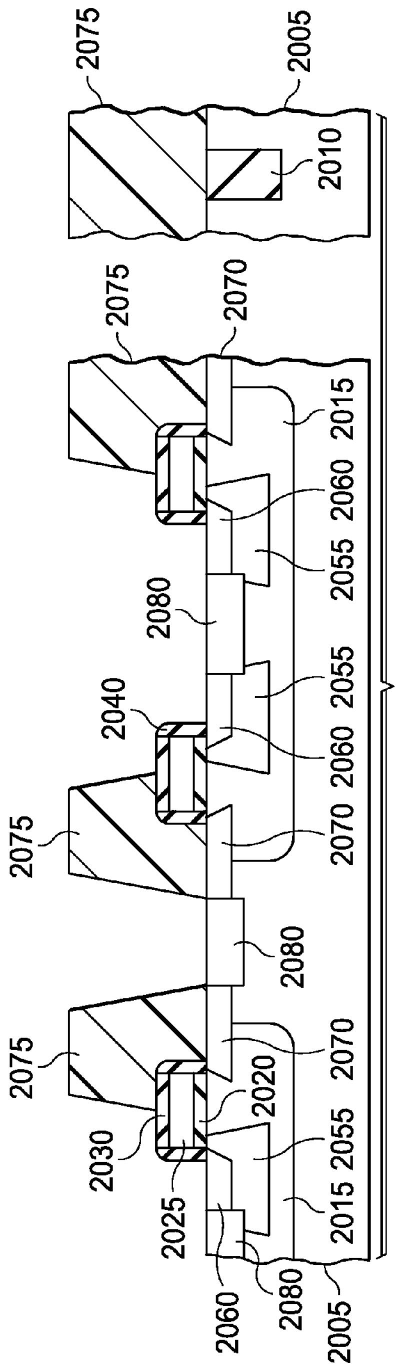
Figure 38:
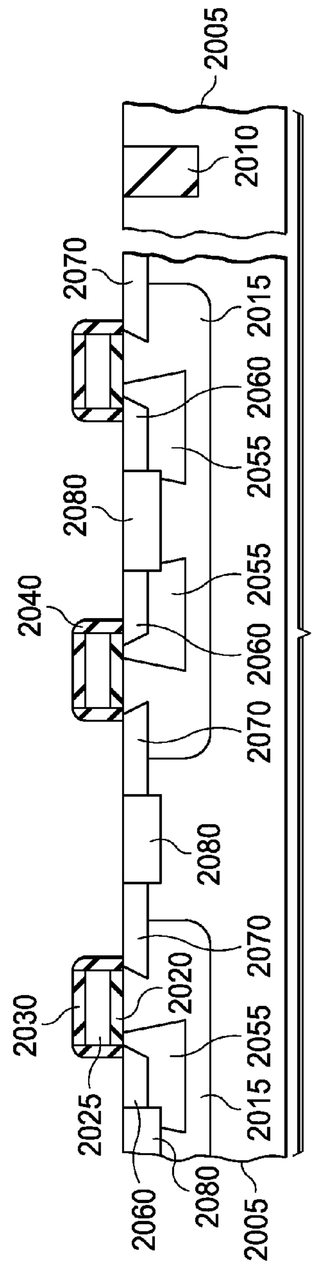

Turning now to FIG. 37, heavily doped N-type regions 2080 are implanted with the semiconductor device. In an embodiment, the heavily doped N-type regions 2080 are doped, for instance, with arsenic to a density in a range of about $1\cdot10^{19}$ to $5\cdot10^{20}$ atoms/$cm^{-3}$, and are implanted at a controlled energy of 10 to 100 keV. At the same time, the gate polysilicon layer 2025 is similarly doped N-type with arsenic with a doping density in a range of about $1\cdot10^{19}$ to $5\cdot10^{20}$ to obtain a suitable level of gate conductivity. After stripping the photoresist 2075 as illustrated in FIG. 38, the semiconductor device is annealed in an oven to transform the heavily doped N-type regions 2080 into active substrate sites (e.g., at a temperature of 700 to 1000° C. for 1 to 60 minutes).

Figure 39:
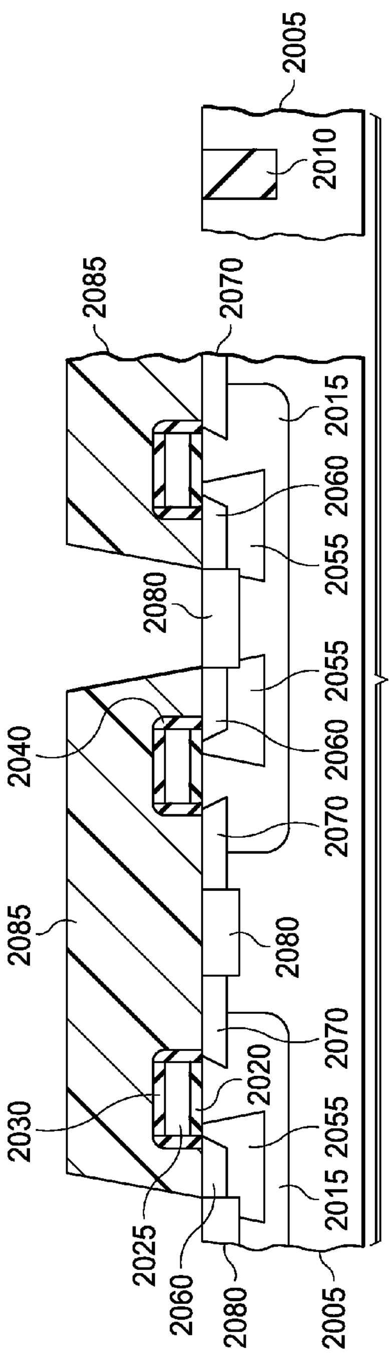
Figure 40:
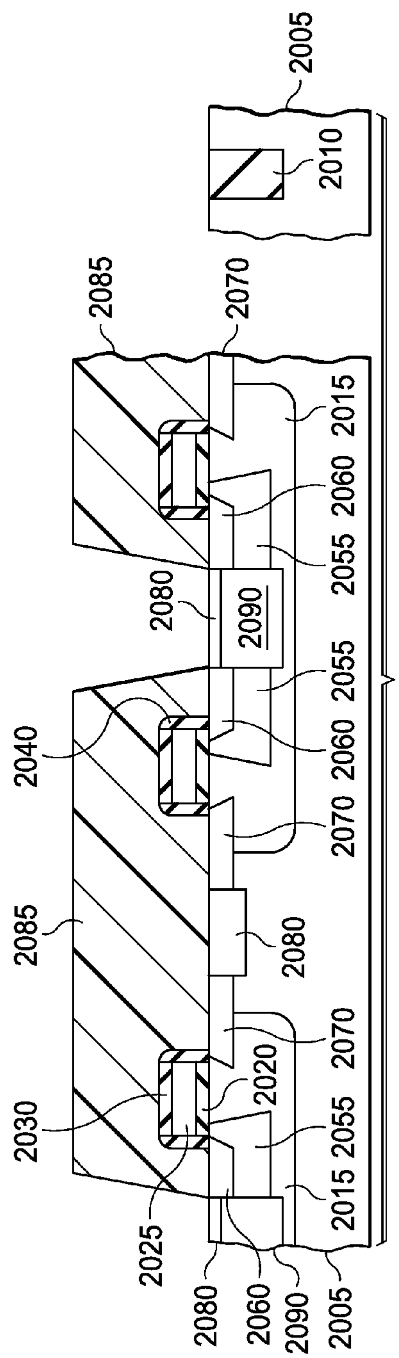
Figure 41:
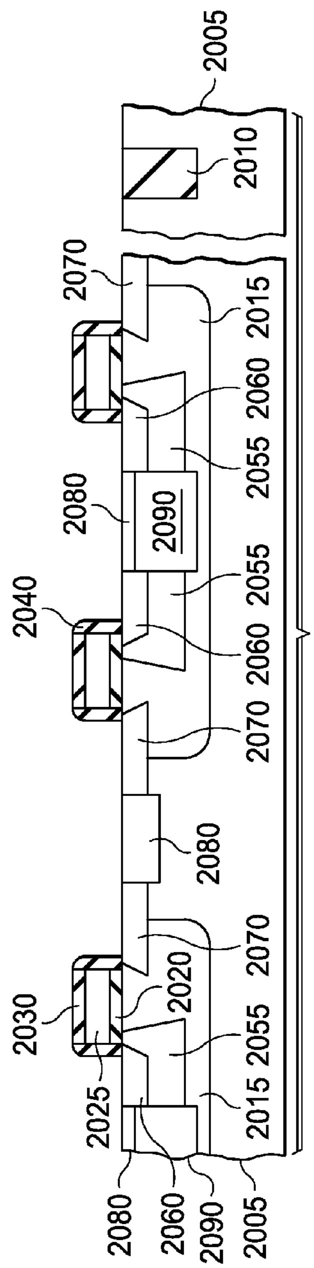

Turning now to FIG. 39, a photoresist 2085 is applied, patterned, and etched for later selective implantation of P-type ions in selected areas in a later step between source and drain regions of the N-LDMOS device. As illustrated in FIG. 40, heavily doped P-type regions 2090 are formed with ion implantation of, for instance, boron. In an embodiment, the heavily doped P-type regions 2090 are doped to a density of about $1\cdot10^{19}$ to $5\cdot10^{20}$ atoms/$cm^{-3}$, and are implanted at a controlled energy of 5 to 50 keV. After stripping the photoresist 2085 as illustrated in FIG. 41, the semiconductor device is annealed in an oven to transform the heavily doped P-type regions 2090 into active substrate sites (e.g., at a temperature of 700 to 1000° C. for 1 to 60 minutes). The heavily doped N-type regions 2080 above the heavily doped P-type regions 2090 are relatively thin (e.g., about 10 to 100 Å).

Figure 42:
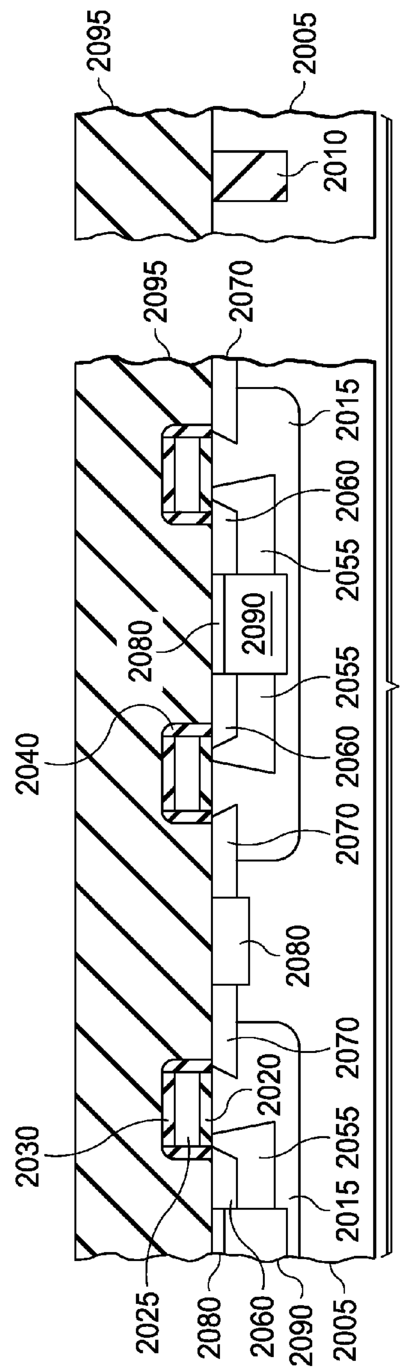

Turning now to FIG. 42, a low-temperature silicon dioxide ("$SiO_2$") layer 2095 (an insulating layer) is formed, for instance, in a chamber with oxygen and silicon source gas for 30 to 90 minutes at 550 to 900° C. on the surface of the semiconductor device. In order to avoid siliciding the N-type regions on the surface, the low-temperature silicon dioxide layer 2095 is deposited, and then photoresist is applied and processed to define regions with a self-aligned block ("SAB," a self-aligned silicide/salicide block), where silicide will be formed. Silicide only forms on exposed silicon. In regions where silicon is covered by a layer of $SiO_2$, a silicide layer will not be formed.

Figure 43:
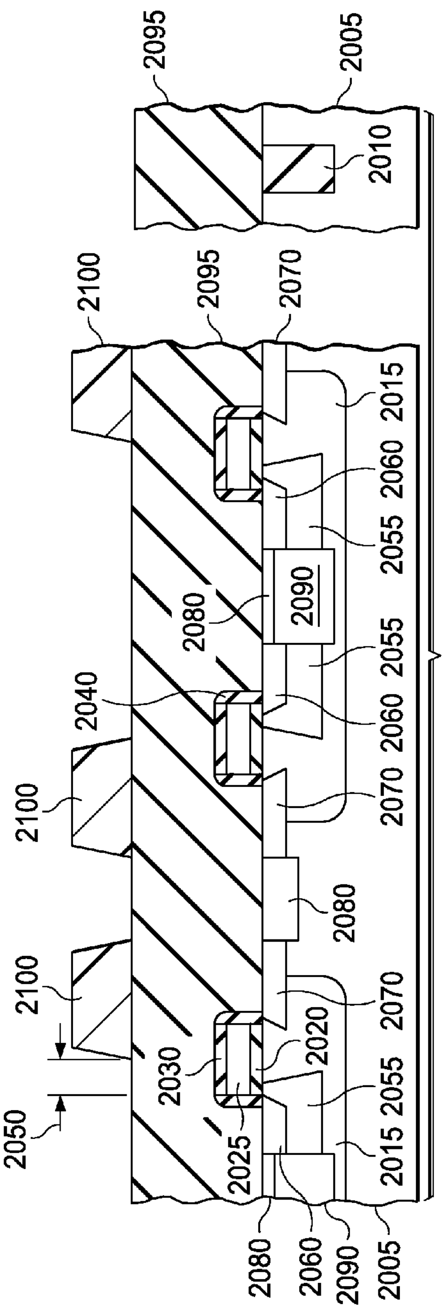
Figure 44:
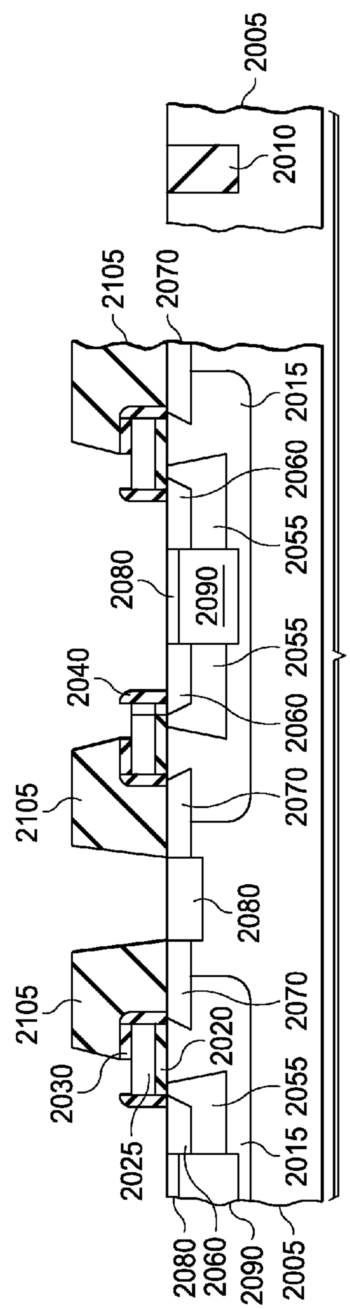
Figure 45:
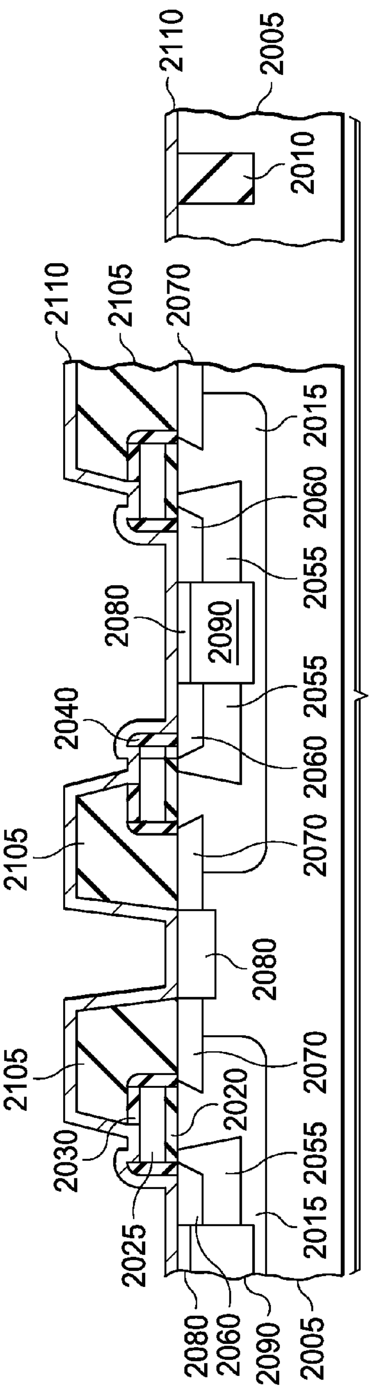

Turning now to FIG. 43, a photoresist 2100 is patterned and etched to enable formation of silicide regions over selected areas of the semiconductor device (the half a gate width 2050 is illustrated for subsequent processing). After etching the low-temperature silicon dioxide layer 2095 as illustrated in FIG. 44, silicon dioxide regions 2105 are left behind. The overlying gate oxide layer 2030 is also partially removed as illustrated in FIG. 44. As illustrated in FIG. 45, a nonreactive refractory metal 2110 is applied over the surface of the semiconductor device. Example refractory metals include tungsten, titanium, and cobalt. Silicide (e.g., a thickness preferably in the range of 100-800 angstroms ("Å")) is formed over exposed silicon and polysilicon surfaces with a low-temperature bake (e.g., at a temperature of 400 to 550° C. for 1 to 20 minutes), followed by a high-temperature anneal (e.g., at a temperature of 600 to 800° C. for 1 to 20 minutes) to reduce silicide sheet resistance.

Figure 46:
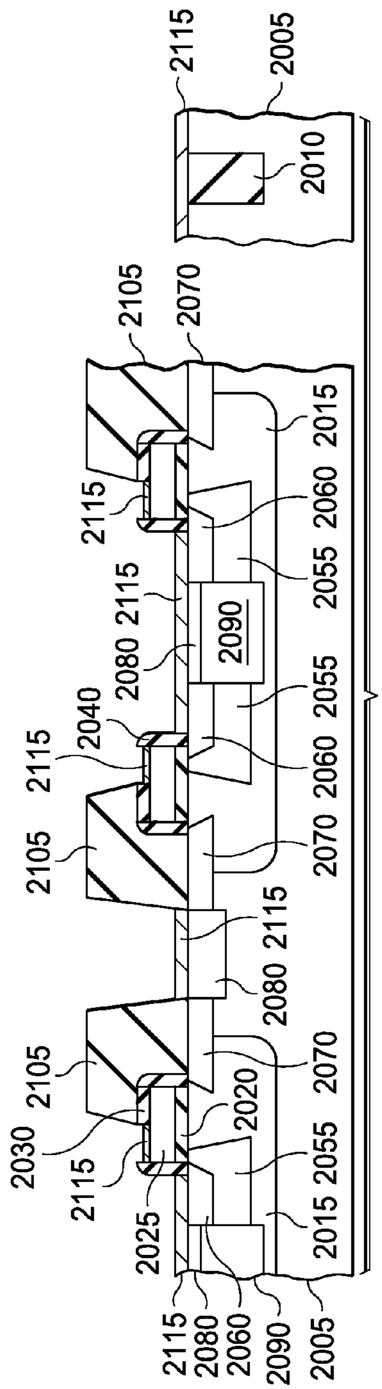

Turning now to FIG. 46, the nonreactive refractory metal 2110 is etched with a wet etch leaving behind a silicide layer 2115. The portion of the silicide layer 2115 that was formed over exposed regions of silicon and polysilicon are not substantially reactive to the wet etch and are not removed by the wet etch. An example wet etch is aqua regia, a mixture of nitric and hydrochloric acids. In an embodiment, the silicide layer 2115 that overlies gate polysilicon layer 2025 is electrically coupled to the gate metallic strips 1130 formed in a first metallic layer M1 as discussed with respect to FIG. 11, et seq.

Figure 47:
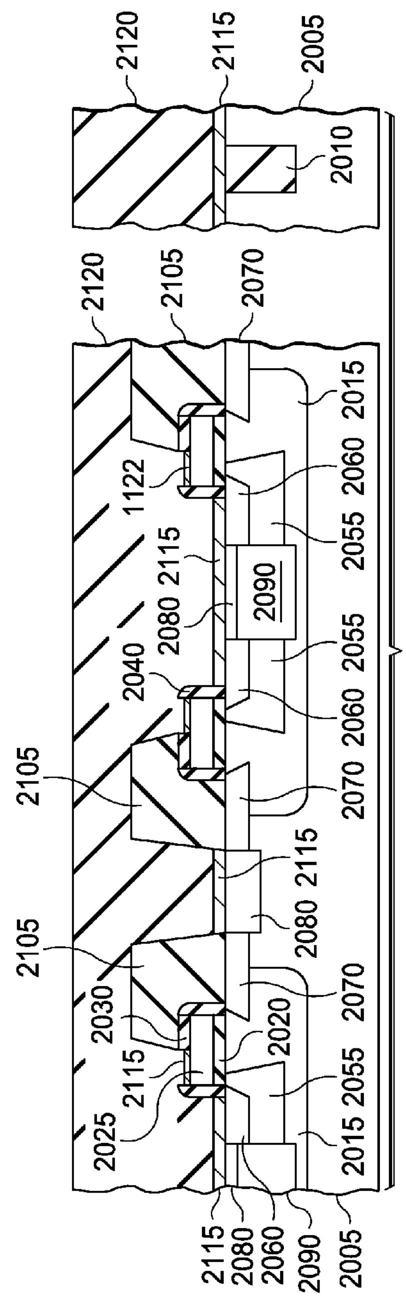
Figure 48:
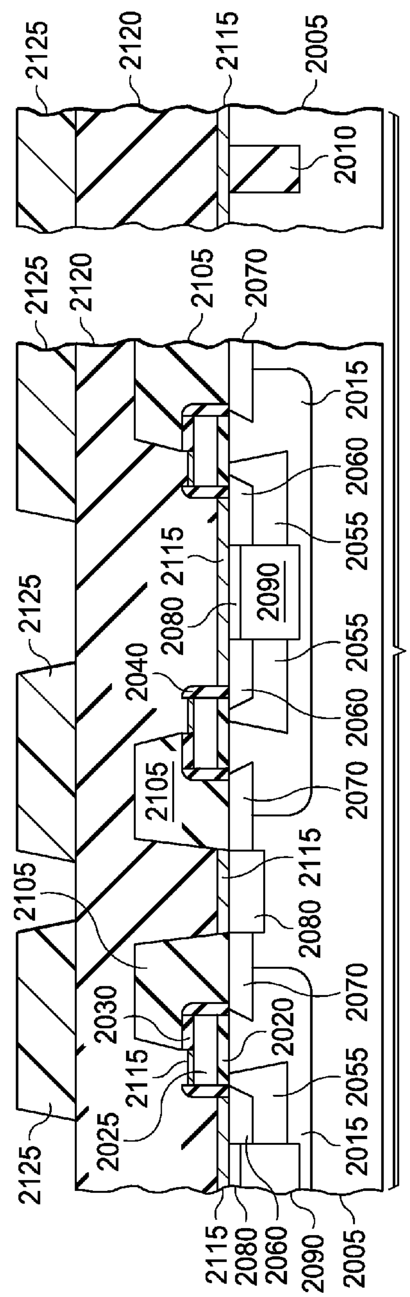

Turning now to FIG. 47 an amorphous silicon oxynitride ("$Si_xO_yN_z$") layer 2120 (an insulating layer) is deposited employing a plasma deposition process over the surface of the semiconductor device. Formation of an amorphous silicon oxynitride layer 2120 employing a plasma deposition process is well known in the art, and will not be described further herein. As illustrated in FIG. 48, a photoresist layer 2125 is deposited over the silicon oxynitride layer 2120. The photoresist layer 2125 is patterned and etched to expose portions of the silicide layer 2115 in a later processing step.

Figure 49:
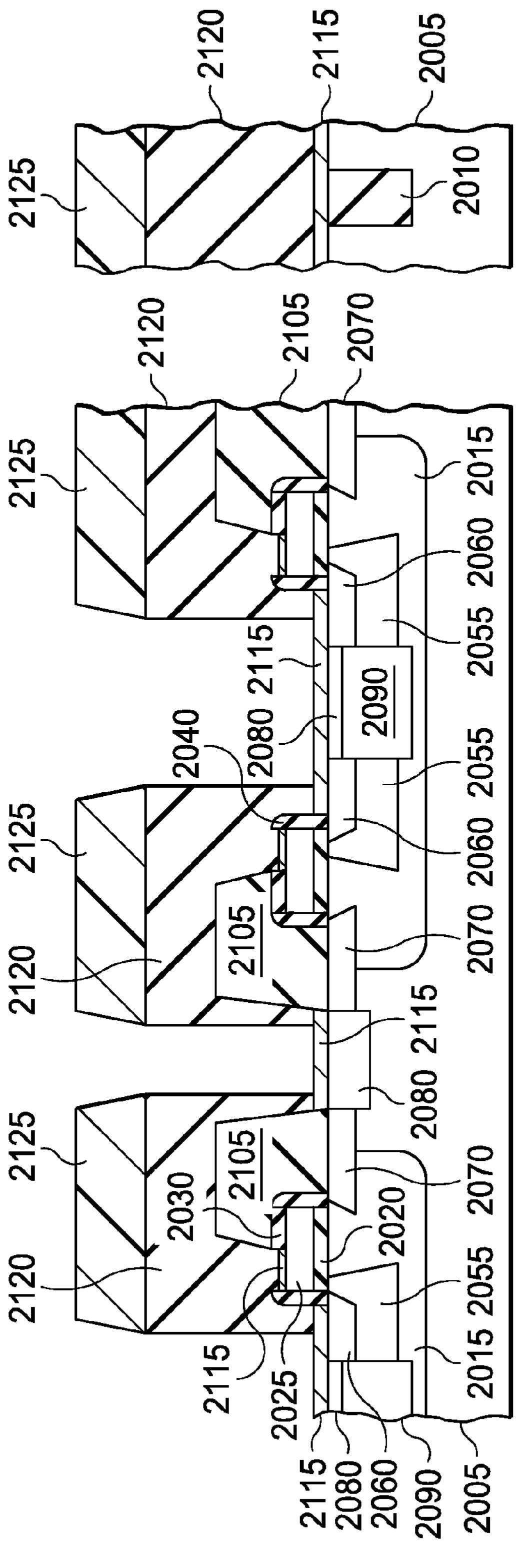
Figure 50:
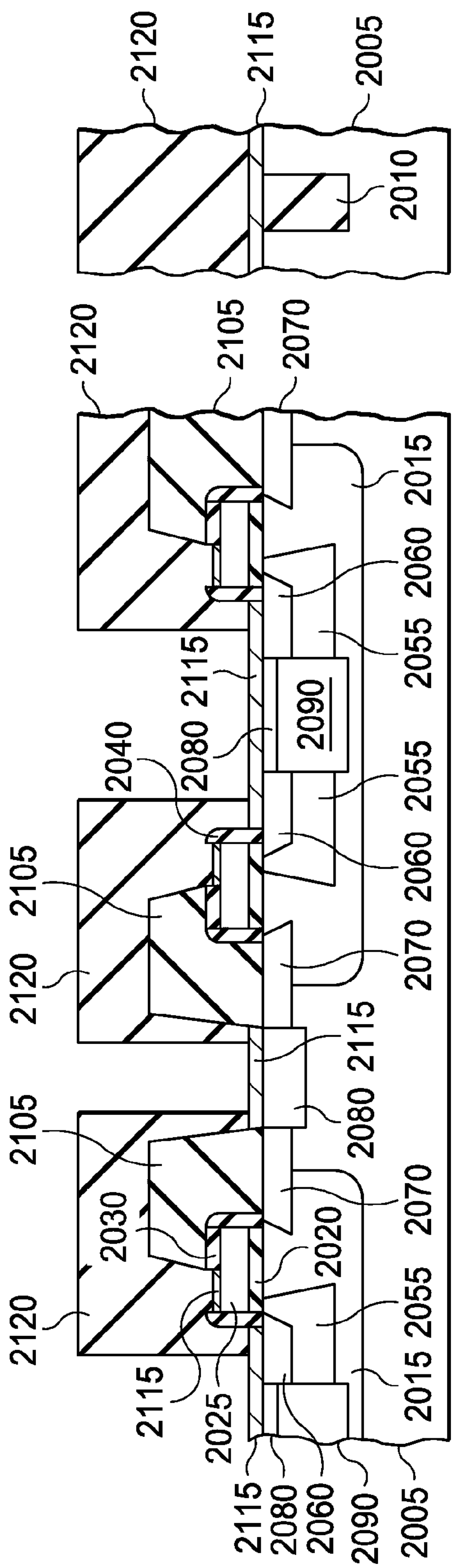
Figure 51:
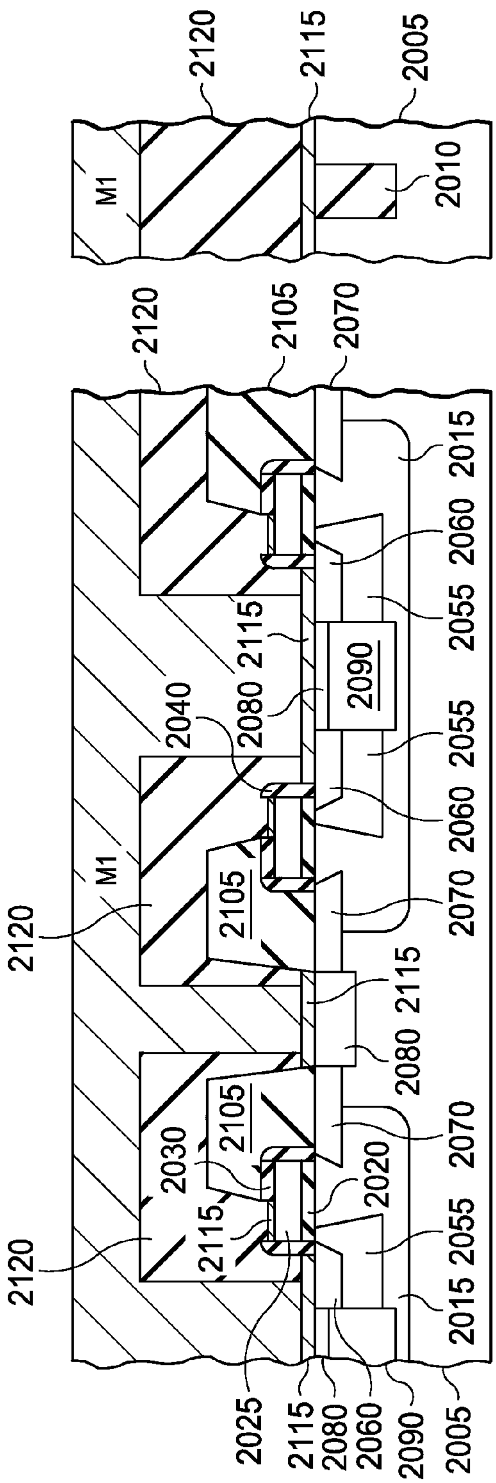

Turning now to FIG. 49, the silicon oxynitride layer 2120 is etched with a suitable etch, such as a reactive ion etch ("RIE"), to expose portions of the silicide layer 2115. As illustrated in FIG. 50, the remaining portions of the photoresist layer 2125 are stripped. A first metallic (e.g., aluminum) layer M1 is then vacuum-deposited over the surface of the semiconductor device as illustrated in FIG. 51.

Figure 52:
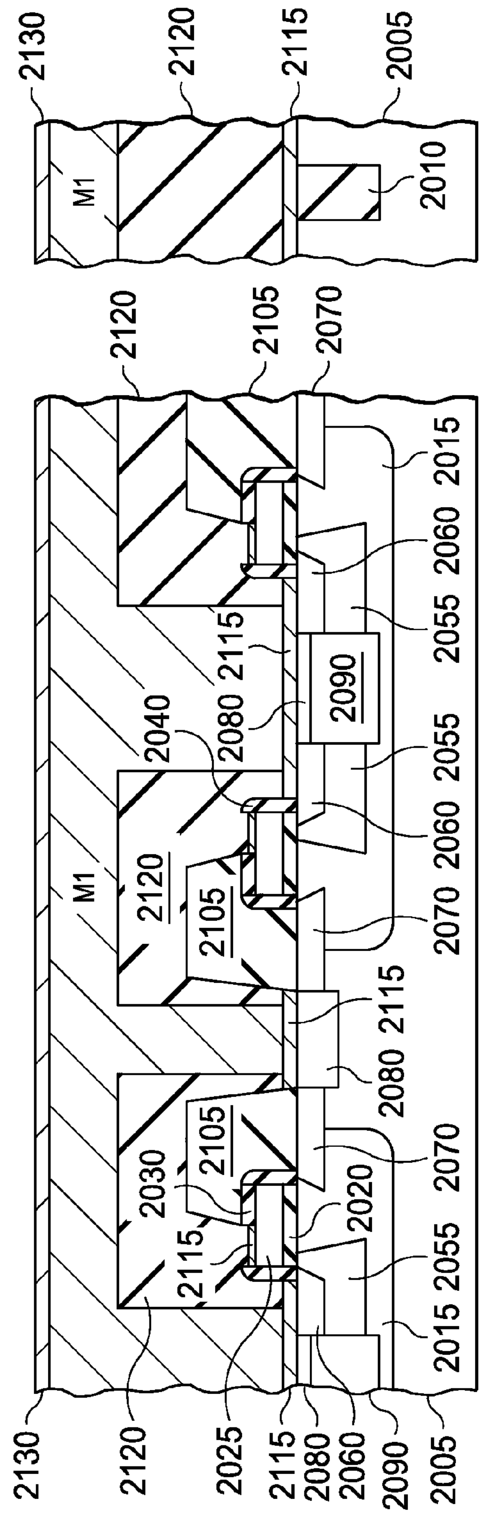
Figure 53:
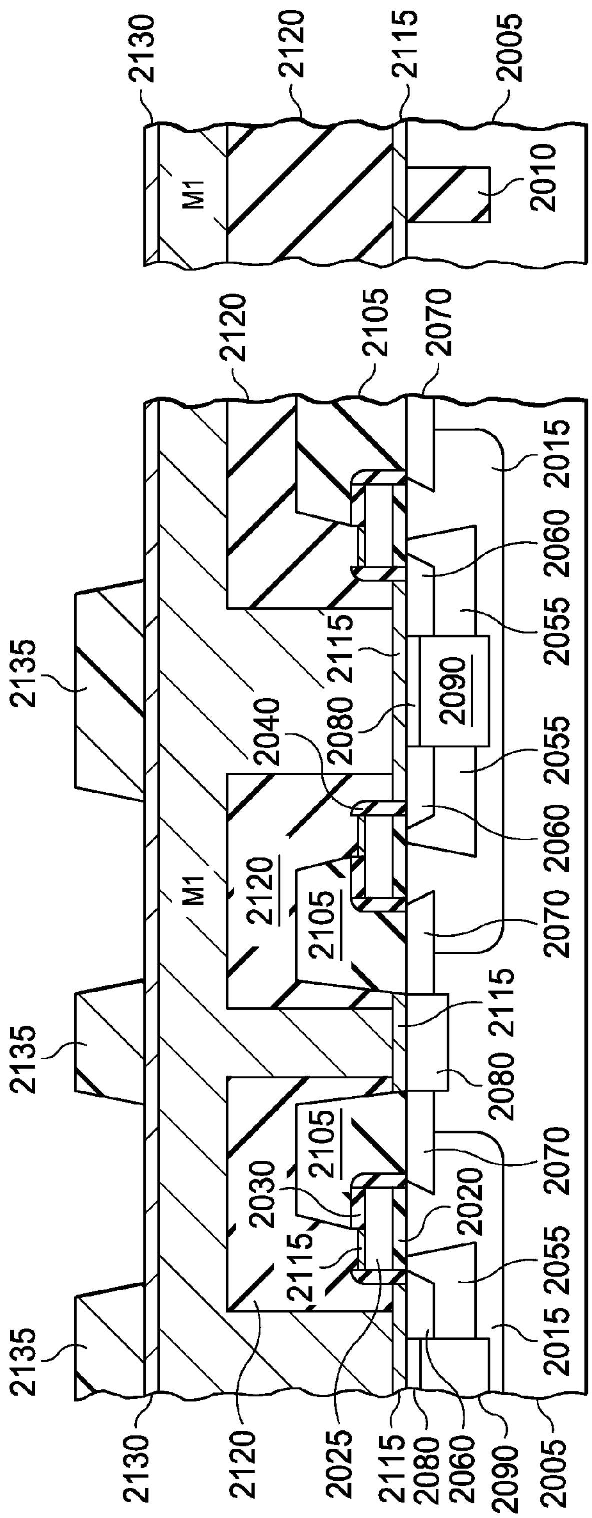
Figure 54:
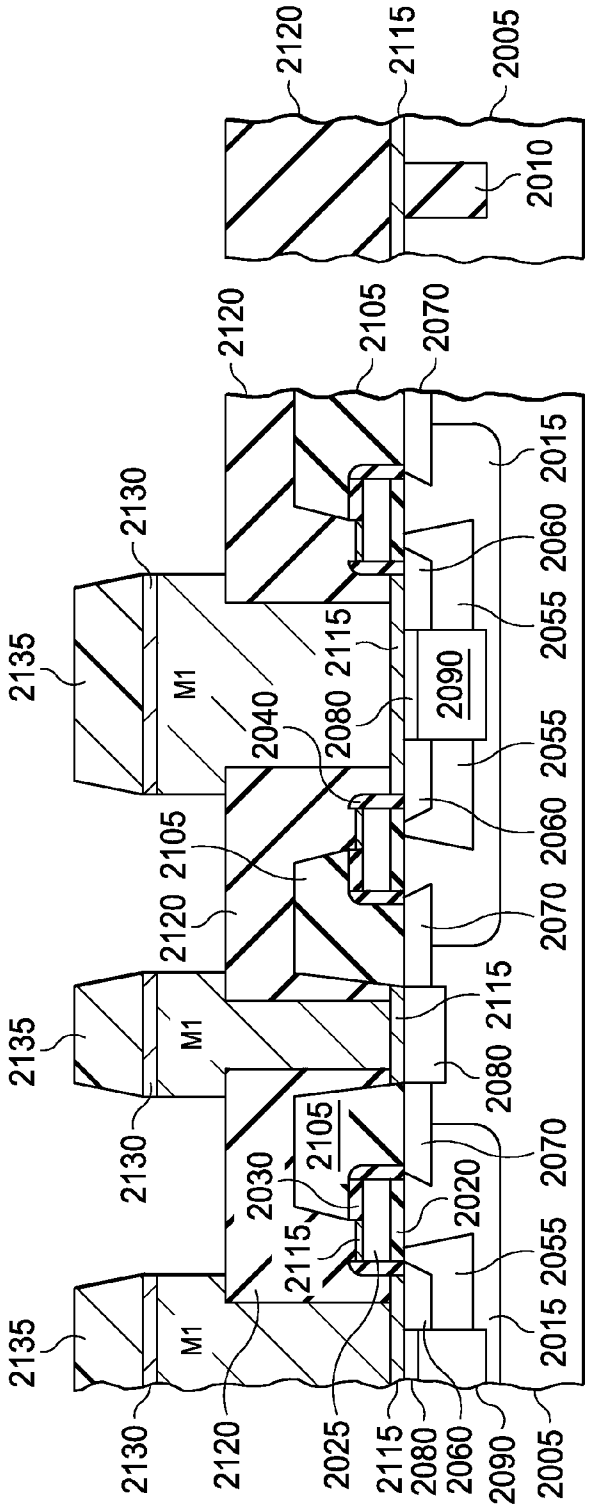
Figure 55:
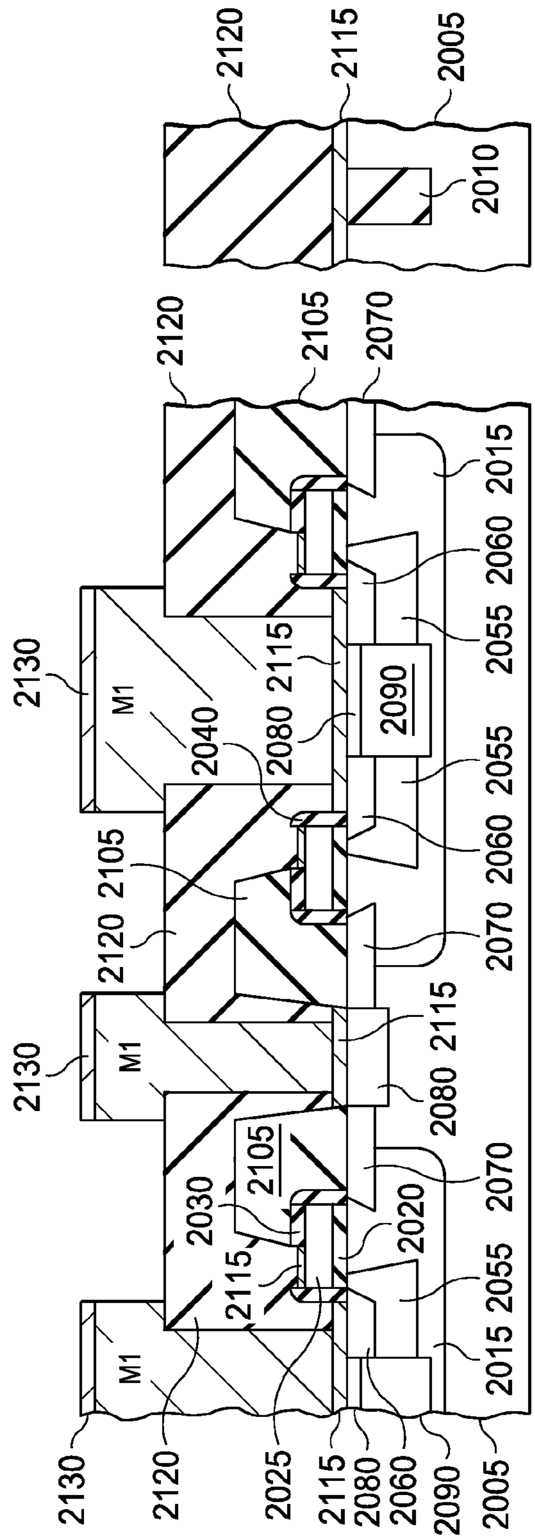

Turning now to FIG. 52, an etch-stop refractory layer 2130 is deposited over the first metallic layer M1. In an embodiment, the etch-stop refractory layer 2130 is titanium nitride, cobalt nitride, or tungsten nitride. A process for deposition of an etch stop refractory layer over an aluminum layer is well known in the art and will not be described further herein. As illustrated in FIG. 53, a photoresist layer 2135 is deposited over the semiconductor device, which is then patterned and etched to cover areas of the first metallic layer M1 that will be retained. Thereafter, exposed areas of etch-stop refractory layer 2130 and exposed areas of the first metallic layer M1 are removed with a suitable etch, such as an RIE, as illustrated in FIG. 54. Additionally, the remaining portions of the photoresist layer 2135 are stripped, thereby exposing remaining portions of the etch-stop refractory layer 2130 and the silicon oxynitride layer 2120 as illustrated in FIG. 55.

Figure 56:
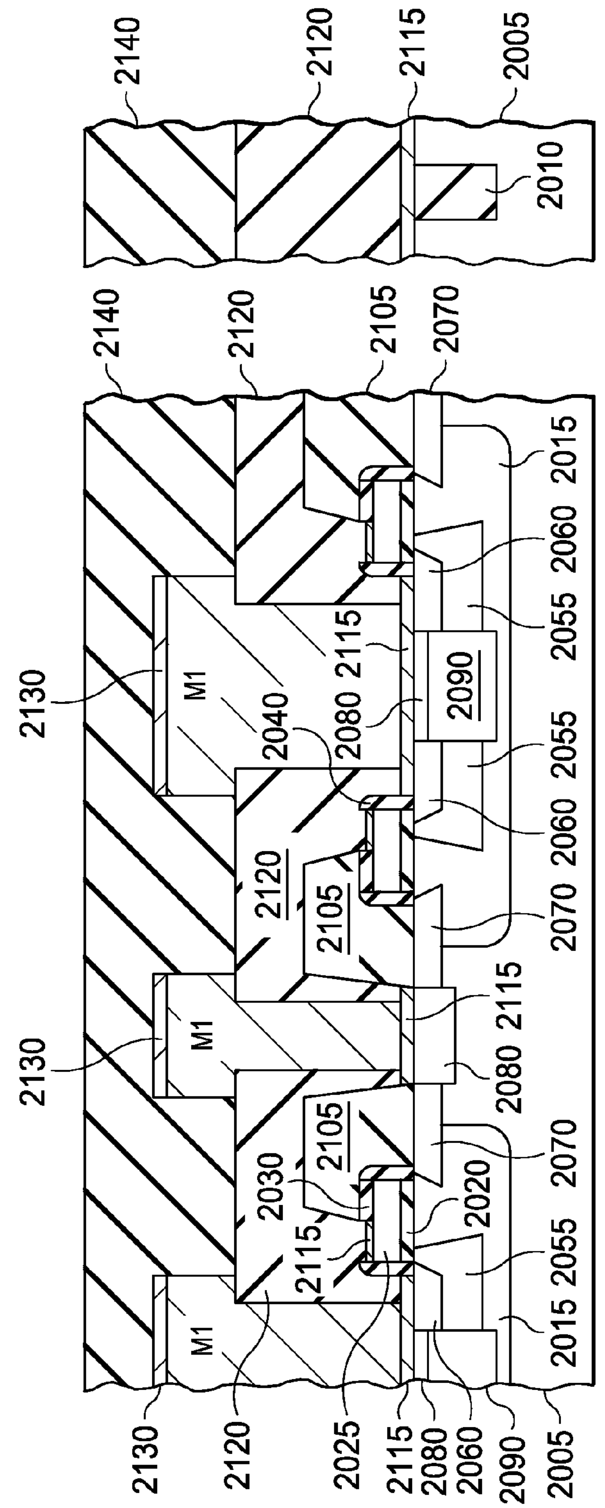
Figure 57:
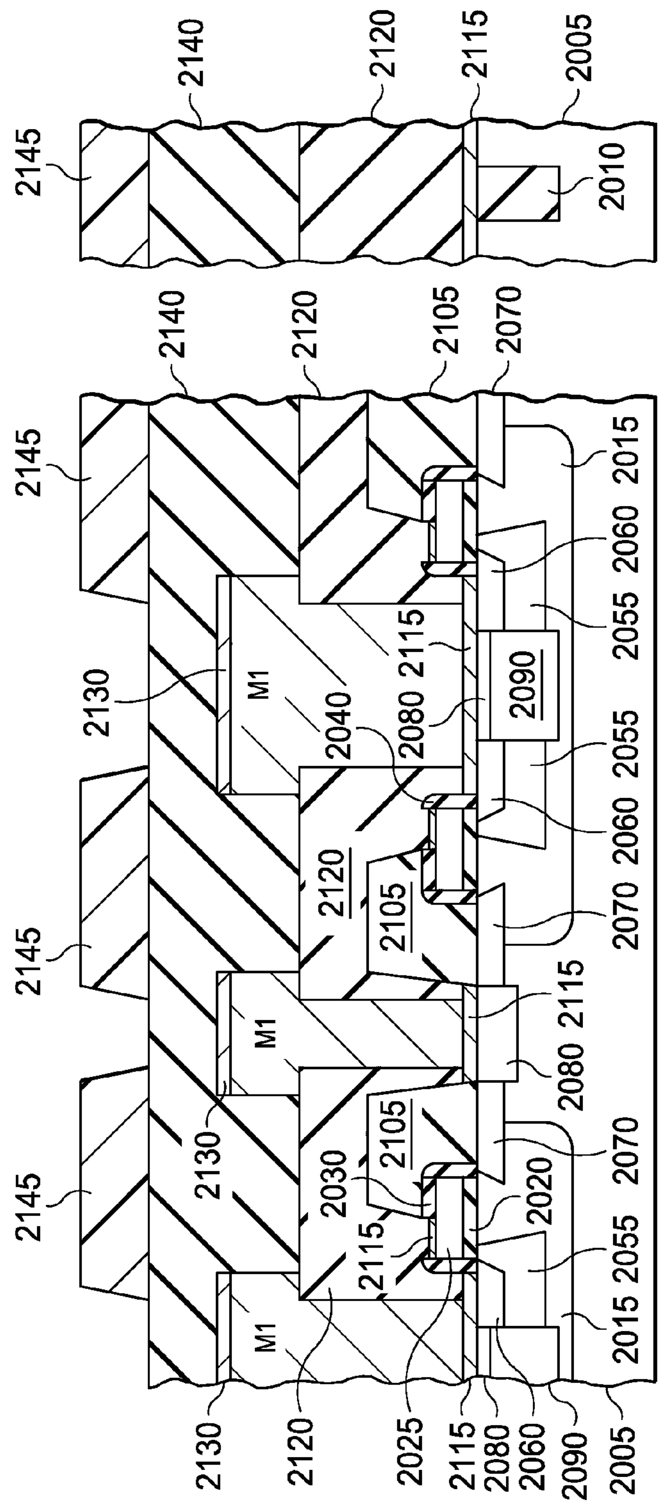
Figure 58:
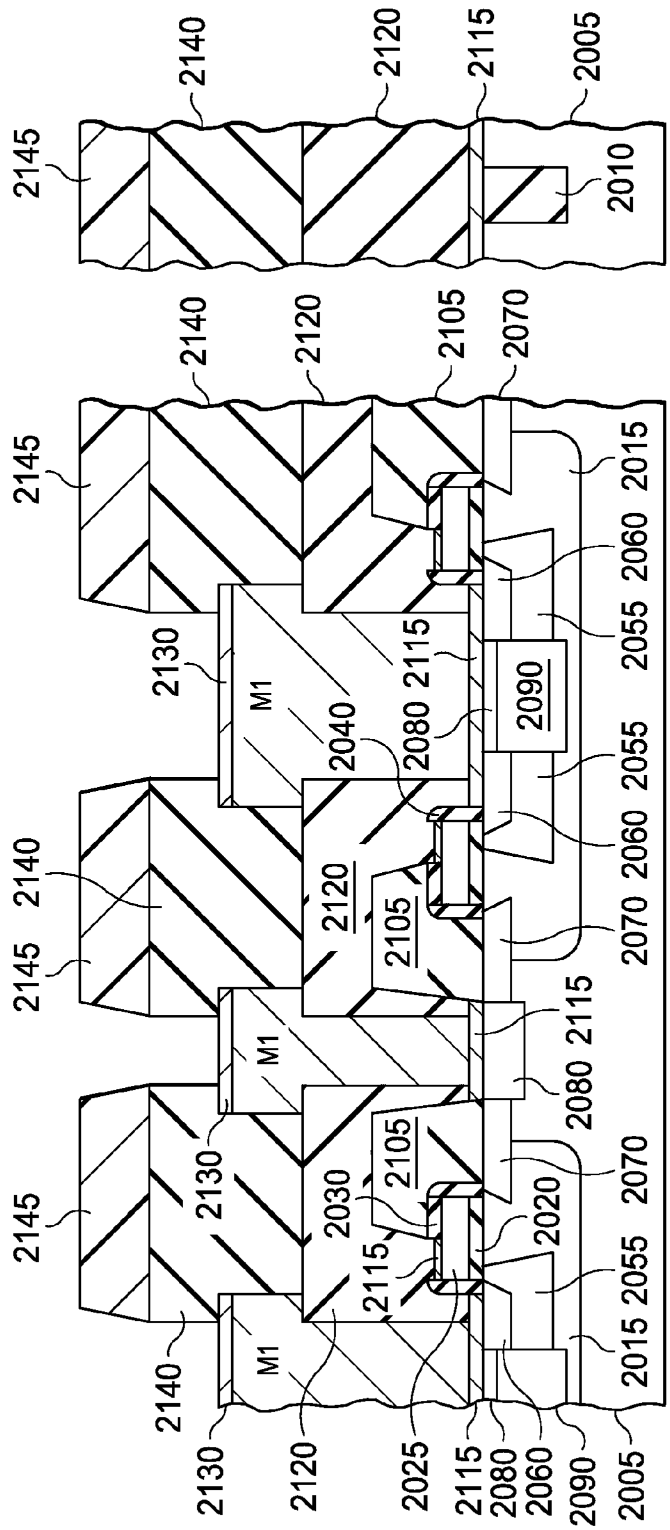

Turning now to FIG. 56, another silicon oxynitride layer 2140 (an insulating layer) is deposited over the semiconductor device, and planarized by chemical-mechanical planarization. As illustrated in FIG. 57, a photoresist layer 2145 is deposited and patterned over the silicon oxynitride layer 2140 to enable formation of low-resistance, metallic, source and drain contacts for the N-LDMOS in a sequence of processing steps. Thereafter, the silicon oxynitride layer 2140 is etched down to the etch-stop refractory layer 2130 as illustrated in FIG. 58. An example silicon oxynitride etchant apparatus employs hexafluoroethane ("$C_2F_6$") gas in an inductively coupled plasma etching apparatus.

Figure 59:
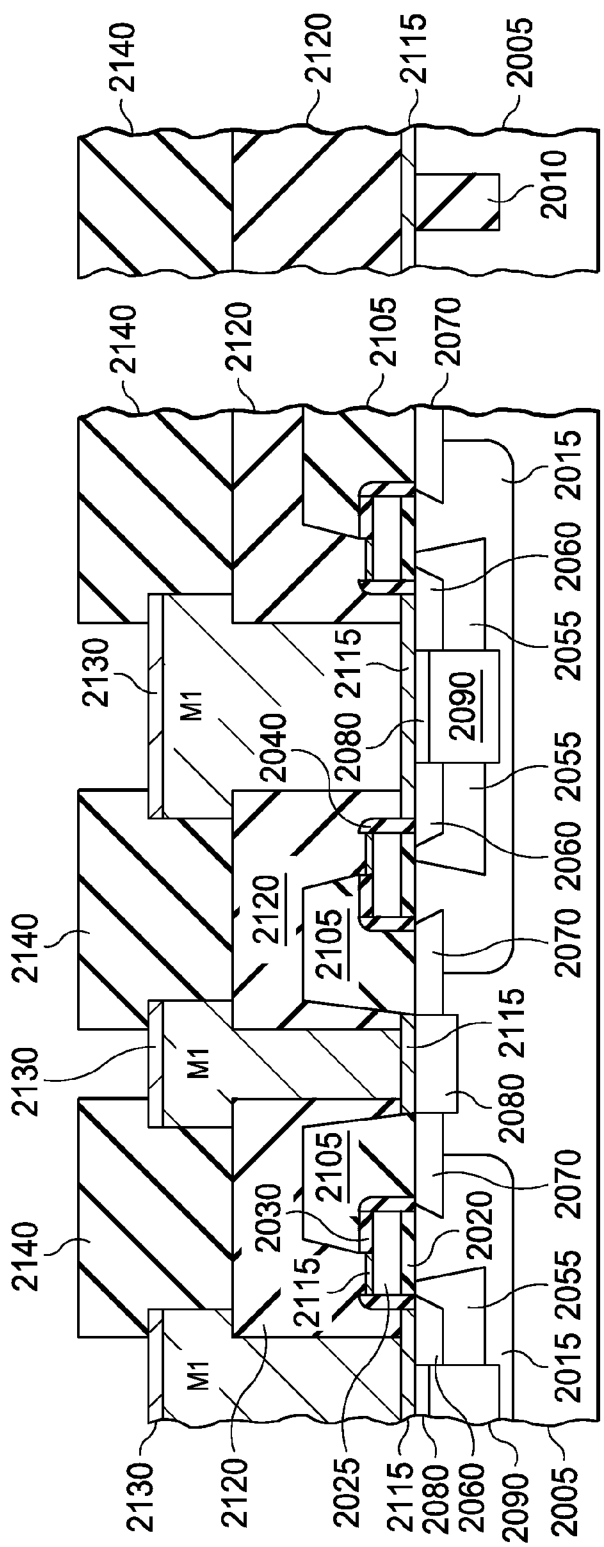
Figure 60:
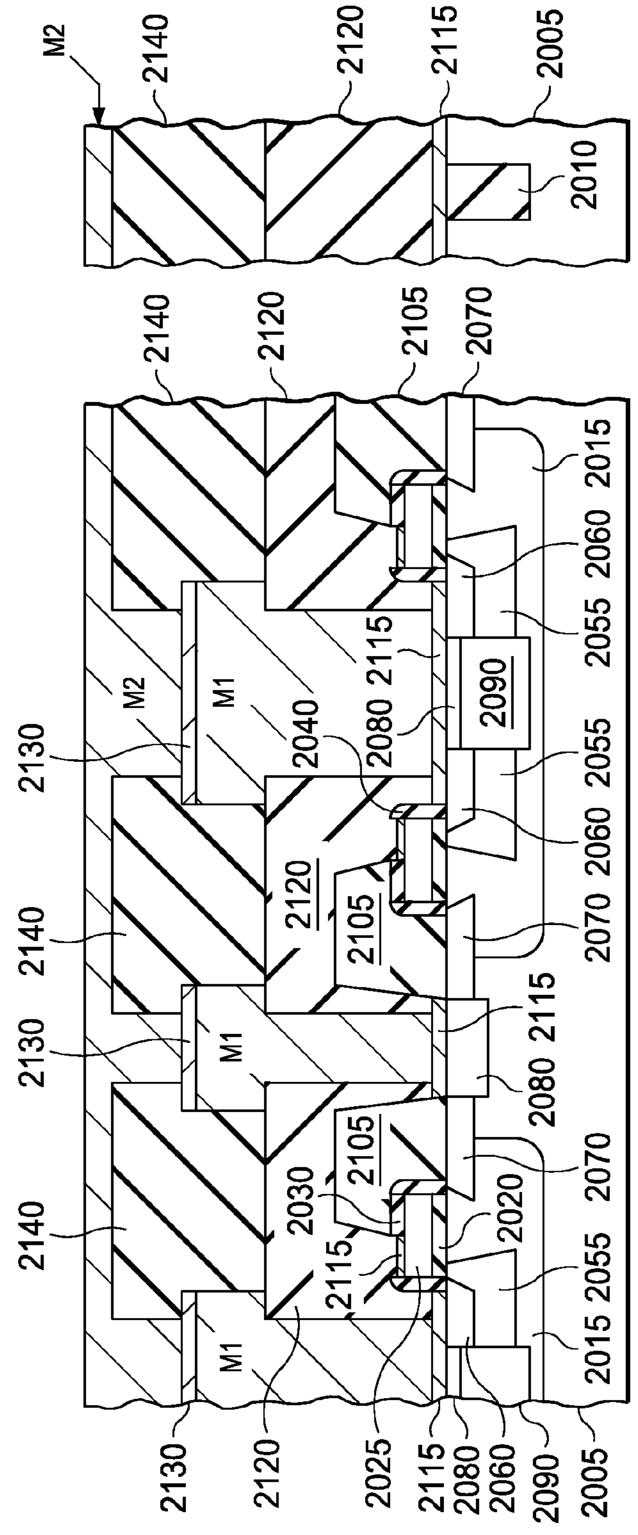
Figure 61:
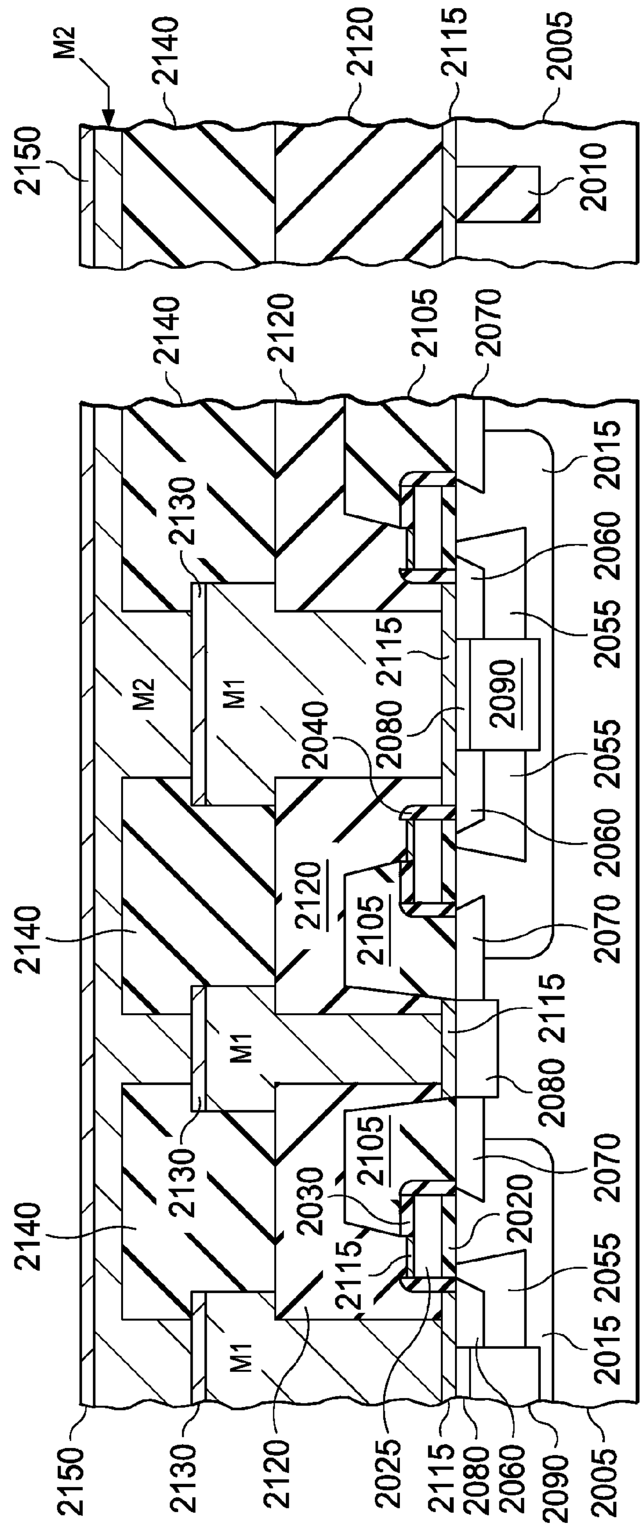
Figure 62:
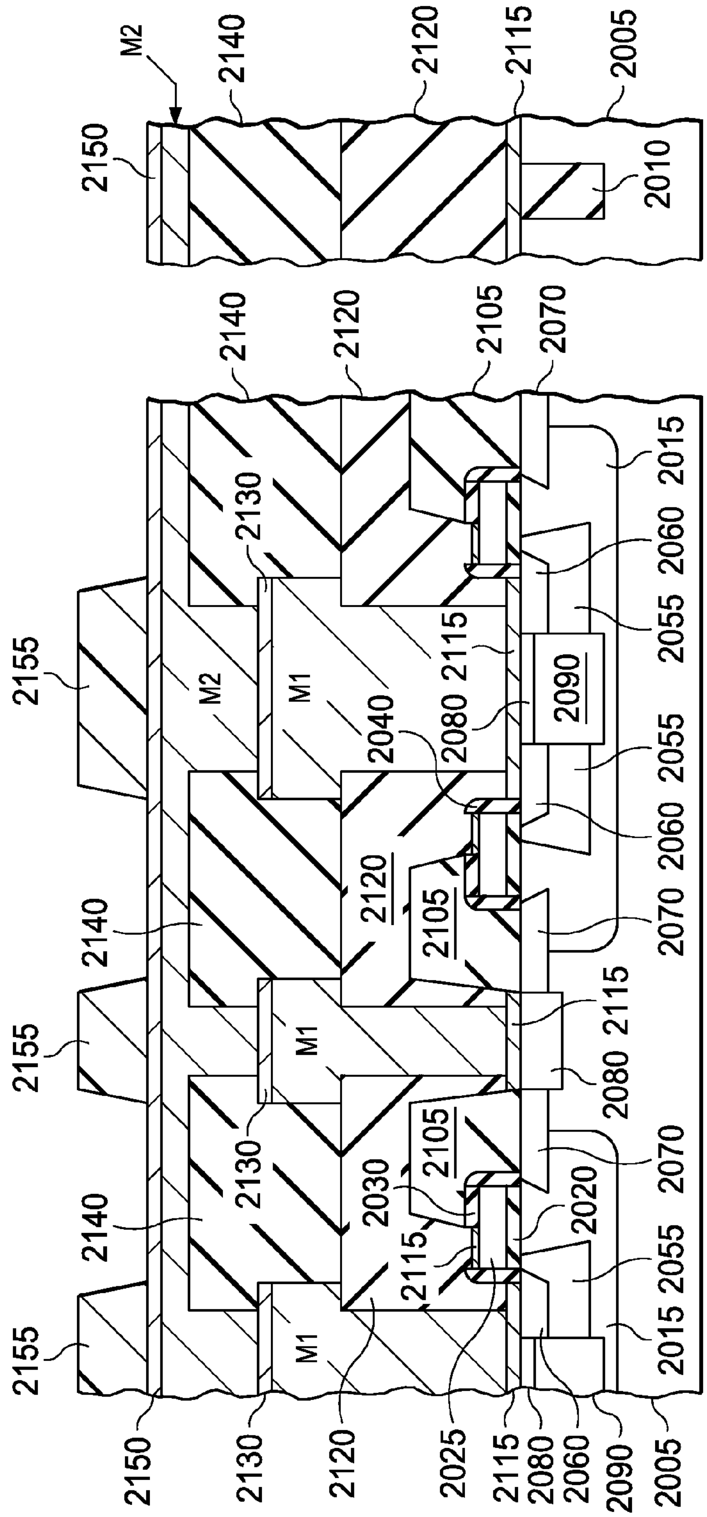
Figure 63:
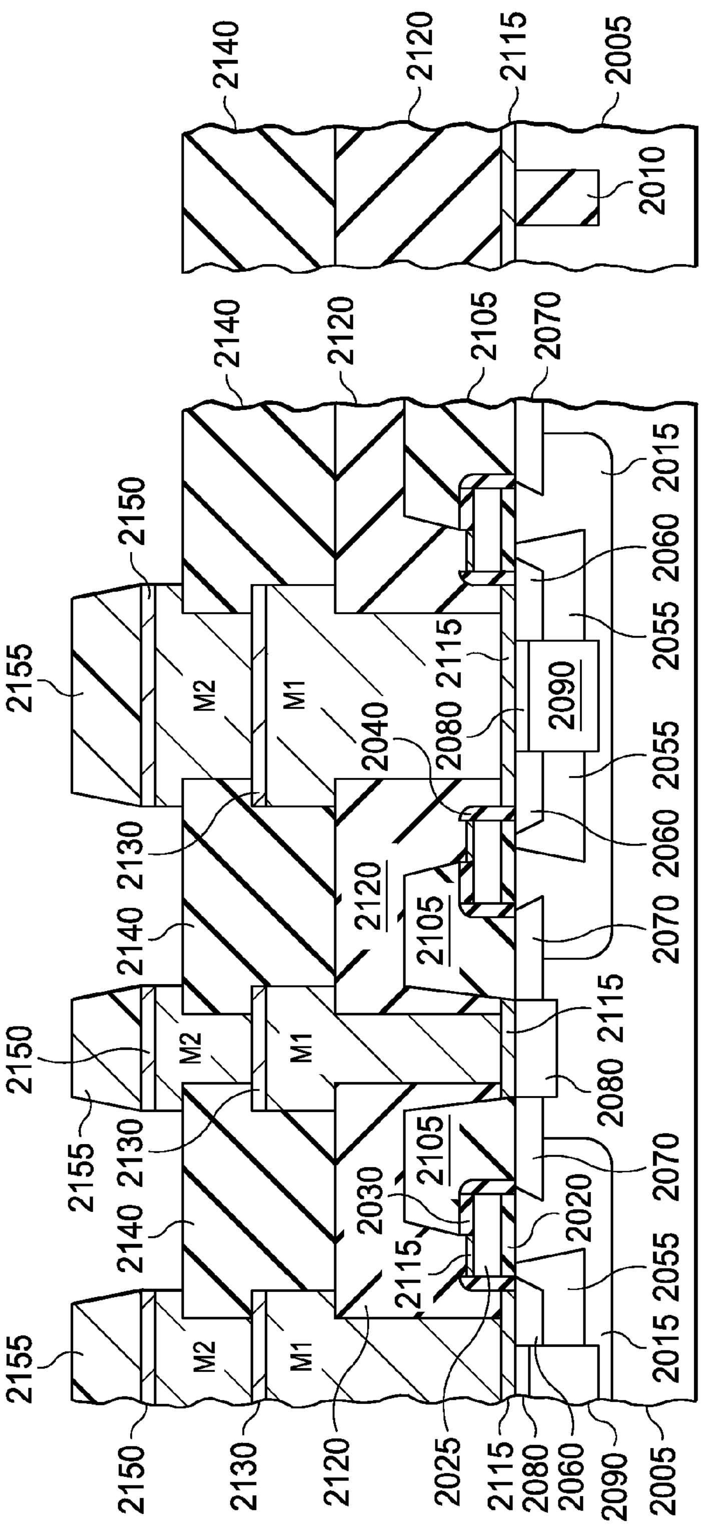
Figure 64:
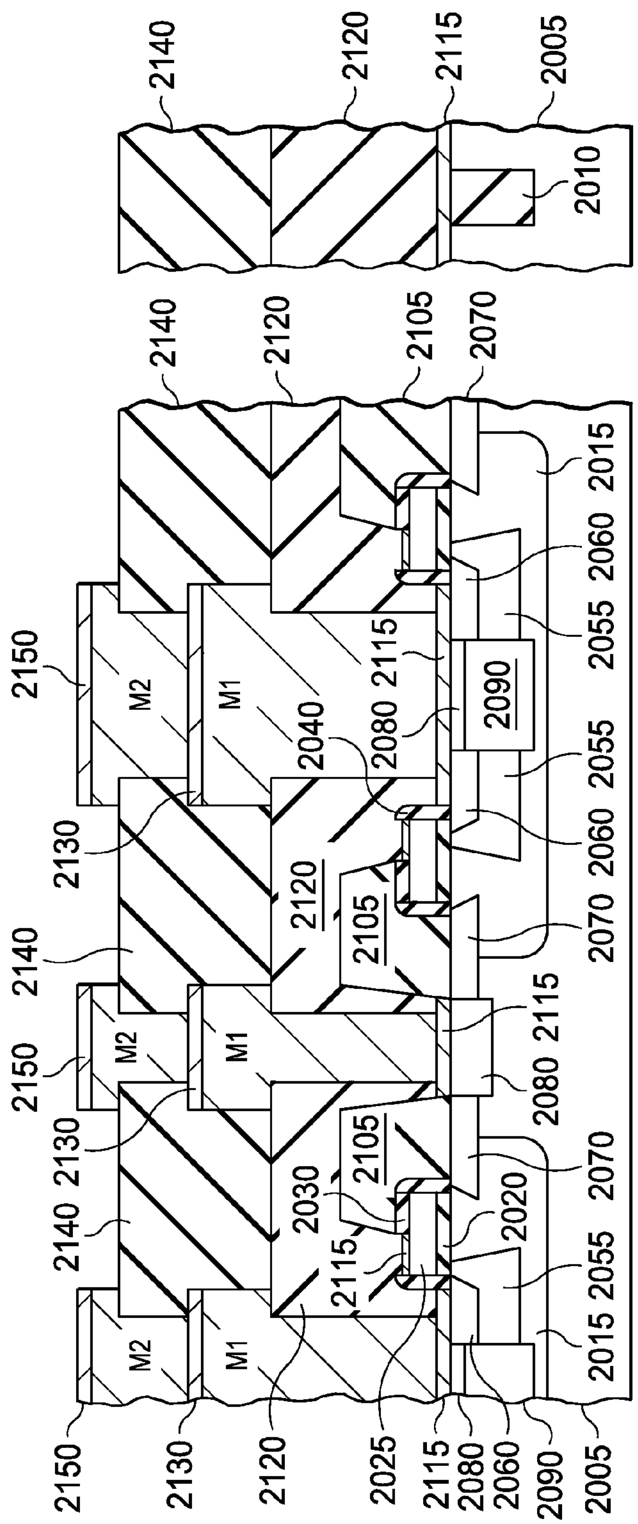

Turning now to FIG. 59, the photoresist layer 2145 is stripped off. Thereafter, a second metallic (e.g., aluminum) layer M2 is then vacuum-deposited over the surface of the semiconductor device as illustrated in FIG. 60. An etch-stop refractory layer 2150 is deposited over the second metallic layer M2 as illustrated in FIG. 61. In an embodiment, the etch-stop refractory layer 2150 is titanium nitride, cobalt nitride, or tungsten nitride. As illustrated in FIG. 62, a photoresist layer 2155 is deposited and patterned over the etch-stop refractory layer 2150 to cover areas of the second metallic layer M2 to be retained. Thereafter, exposed areas of etch-stop refractory layer 2150 and exposed areas of the second metallic layer M2 are removed with a suitable etch, such as an RIE, as illustrated in FIG. 63. Additionally, the remaining portions of photoresist layer 2155 are stripped, thereby exposing remaining portions of the etch-stop refractory layer 2150 and the silicon oxynitride layer 2140 as illustrated in FIG. 64.

Figure 65:
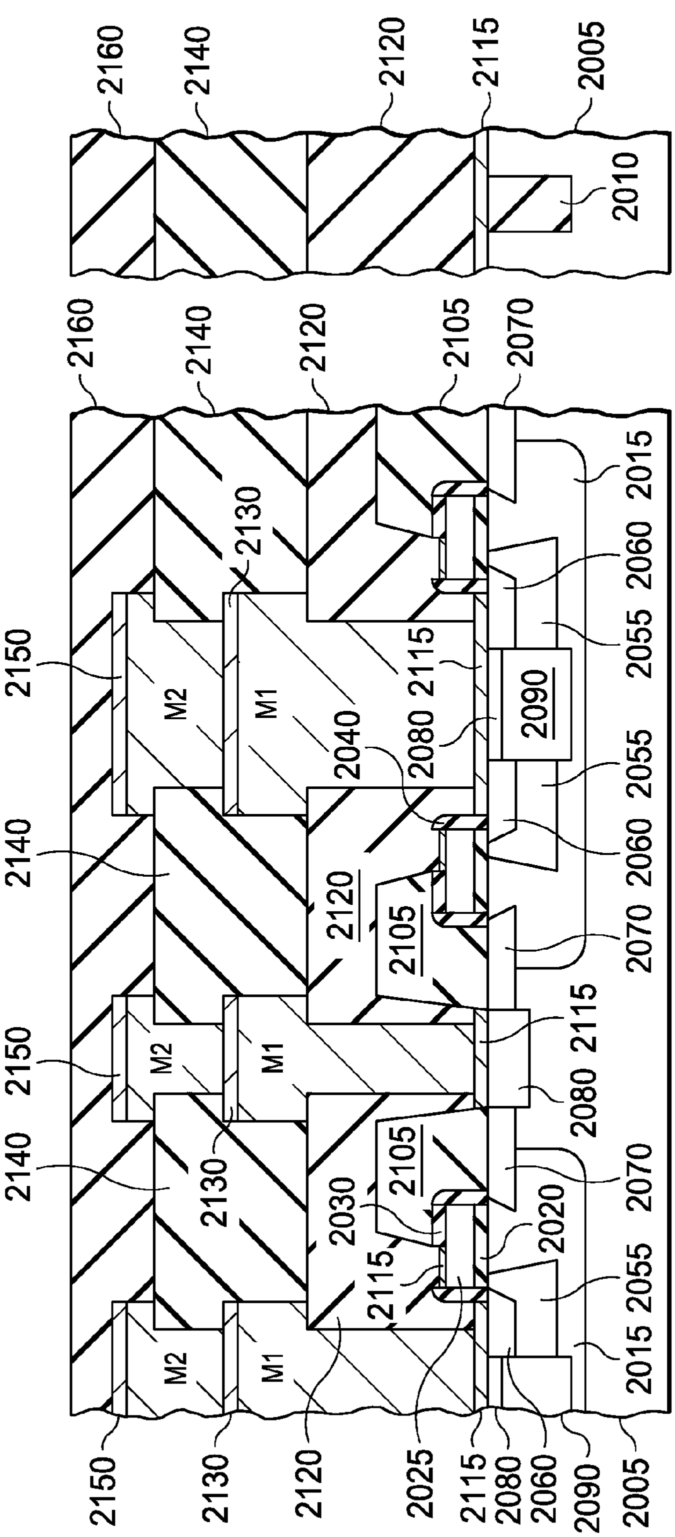
Figure 66:
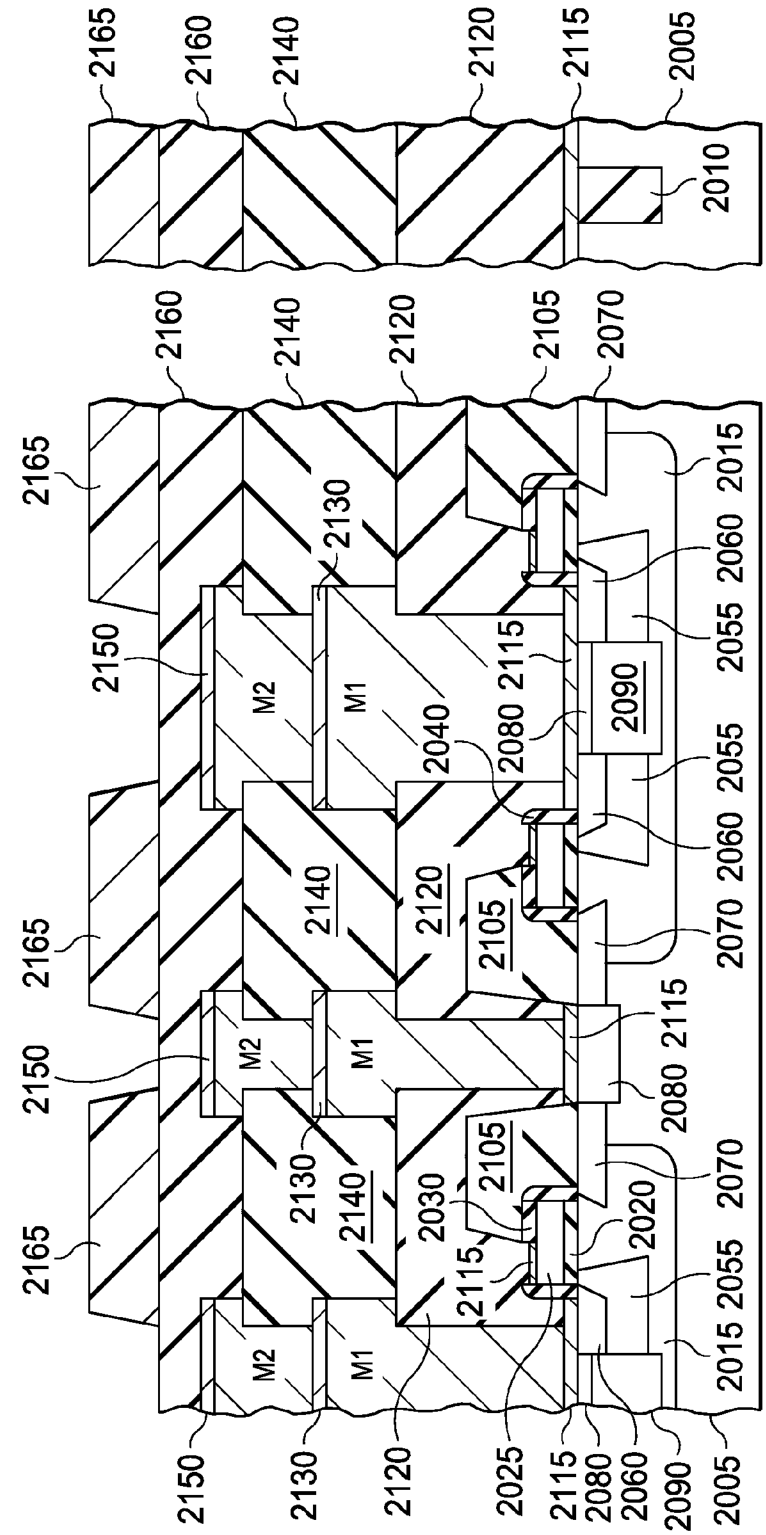
Figure 67:
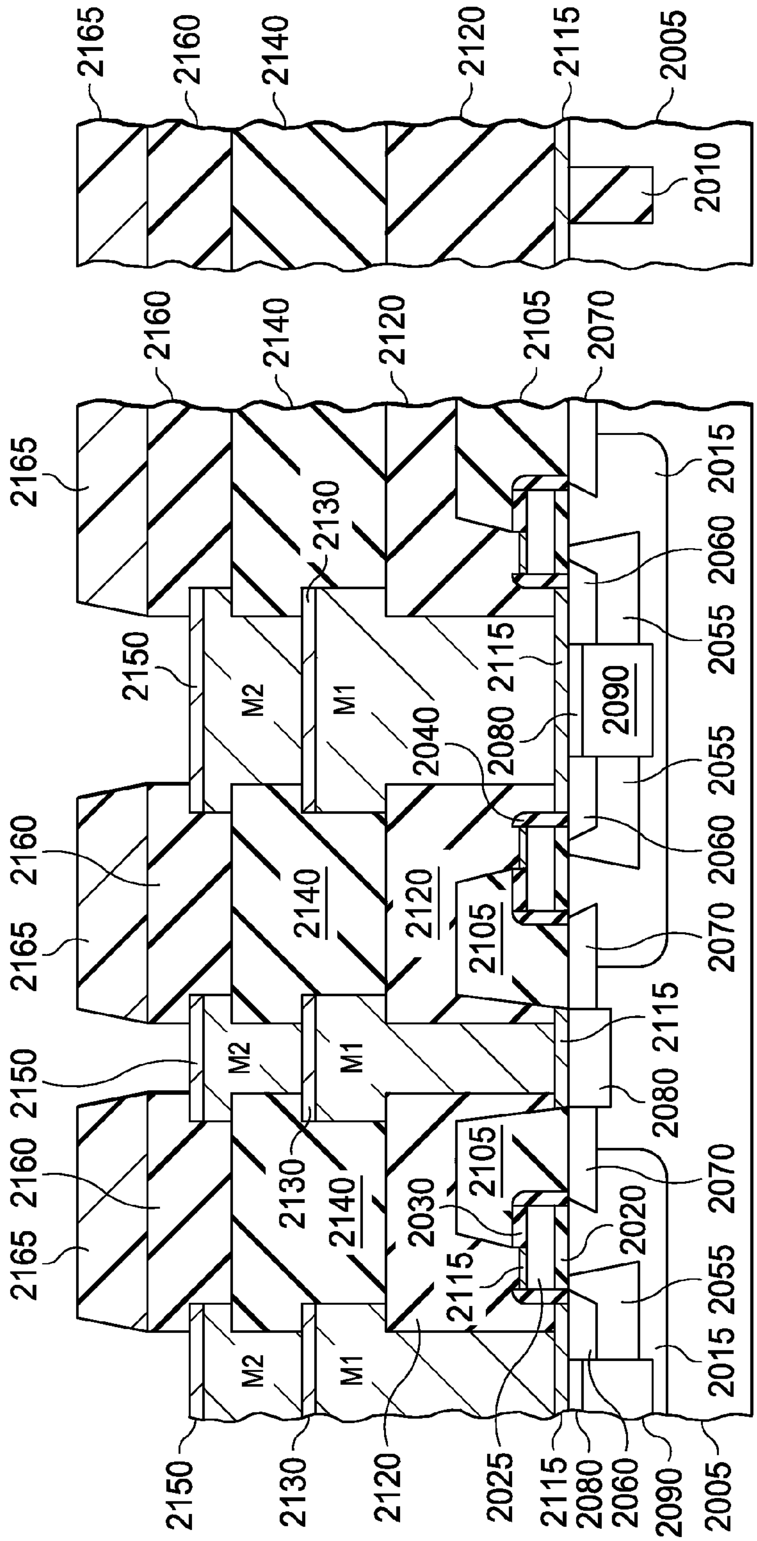
Figure 68:
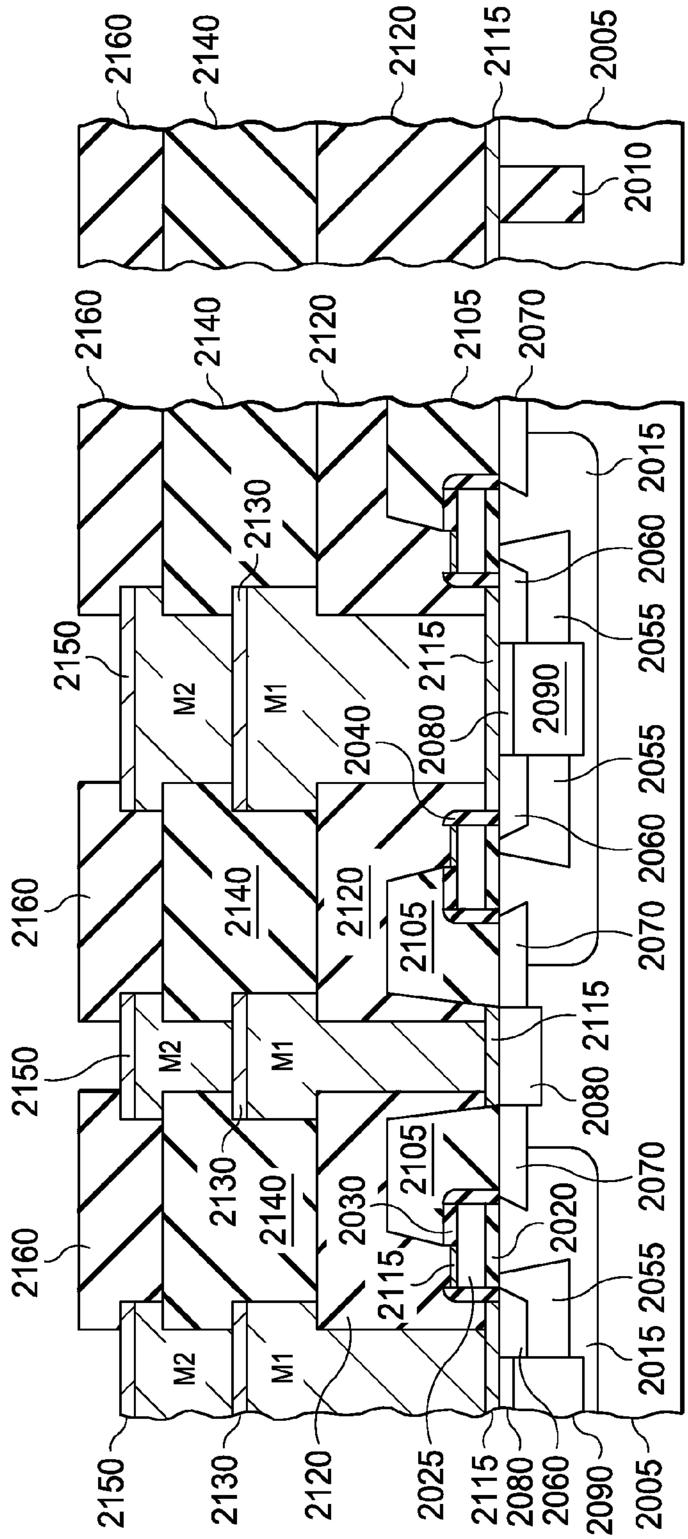

Turning now to FIG. 65, another silicon oxynitride layer 2160 (an insulating layer) is deposited over the semiconductor device, and planarized by chemical-mechanical planarization. As illustrated in FIG. 66, a photoresist layer 2165 is deposited and patterned over the silicon oxynitride layer 2160 to cover areas of the silicon oxynitride layer 2160 to be retained. FIG. 67 illustrates the partially completed semiconductor device after etching the silicon oxynitride layer 2160 down to the etch-stop refractory layer 2150. Thereafter, the photoresist layer 2165 is stripped as illustrated in FIG. 68.

Figure 69:
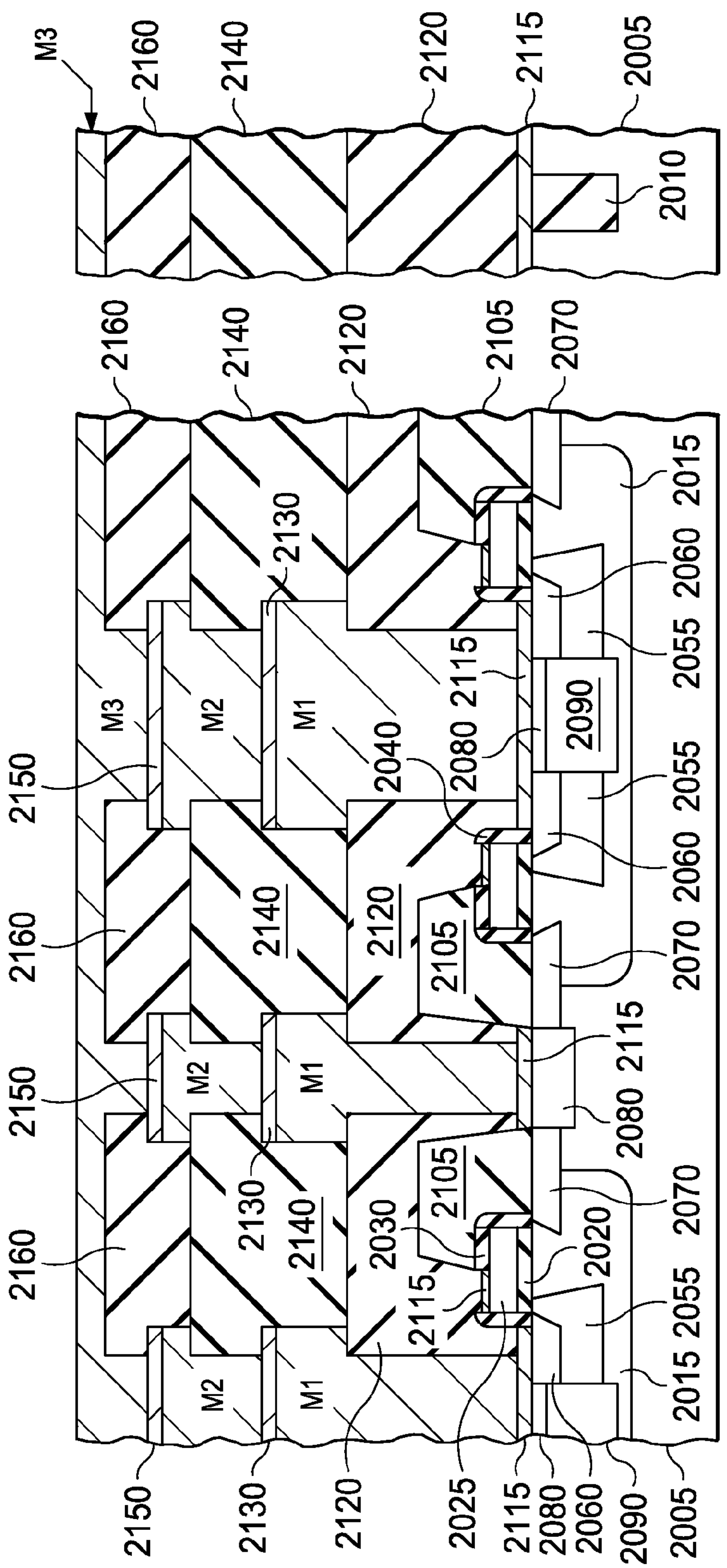
Figure 70:
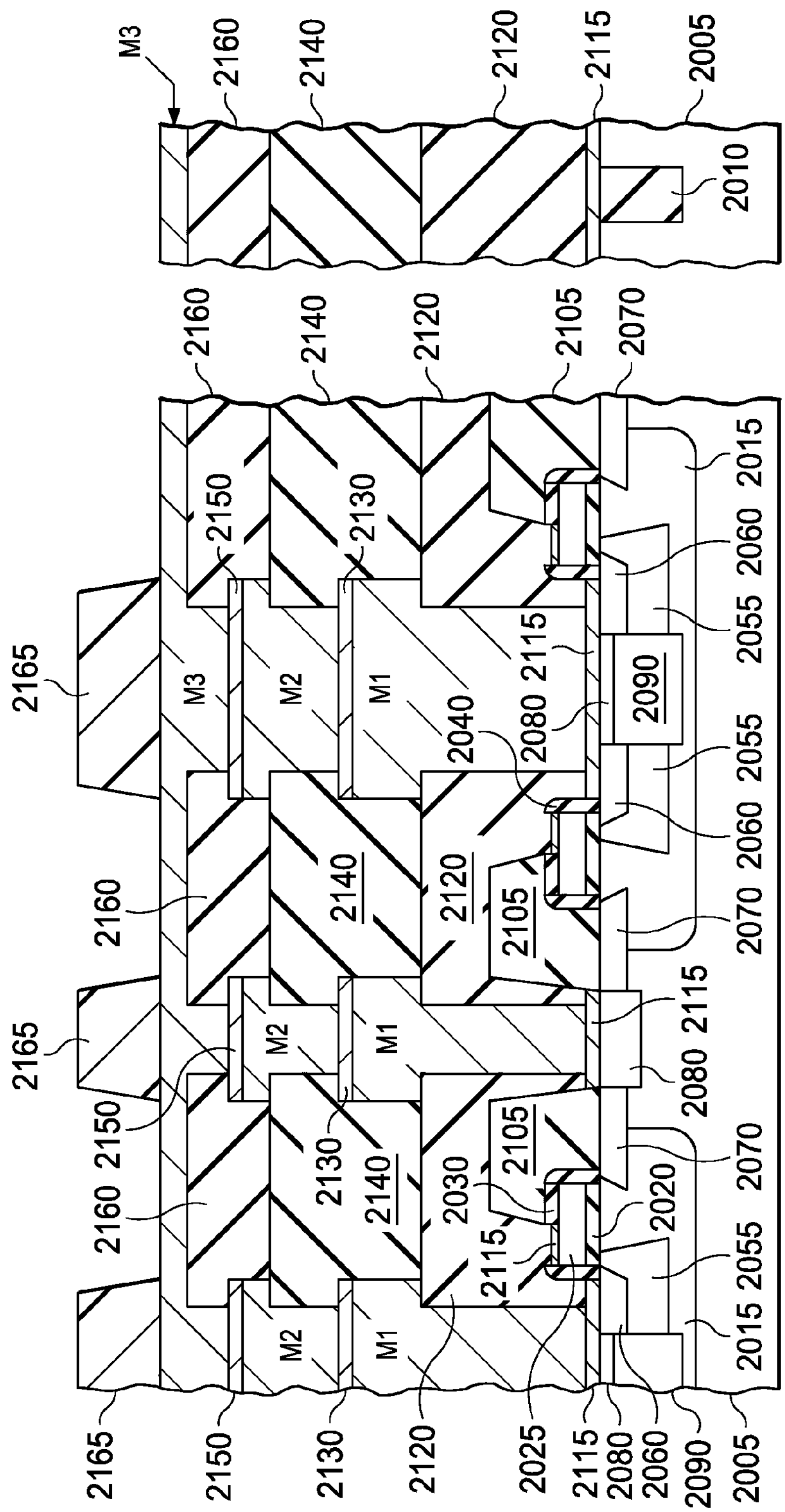
Figure 71:
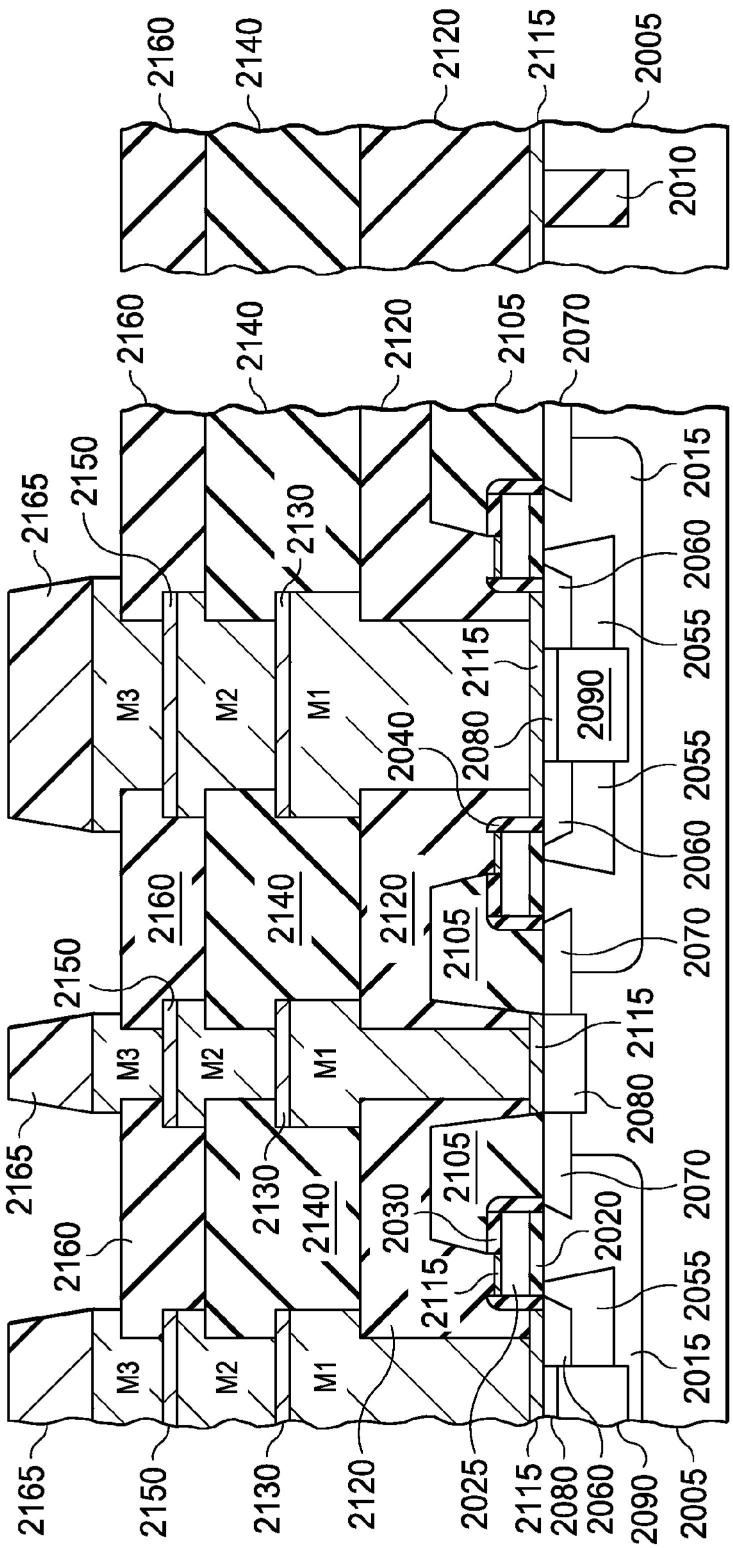
Figure 72:
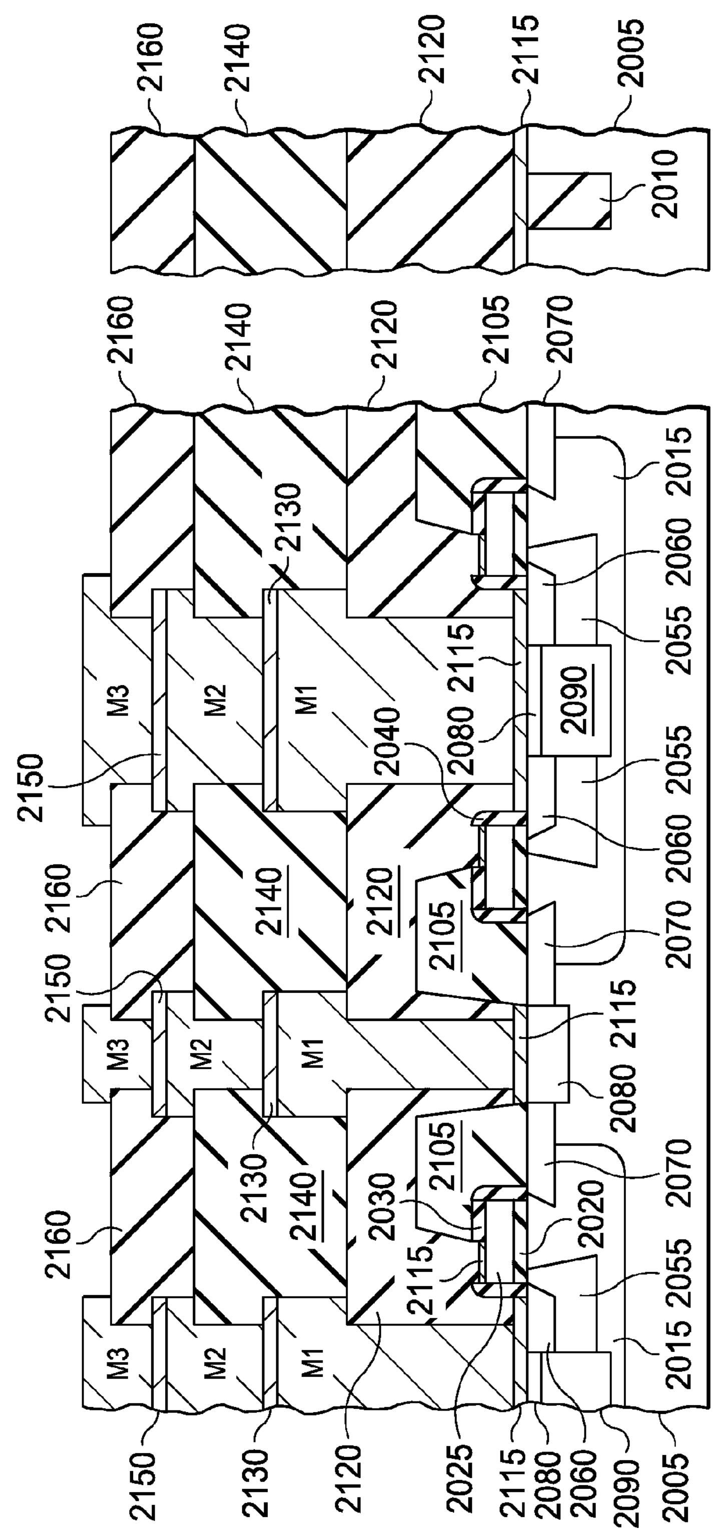

Turning now to FIG. 69, a third metallic (e.g., aluminum) layer M3 is then vacuum-deposited over the surface of the semiconductor device. As illustrated in FIG. 70, a photoresist layer 2165 is deposited and patterned to cover areas of the third metallic layer M3 to be retained. Thereafter, exposed areas of the second metallic layer M3 are removed with a suitable etch, such as an RIE, as illustrated in FIG. 71. Additionally, the remaining portions of photoresist layer 2165 are stripped, thereby exposing remaining portions of the third metallic layer M3 and the silicon oxynitride layer 2160 as illustrated in FIG. 72.

Figure 73:
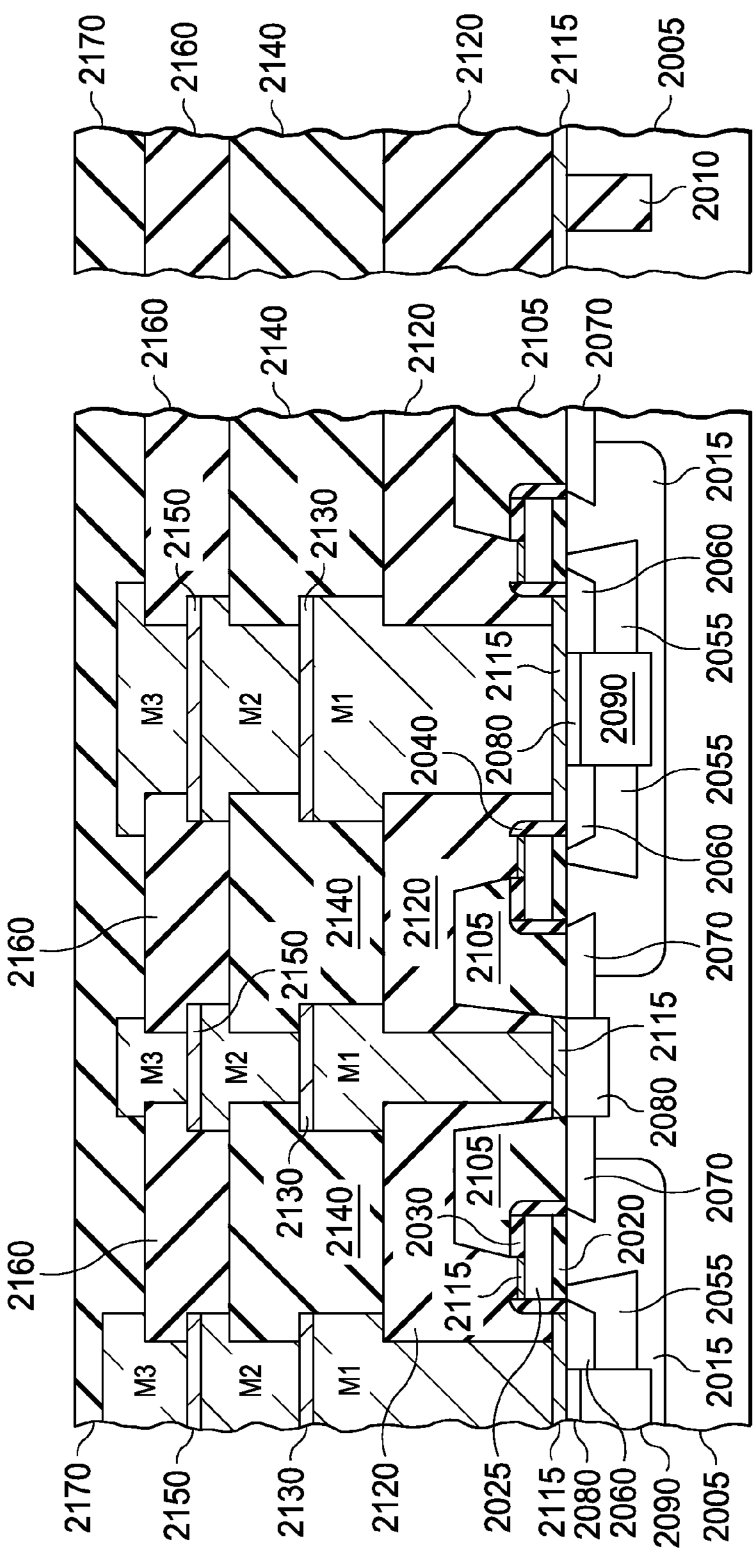
Figure 74:
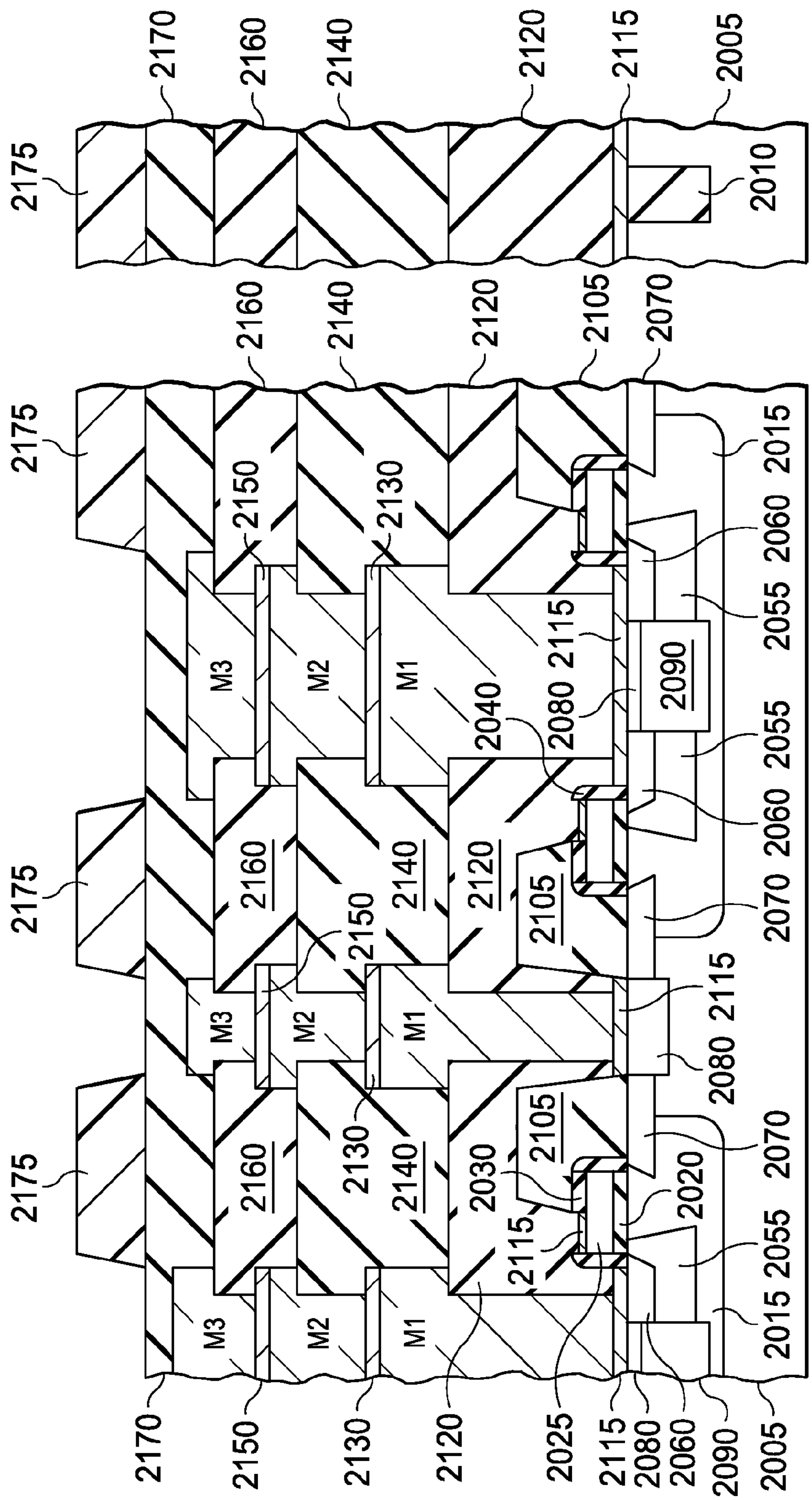
Figure 75:
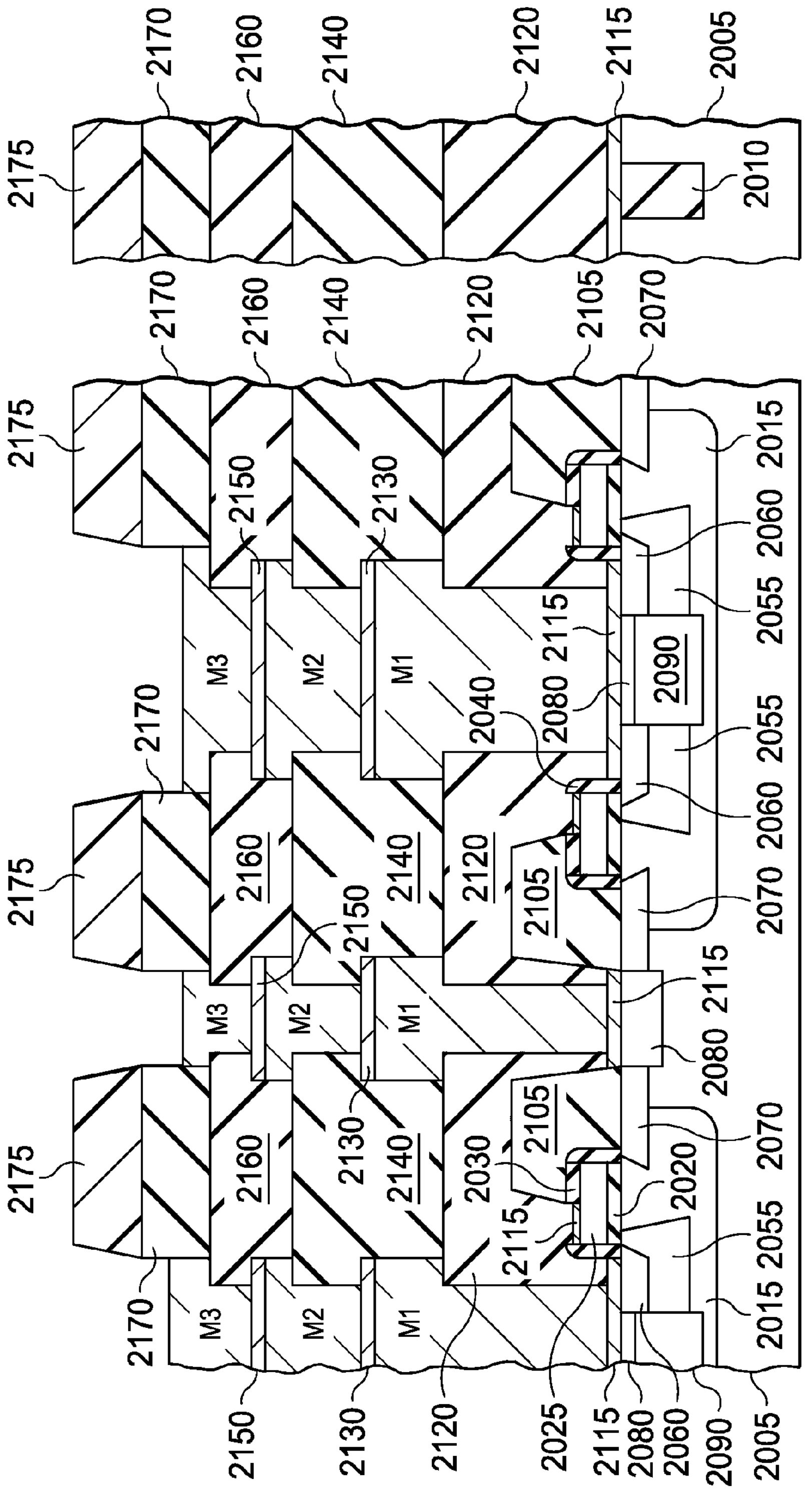
Figure 76:
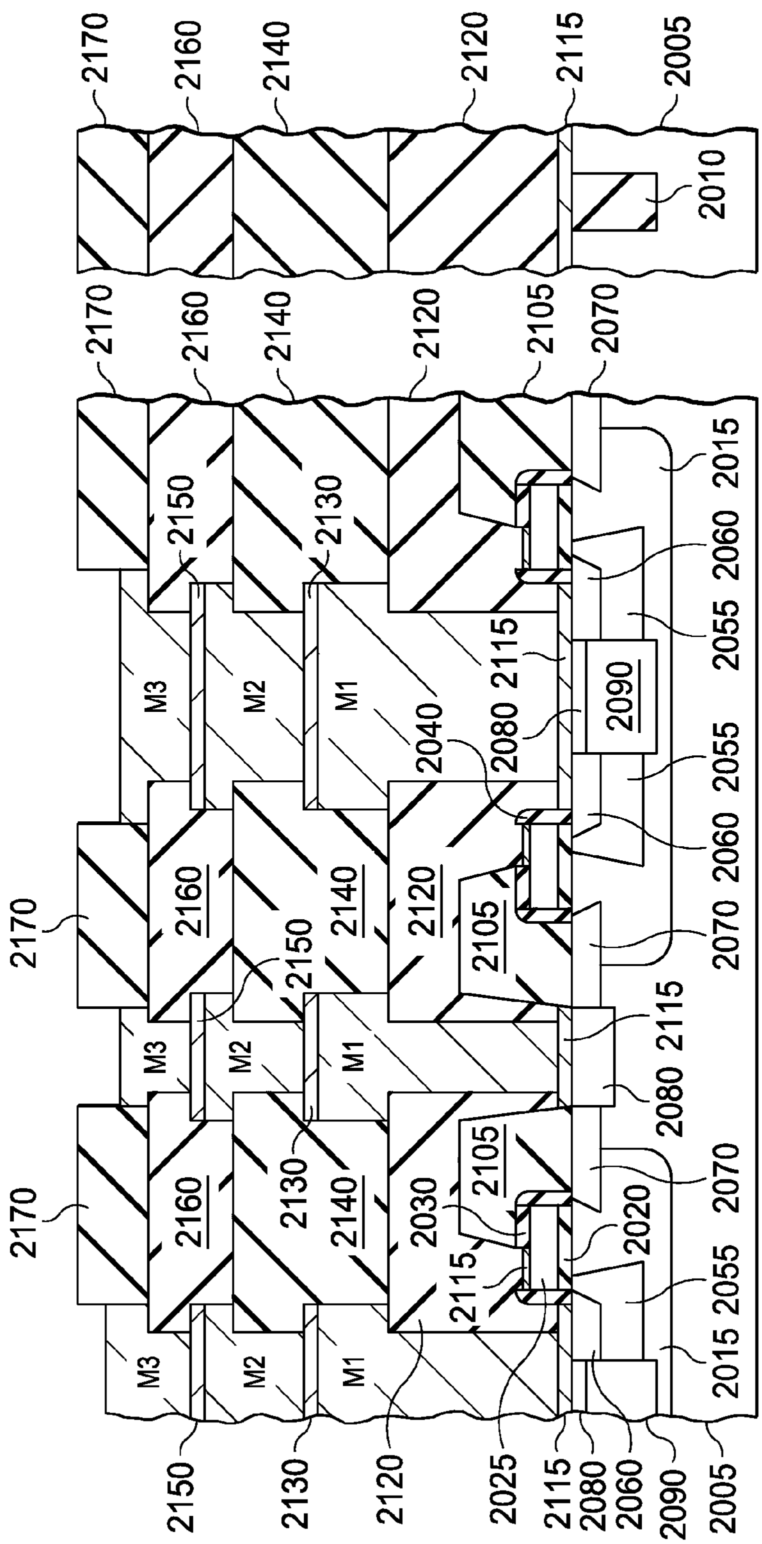

Turning now to FIG. 73, a final silicon oxynitride layer 2170 (an insulating layer) is deposited over the semiconductor device and planarized by chemical-mechanical planarization. As illustrated in FIG. 74, a photoresist layer 2175 is deposited and patterned over the silicon oxynitride layer 2170 to cover areas to be retained. Thereafter, exposed areas of the silicon oxynitride layer 2170 are removed with a suitable etch, such as an RIE, thereby exposing remaining portions of the third metallic layer M3 as illustrated in FIG. 75. Additionally, the remaining portions of the photoresist layer 2175 are stripped, thereby exposing remaining portions of the silicon oxynitride layer 2170 as illustrated in FIG. 76.

Figure 77:
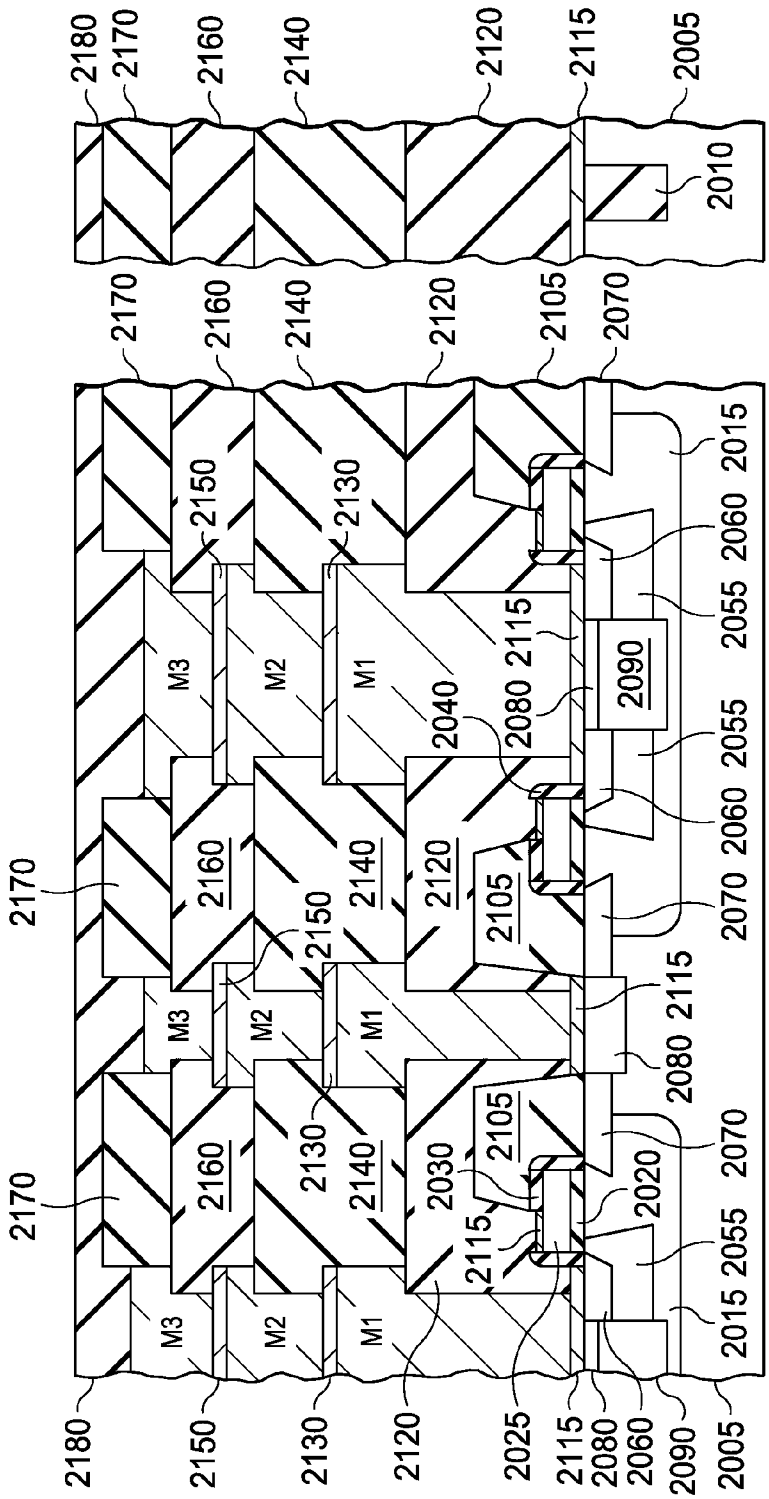
Figure 78:
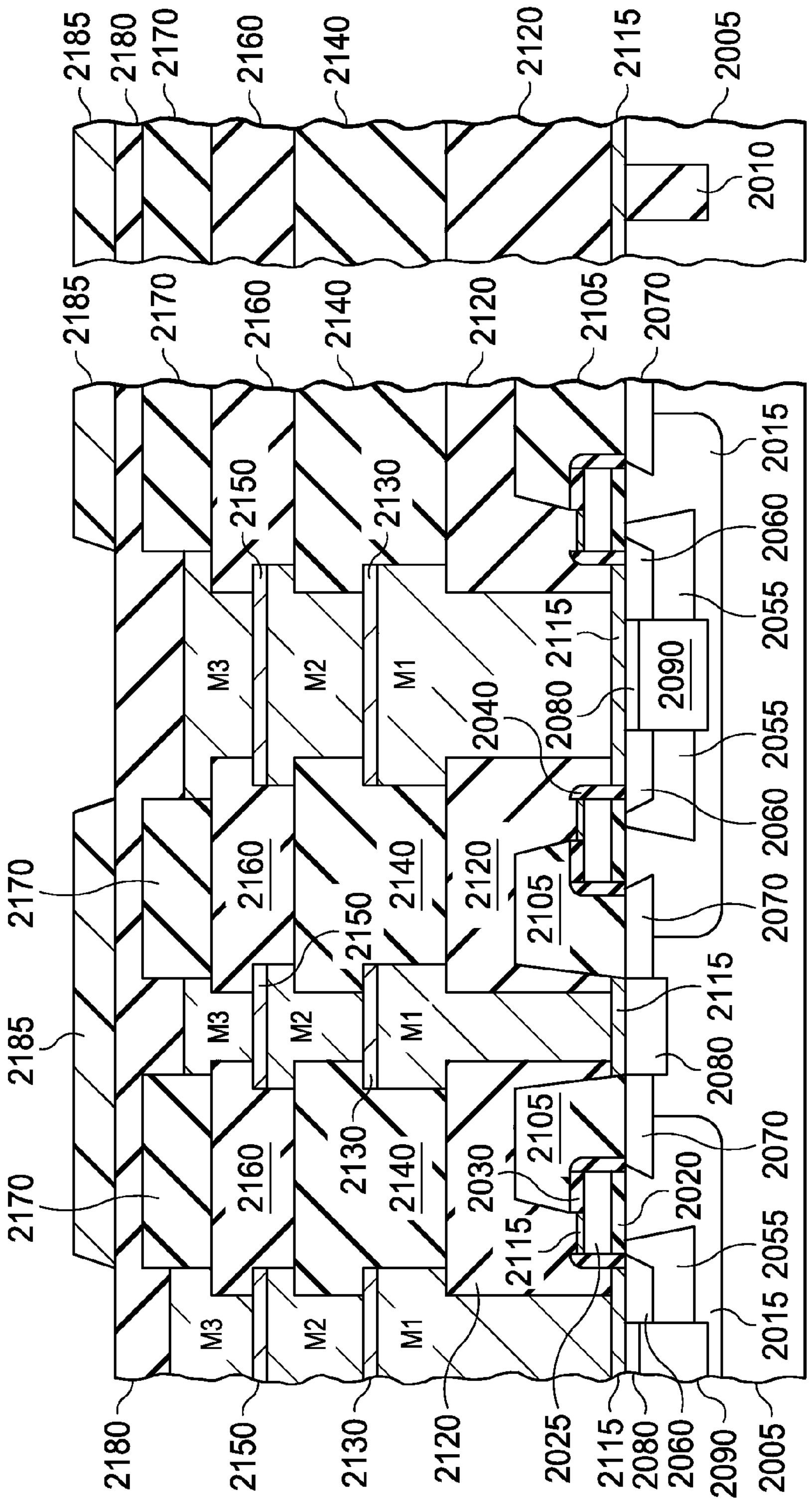
Figure 79:
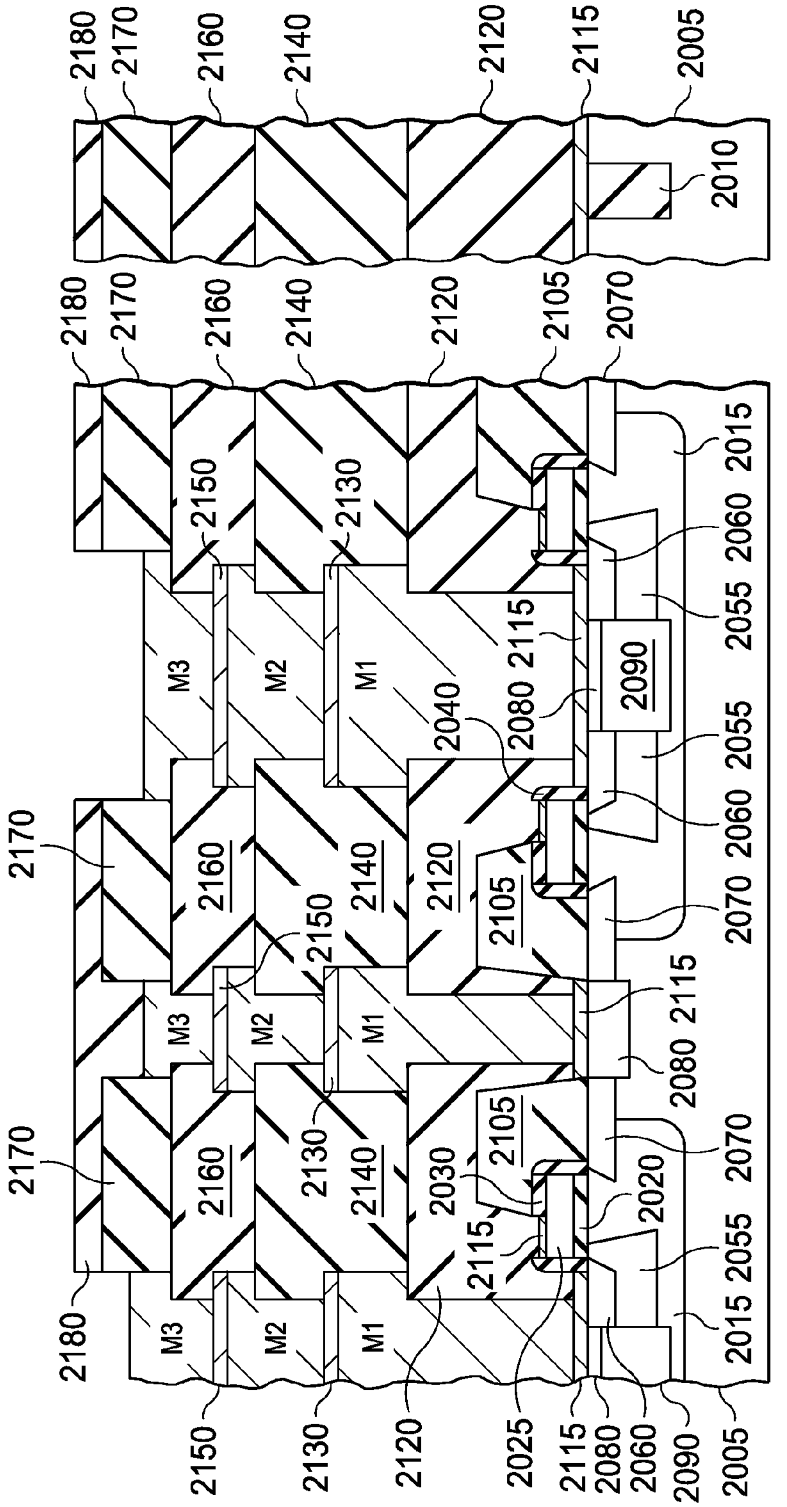

Turning now to FIG. 77, a polyimide coating 2180 (an insulating layer) is deposited over the semiconductor device. As illustrated in FIG. 78, a photoresist layer 2185 is deposited and patterned over the polyimide coating 2180 to cover areas of the third metallic layer M3 over the drains of the N-LDMOS device. Thereafter, exposed areas of the polyimide coating 2180 are removed with a suitable etch, thereby exposing remaining portions of the third metallic layer M3 above the sources of the N-LDMOS device as illustrated in FIG. 79. Additionally, the remaining portions of the photoresist layer 2185 are stripped, thereby exposing remaining portions of the polyimide coating 2180.

Figure 80:
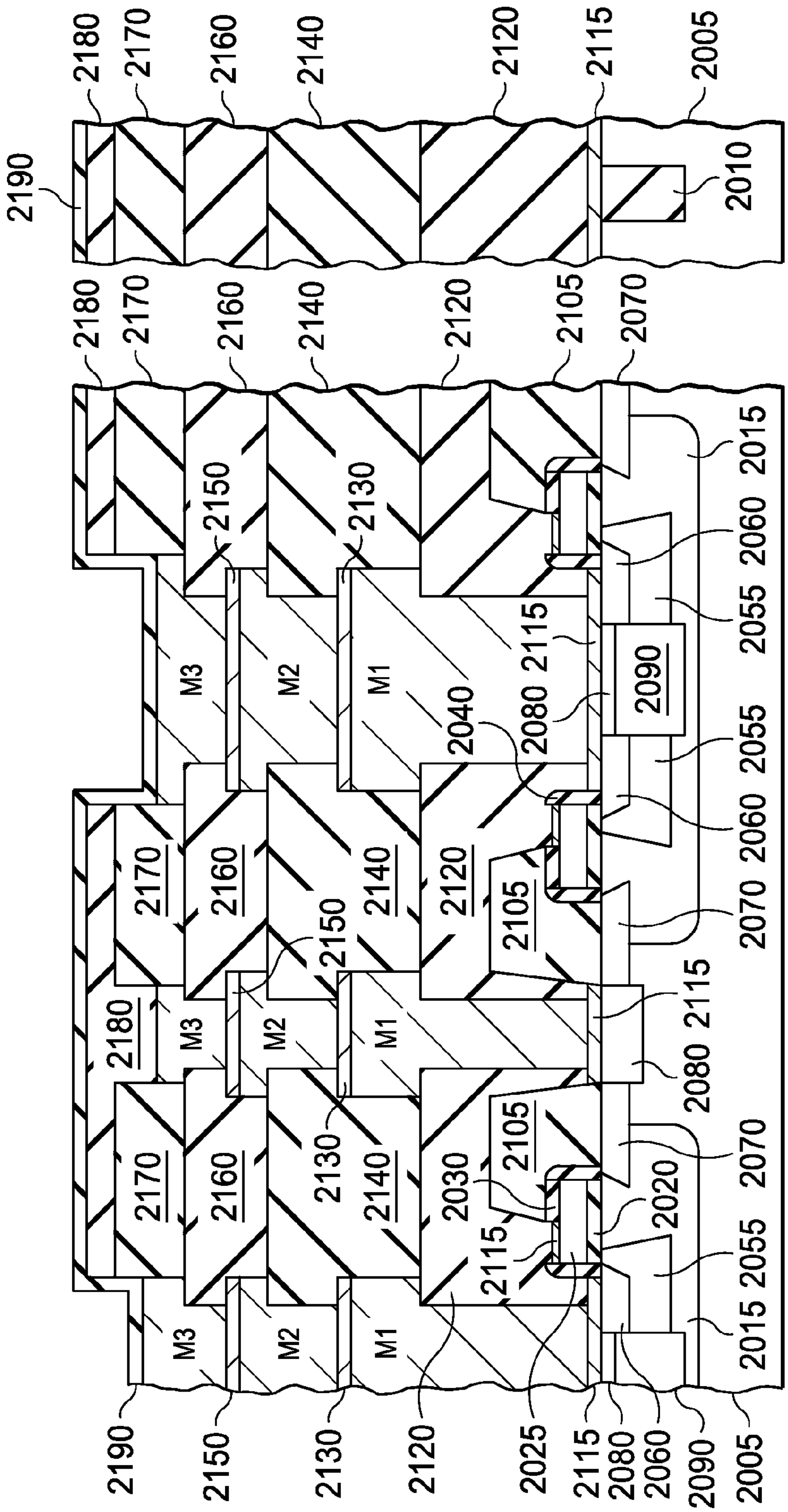
Figure 81:
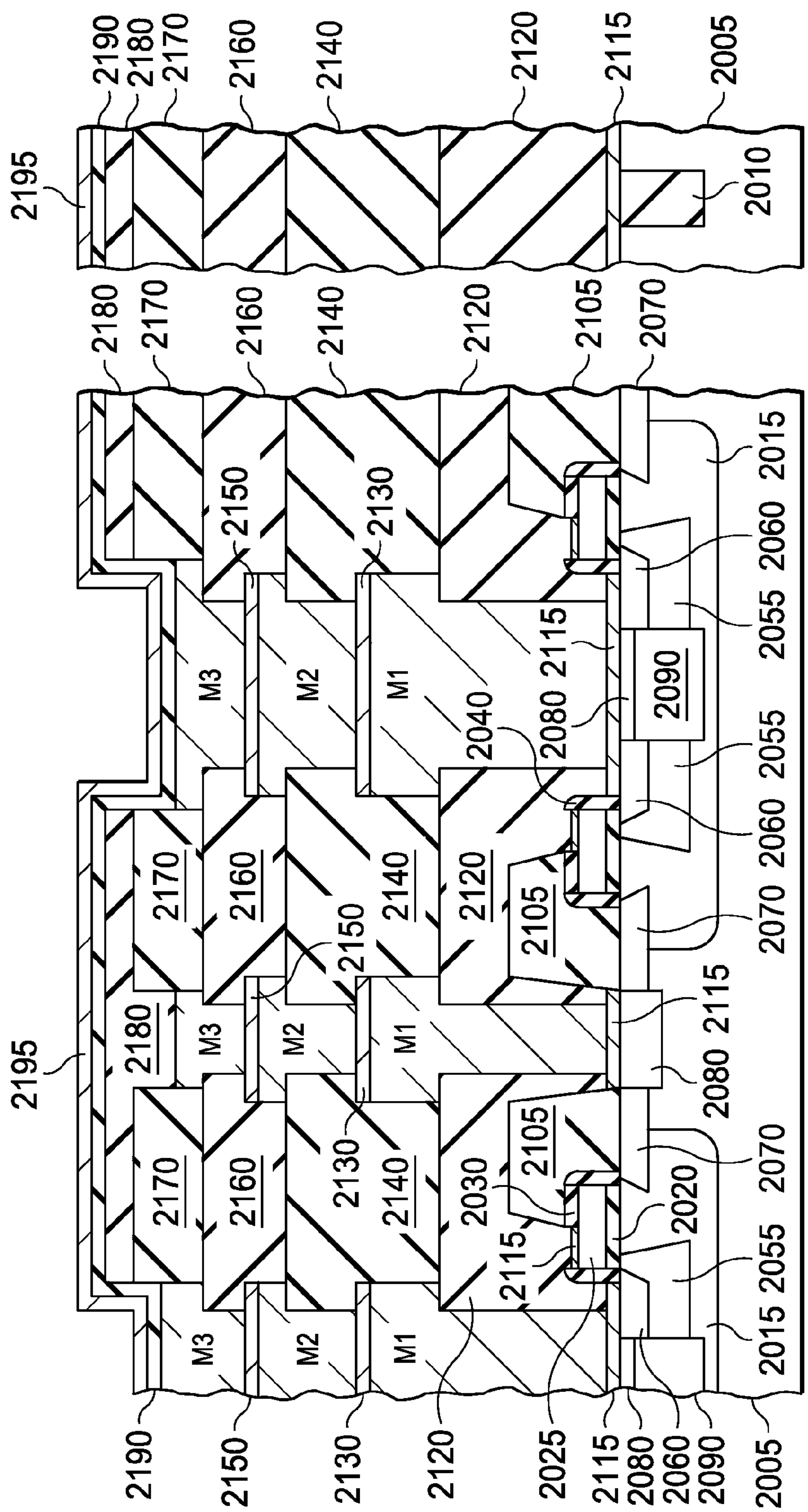
Figure 82:
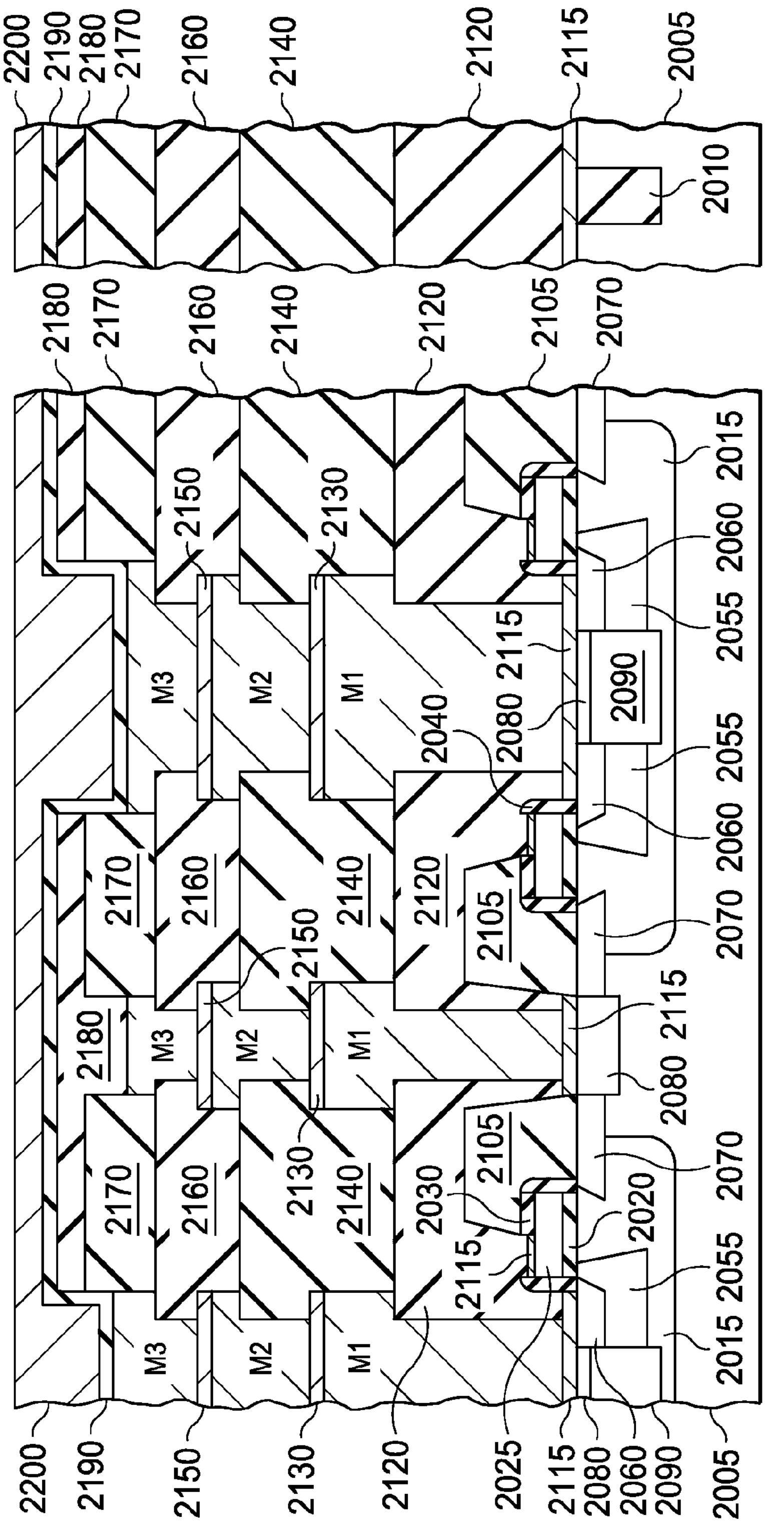
Figure 83:
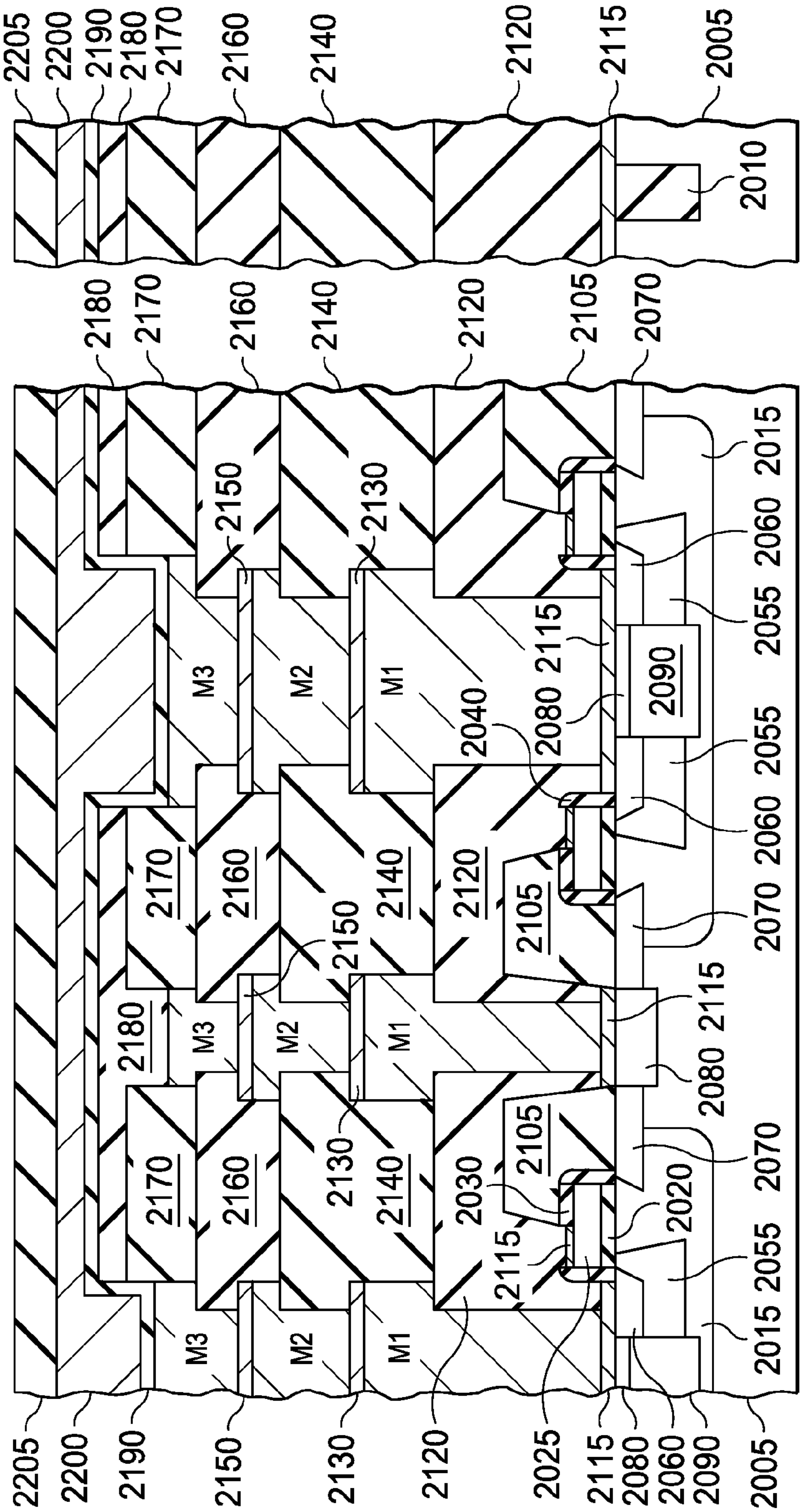

Turning now to FIG. 80, a refractory barrier layer 2190 (e.g., titanium nitride, tantalum nitride, or cobalt nitride) is deposited over the semiconductor device. A thin metallic (e.g., copper) seed layer 2195 is then deposited of over the refractory barrier layer 2190 as illustrated in FIG. 81. The copper seed layer 2195 is then electroplated to form an electroplated copper layer 2200 as illustrated in FIG. 82. Thereafter, another polyimide coating 2205 (an insulating layer) is deposited over the copper layer 2200 as illustrated in FIG. 83.

Figure 84:
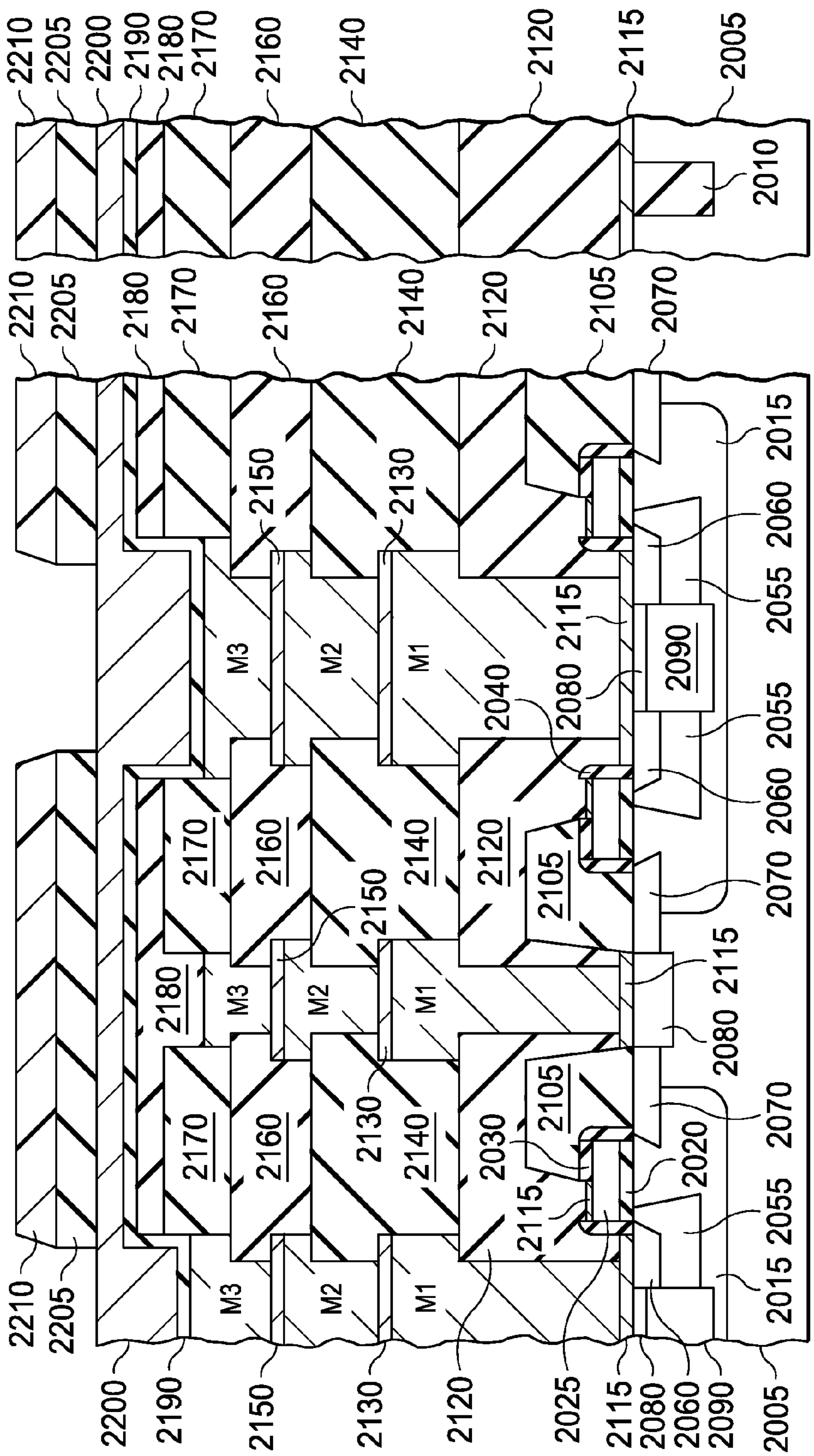
Figure 85:
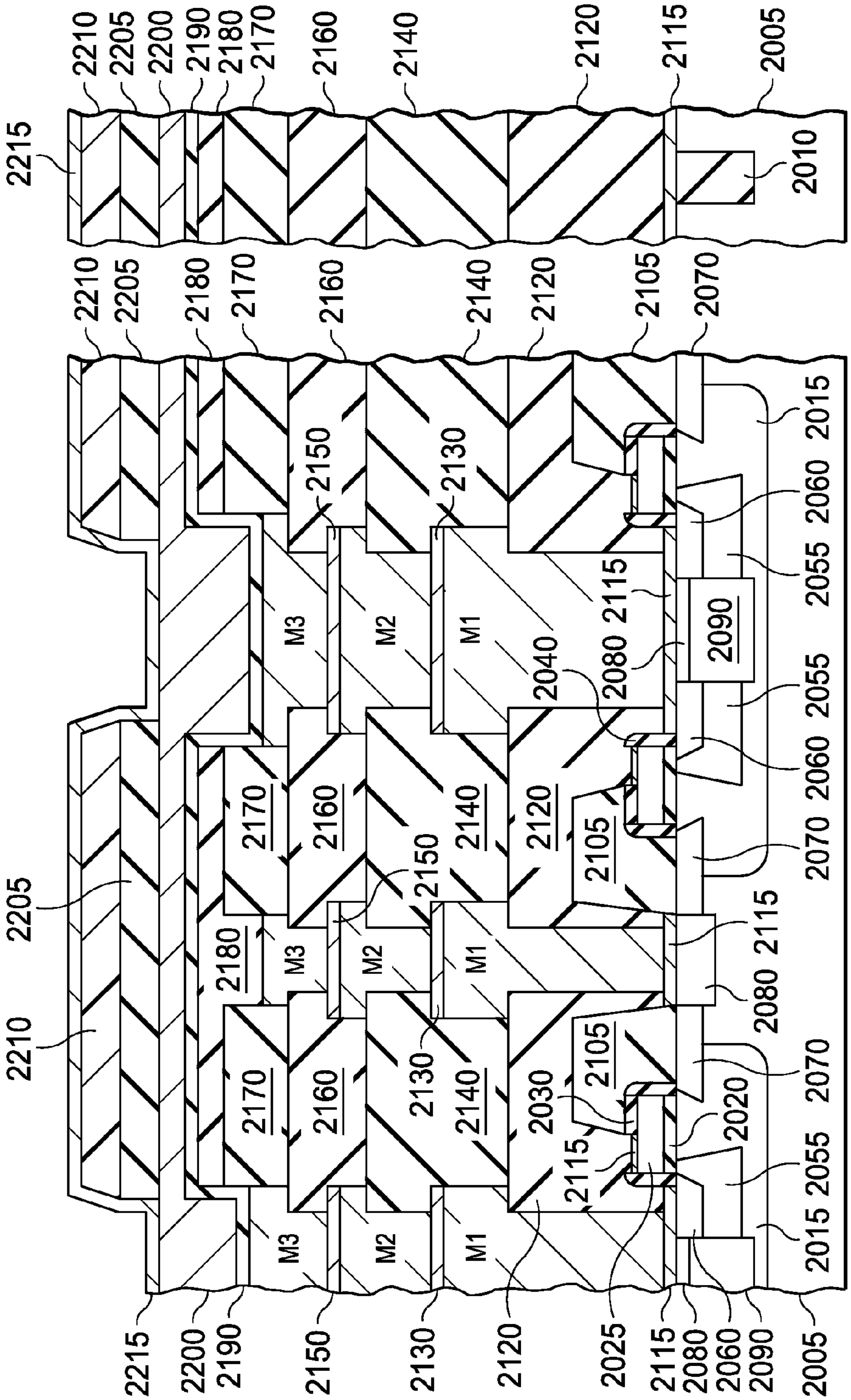
Figure 86:
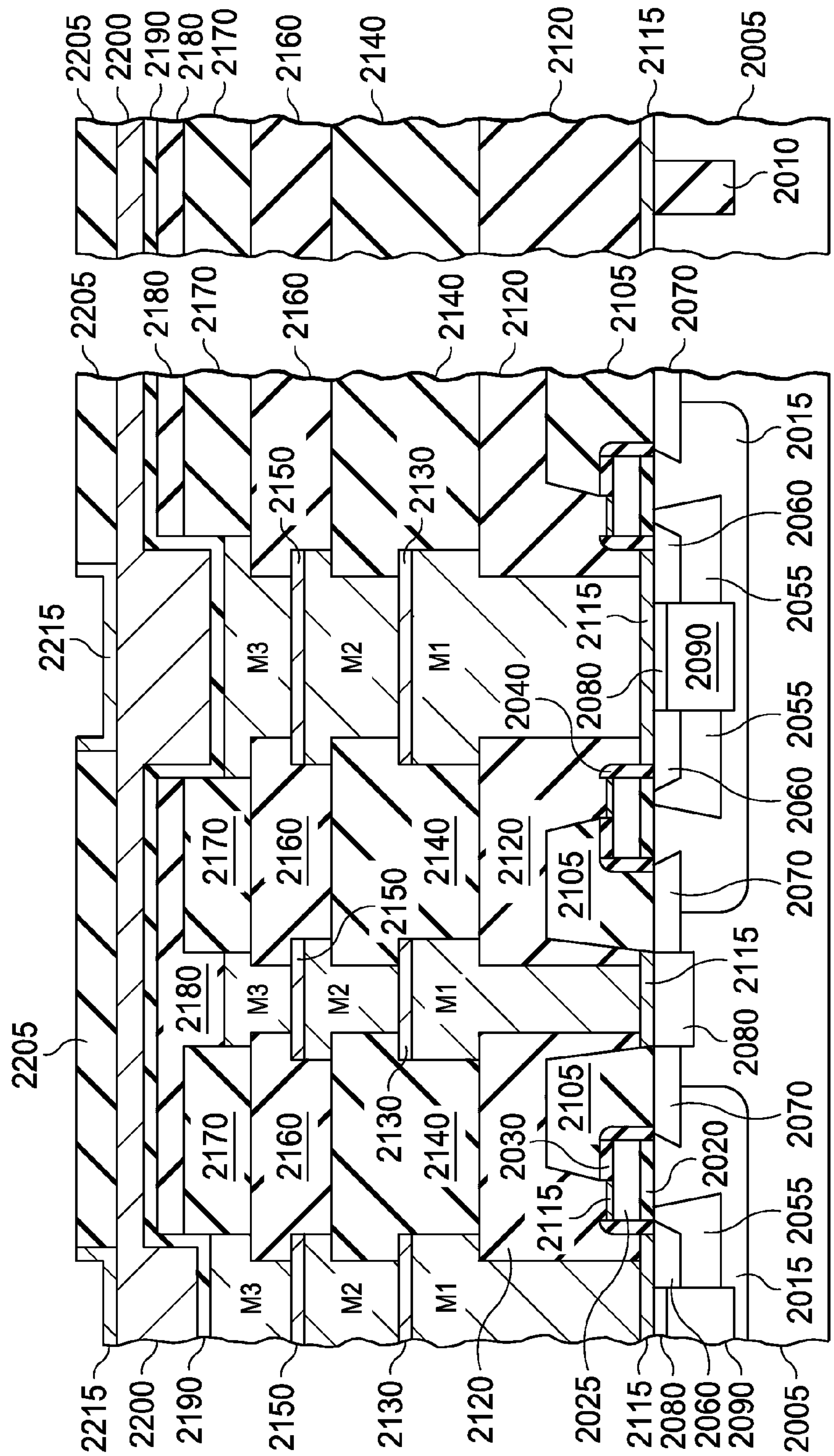

Turning now to FIG. 84, a photoresist layer 2210 is then deposited and patterned over the polyimide coating 2205. The photoresist layer 2210 is etched and the underlying polyimide coating 2205 is etched to expose the underlying copper layer 2200 over the sources of the N-LDMOS device. Thereafter, another thin metallic (e.g., copper) seed layer 2215 is deposited over the semiconductor device. Deposition of the copper seed layer 2215 is an optional step to produce a fresh surface for later electrodeposition of metallic (e.g., copper) pillars. Thereafter, the photoresist layer 2210 with the portion of the copper seed layer 2215 that overlies the photoresist layer 2210 are lifted off the semiconductor device as illustrated in FIG. 86.

Turning now to FIG. 87, metallic (e.g., copper) pillars 2220 are formed by an electroplating process employing an acid solution. The copper pillars 2220 serve as low-resistance source contacts to a conductive, patterned leadframe, traces of which terminals of the completed semiconductor device are solderably attached, as illustrated and described hereinabove with reference to FIG. 4. Corresponding steps can be employed in conjunction with the steps described hereinabove for construction of the source contacts to form low-resistance drain contacts for the N-LDMOS device. Additionally, an encapsulant (e.g., an epoxy) 2225 can be selectively deposited between the copper pillars 2220 and a patterned leadframe 2230 placed thereabove to create external contacts for a packaged semiconductor device (see, e.g., FIG. 18).

Figure 88:
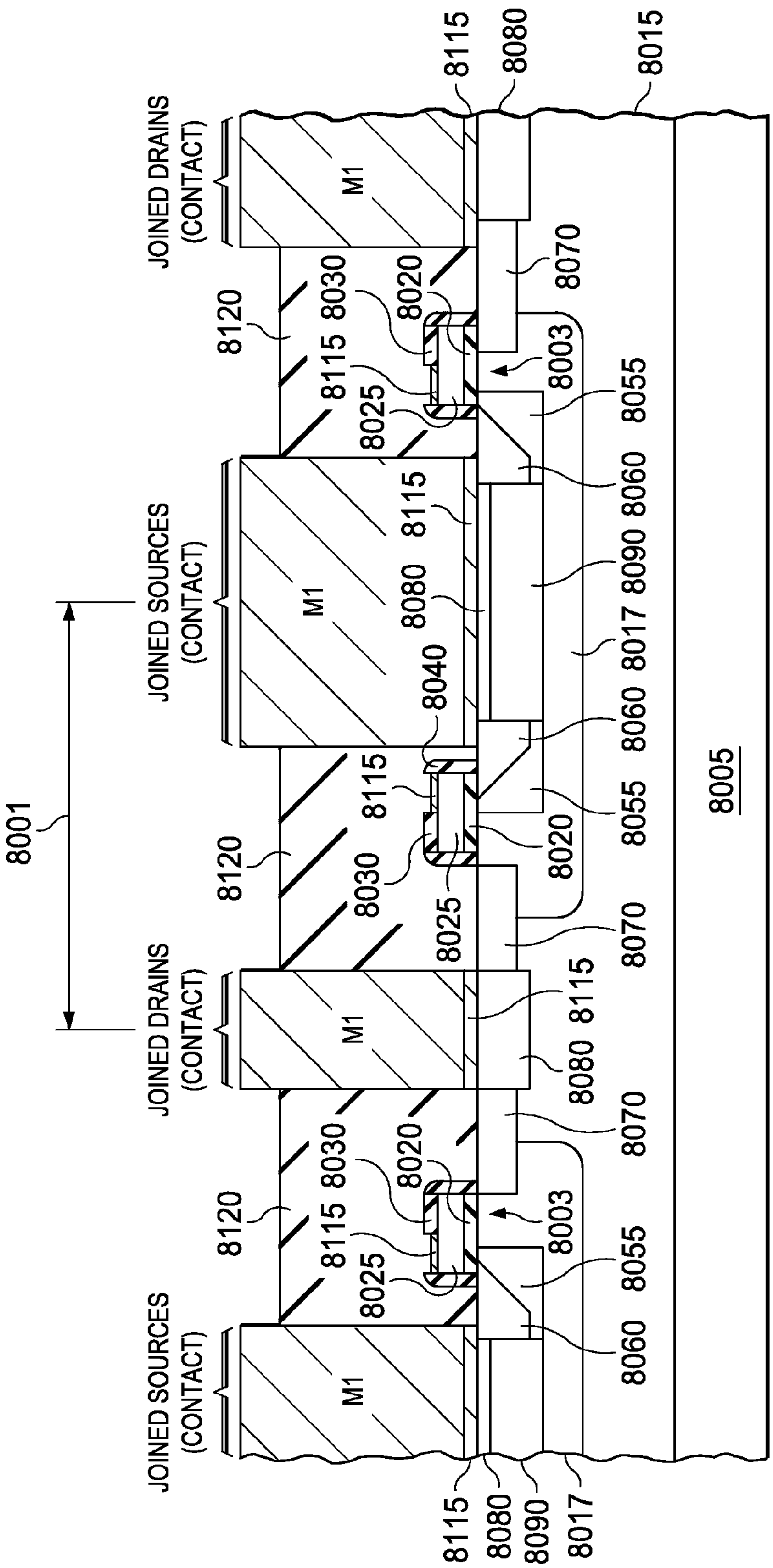
FIG. 88 illustrates a cross-sectional view of an embodiment of a P-LDMOS device embodied in a semiconductor device, or portions thereof.

Turning now to FIG. 88, illustrated is a cross-sectional view of an embodiment of a P-LDMOS device embodied in a semiconductor device, or portions thereof. While some of the layers of the P-LDMOS device will be introduced with respect to FIG. 88, a more detailed explanation of the layers will be described with respect to FIG. 89. Additionally, since many of the processing steps to build the semiconductor device including the P-LDMOS device are similar to the processing steps to build the semiconductor device including the N-LDMOS device set forth above, the discussion that follows will be limited to the layers that form P-LDMOS device.

The P-LDMOS device is formed in a semiconductor die including a P-doped semiconductor substrate (also referred to as a "substrate") 8005 and, on a surface thereof, an optional epitaxial layer can be grown (e.g., a lightly doped P-type epitaxial layer, not shown). Although in the illustrated embodiment the substrate 8005 is a P-type substrate, one skilled in the art understands that the substrate 8005 could be an N-type substrate without departing from the scope of the present invention.

The P-LDMOS device is formed of a plurality of P-LDMOS cells, such as P-LDMOS cell 8001 illustrated in FIG. 88. The P-LDMOS device includes a lightly doped N-type well 8015 with N-type wells 8017 formed thereover. Within the N-type wells 8017 are heavily doped N-type regions 8090 formed therein. Heavily doped P-type regions 8060, 8080 are formed on either side of or above the heavily doped N-type regions 8090. The heavily doped P-type regions 8060 are formed with a lower doping density than the heavily doped P-type regions 8080, particularly in a lateral direction away from the heavily doped P-type region 8080. The heavily doped P-type regions 8060, 8080 provide an ohmic junction through a silicide layer 8115 formed thereover. The silicide layer 8115 provides a heavily conductive junction between the heavily doped P-type regions 8060, 8080 and a first metallic (e.g., aluminum) layer M1 to ultimately provide source contacts (designated "joined sources (contact)") for the P-LDMOS device. The heavily doped P-type region 8080 that lies over the heavily doped N-type region 8090 is thin (e.g., about 10 to 100 Å) so that the resulting P-N junction that is thereby formed between the heavily doped P-type region 8080 and the heavily doped N-type region 8090 will be substantially an ohmic junction highly conductive in both directions. Accordingly, the P-N junction formed therebetween will not be operable as a diode. Similarly, the silicide layer 8115 provides a heavily conductive junction between the heavily doped P-type regions 8080 and the first metallic layer M1 to ultimately provide drain contacts (designated "joined drains (contact)") for the P-LDMOS device. The first metallic layers M1 for the sources and drains are separated by insulating layers such as an amorphous silicon oxynitride ("$Si_xO_yN_z$") layers 8120.

N-type regions 8055 are formed adjacent to the heavily doped P-type regions 2060 and the heavily doped N-type regions 8090 within the N-type wells 8017. Channel regions 8003 are formed under the gates between the heavily doped P-type regions 8060 and lightly doped P-type regions 8070. The N-type regions 8055 are formed in the N-type wells 8017 by ion injection at an angle off vertical under the gates that will be formed above the channel regions 8003 and are used to control a threshold voltage of the P-LDMOS device.

The gates are formed with gate polysilicon layers 8025 with underlying and overlying gate oxide layers 8020, 8030 and sidewall spacers (one of which is designated 8040) thereabout. The gate polysilicon layers 8025 above the channel regions 8003 control a level of conductivity therein. The underlying gate oxide layers 8020 form an isolation layer between the gate polysilicon layers 8025 and the N-type wells 8017 and the N-type regions 8055. A portion of the overlying gate oxide layers 8030 is removed over the gate polysilicon layers 8025 and a silicide layer 8115 is formed thereover to reduce gate resistance.

Thus, the gate polysilicon layers 8025 (with the silicide layers 8115) form gate polysilicon strips across many P-LDMOS cells of the P-LDMOS device and are coupled to gate metallic strips 1131 in the first metallic layer M1 (see, e.g., FIG. 16). The gate metallic strips 1131 are routed to a plurality of gate drivers located at the periphery of the semiconductor device (see, e.g., FIG. 16). A substantially time-aligned switching signal to the gates of the P-LDMOS cells is thereby enabled by coupling the gate metallic strips 1131 in the first metallic layer M1, which have a substantially greater electrical conductivity than the gate polysilicon strips to the plurality of gate drivers.

Providing a time-aligned switching signal to the plurality of gates of individual P-LDMOS cells is an important design consideration in view of substantial effective capacitance that is created between the gates and the sources and drains, which requires a substantial gate-drive current to achieve a rapid switching transition. Failure to produce a temporally-aligned gate-drive signal to the gates of the individual P-LDMOS cells can enable some of the P-LDMOS cells to be turned on before others, which forces the early-switched cells to conduct high-current pulses during the temporally misaligned switching transitions. Temporally misaligned high-current pulses expose the P-LDMOS cells to device failure.

The illustrated structures also enable N-LDMOS and P-LDMOS devices to be formed with substantially the same structure in a common semiconductor die, and enable each LDMOS type to be coupled with a low-inductance, high-current path to an external circuit. Each LDMOS is formed with a single, large, source contact, and both with a single, large, and shared drain contact (see, e.g., FIG. 17), which can simplify circuit board layout and attachment issues to an external circuit. The large source and drain contacts are readily overlaid with a copper redistribution layer of substantially the same footprint as the large source and drain contacts (see, e.g., FIG. 17B), and ultimately a leadframe (see, e.g., FIG. 17D), which provides further improvement in conductivity and coupling a packaged semiconductor device (see, e.g., FIG. 18) to an external circuit. The source contacts and the shared drain contacts overlie substantially the entire active area of the N-LDMOS and P-LDMOS devices, with little die area wasted by high current contacts that do not overlie active switching areas.

With respect to the P-LDMOS cell 8001, the source (or source region) is embodied in at least the heavily doped P-type region 8060 and the drain (or drain region) is embodied in the lightly doped P-type region 8070 (e.g., a lightly doped drain ("LDD") region) and an adjacent heavily doped P-type region 8080 opposite the channel region 8003. The gate resides above the channel region 8003 with the layers as introduced above. The LDD region provides a higher breakdown voltage for the P-LDMOS devices over conventional designs. These regions are formed in the sequence "heavily doped source region," "gate," "lightly doped drain region," and "heavily doped drain region."

Figure 89:
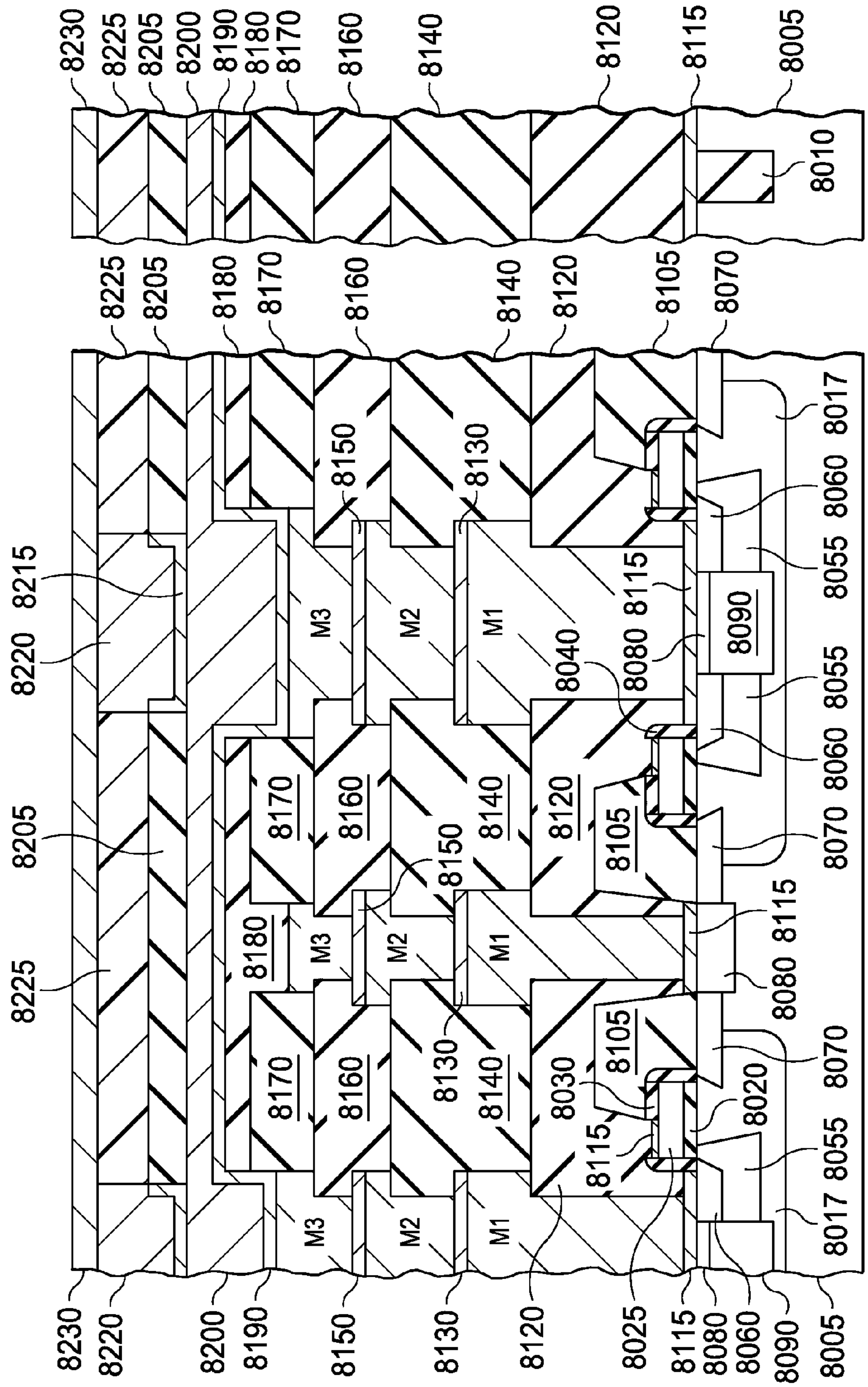
FIG. 89 illustrates a cross-sectional view of an embodiment of a P-LDMOS device embodied in a semiconductor device, or portions thereof.

Turning now to FIG. 89, illustrated is a cross-sectional view of an embodiment of a P-LDMOS device embodied in a semiconductor device, or portions thereof. The P-LDMOS device is formed in a semiconductor die including a P-doped semiconductor substrate (also referred to as a "substrate") 8005 and, on a surface thereof, an optional epitaxial layer can be grown (e.g., a lightly doped P-type epitaxial layer, not shown). The substrate 8005 is preferably lightly P-doped (e.g., with boron) between about $1\cdot10^{14}$ and $1\cdot10^{16}$ atoms/cm$^3$. The optional epitaxial layer grown on the substrate 8005 may not be needed, particularly if the substrate 8005 is a lightly doped P-type substrate. Although in the illustrated embodiment the substrate 8005 is a P-type substrate, one skilled in the art understands that the substrate 8005 could be an N-type substrate without departing from the scope of the present invention.

The substrate 8005 is formed with isolation regions (e.g., shallow trench isolation regions 8010). The shallow trench isolation regions 8010 may also be formed within a substrate or within an epitaxial layer grown thereon to provide dielectric isolation between devices implemented on the substrate or on the epitaxial layer. The shallow trench isolation regions 8010 are formed by applying, patterning, and etching the substrate 8005 with a photoresist to define the respective regions therein. An example photoresist is an AZ Electronic Materials photoresist. The shallow trench isolation regions 8010 are then etched and backfilled with a dielectric such as silicon dioxide, silicon nitride, a combination thereof, or any other suitable dielectric material. Then the epitaxial layer of the substrate 8005 and the shallow trench isolation regions 8010 are planarized by a lapping process such as a chemical-mechanical planarization ("CMP") lapping process to planarize the device while limiting surface damage to the die. The steps of masking, etching, backfilling with dielectric, and lapping are well known in the art and will not hereinafter be described in further detail.

The P-type substrate 8005 is divided into dielectrically separated areas by the shallow trench isolation regions 8010 to accommodate in the illustrated embodiment a plurality of N-LDMOS and P-LDMOS devices as well as gate drivers and other PMOS and NMOS devices embedded in control circuits located thereon that operate as low-voltage devices. The low-voltage devices are operable within, for instance, a controller of a power converter (e.g., within control and signal-processing devices that may be formed on a surface of the semiconductor device). Additionally, the P-type substrate 8005 can accommodate the N-LDMOS and P-LDMOS devices that operate as higher voltage devices within, for instance, a power train, as well as a driver of a power converter (i.e., power switches and driver switches).

A lightly doped N-type well 8015 is formed by applying and patterning a photoresist mask (not shown), followed by etching of the photoresist mask to define regions to be occupied by the lightly doped N-type well 8015. An example photoresist is AZ Electronic Materials photoresist. The steps of patterning and etching to define horizontal dimensions of the lightly doped N-type well 8015 are well known in the art and will not hereinafter be described in further detail. The lightly doped N-type well 8015 is formed by an ion-implantation process (e.g., at a controlled energy of about 100 to 300 keV) of an appropriate N-type dopant specie such as arsenic, and results in a light doping concentration profile preferably in a range of about $1\cdot10^{14}$ to $1\cdot10^{16}$ atoms/cm$^3$.

N-type wells 8017 are formed in the lightly doped N-type well 8015 by applying and patterning a photoresist mask (not shown), followed by etching of the mask to define regions to be occupied by the N-type wells 8017. The N-type wells 8017 are formed by an ion-implantation process (e.g., at a controlled energy of about 100 to 300 keV) of an appropriate N-type dopant specie such as phosphorus, and results in a doping concentration profile preferably in a range of about $1\cdot10^{17}$ to $2\cdot10^{19}$ atoms/cm$^3$.

The gates are formed above a gate oxide layer 8020 (an insulating layer) is formed over the surface of the semiconductor device of a thickness consistent with the intended operating voltage of the gates. The gate oxide layer 8020 is typically silicon dioxide, for instance, formed by placing the wafer on which the silicon device is being formed in an oven and reacting the exposed surface of the wafer with oxygen or other suitable material (such as to produce a high-κ (dielectric constant) stack) for 10 to 100 minutes at 500 to 900° C.) with a thickness of about 30 to 50 Angstroms ("Å") for devices employing about 0.25-micrometer ("μm") feature sizes and operating at low gate voltages (e.g., 2.5 volts). Assuming the gate-to-source voltage limit of the N-LDMOS and P-LDMOS devices is limited to a voltage (e.g., of about 2.5 volts), then the gate oxide layer 8020 can be formed with a gate dielectric layer thickness as set forth above. Preferably, the gate oxide layer 8020 is constructed with a uniform thickness to provide a gate-to-source voltage rating for the devices of approximately 2.5 volts that completely or nearly completely saturates the forward-conduction properties of the device. Of course, the aforementioned gate voltage ranges for the devices are provided for illustrative purposes only, and other voltage ranges are contemplated within the broad scope of the present invention.

The gates include a gate polysilicon layer 8025 deposited over a surface of the gate oxide layer 8020 and is doped N-type (or P-type) in a later processing step to obtain a suitable level of conductivity using an appropriate doping specie such as arsenic with a doping density in a range of about $1\cdot10^{19}$ to $5\cdot10^{20}$. The gate polysilicon layer 8025 is annealed in an oven at an elevated temperature (e.g., at a temperature of 800 to 1000 degrees Celsius ("° C.") for 2 to 60 minutes) to properly diffuse and activate the dopant. The gate polysilicon layer 8025 may have a range of thicknesses that may range from about 100 to about 500 nanometers, but may be even smaller or larger depending on an application.

The gates are formed with an overlying gate oxide layer 8030 (an insulating layer) is formed over an upper surface of the gate polysilicon layer 8025 by placing the wafer on which the silicon device is being formed in an oven and reacting the exposed surface of the gate polysilicon layer 8025 with oxygen at an elevated temperature (e.g., at a temperature of 500-900° C. for 1 to 60 minutes). The overlying gate oxide layer 8030 can be formed with a thickness of about 50 to 500 Å.

The gate oxide layer 8020, the gate polysilicon layer 8025, and the overlying gate oxide layer 8030 are patterned and etched to define and form horizontal dimensions therefor. A photoresist mask is employed with an etch to define the lateral dimensions of the gate polysilicon layer 8025, and the gate oxide layer 8020 and the overlying gate oxide layer 8030. Only one of the gates is designated with the reference numbers for the gate polysilicon layer 8025 and the gate oxide layers 8020, 8030 in the FIG. 89. An example photoresist is AZ Electronic Materials photoresist. The steps of patterning and etching to define and form horizontal dimensions of the gate polysilicon layer 8025 and the gate oxide layers 8020, 8030 are well known in the art and will not hereinafter be described in further detail. In an alternative embodiment, the gate polysilicon layer 8025 can include or otherwise be formed with a wide range of materials including various metals, other doped semiconductors, or other conductive materials. It is noted that the horizontal dimensions of the gate polysilicon layer 8025 and the gate oxide layers 8020, 8030 as well as a number of other structures for both a N-LDMOS and P-LDMOS devices formed on the same silicon can be masked and etched in the same processing steps. Additionally, sidewall spacers (one of which is designated 8040) are formed from an insulating layer such as silicon nitride adjacent to the gate polysilicon layer 8025 and the underlying and overlying oxide layers 8020, 8030 in a self-aligned process without the need to mask and etch a photoresist. It should be noted that a portion (about half a gate width, which is about 0.2 μm) of the overlying gate oxide layer 8030 is removed above the gate polysilicon layer 8025.

Within the N-type wells 8017 are heavily doped N-type regions 8090 formed with ion implantation of, for instance, arsenic. In an embodiment, the heavily doped N-type regions 8090 are doped to a density of about $1\cdot10^{19}$ to $5\cdot10^{20}$ atoms/cm$^{-3}$, and are implanted at a controlled energy of 5 to 50 keV. About the heavily doped N-type regions 8090 are N-type regions 8055 that are ion-implanted with a suitable atomic species such as phosphorus to achieve a usable gate threshold voltage for the P-LDMOS device that is being formed. The N-type regions 8055 have a doping concentration profile in the range of about $5\cdot10^{17}$ to $1\cdot10^{19}$ atoms/cm$^3$ and are implanted at a controlled energy of about 20 to 100 keV. Above the N-type regions 8055 are heavily doped P-type regions 8060 of P-type ions (e.g., boron). The heavily doped P-type regions 8060 are implanted (e.g., at a controlled energy of about 5 to 50 keV) with a doping concentration profile preferably in a range of $5\cdot10^{18}$ to $1\cdot10^{20}$ atoms/cm$^3$ to achieve a low source resistance for the P-LDMOS device that is being formed.

Above the heavily doped N-type regions 8090 (and within other locations within the lightly doped N-type well 8015) are heavily doped P-type regions 8080 doped, for instance, with boron to a density in a range of about $1\cdot10^{19}$ to $5\cdot10^{20}$ atoms/cm$^{-3}$, and implanted at a controlled energy of 10 to 100 keV. The heavily doped P-type regions 8080 above the heavily doped N-type regions 8090 are relatively thin (e.g., about 10 to 100 Å). Also, the gate polysilicon layer 8025 is similarly doped P-type with boron with a doping density in a range of about $1\cdot10^{19}$ to $5\cdot10^{20}$ to obtain a suitable level of gate conductivity. About the heavily doped P-type regions 8080 (located within the lightly doped N-type well 8015) are lightly doped P-type regions 8070 doped, for instance, with boron to a density in the range of $1\cdot10^{17}$ to $1\cdot10^{19}$ atoms/cm$^3$, and implanted at a controlled energy of 10 to 200 keV.

Over portions of the gate and the lightly doped P-type regions 8070 are silicon dioxide regions 8105 (an insulating region). Silicide only forms on exposed silicon. In regions where silicon is covered by the silicon dioxide regions 8105, a silicide layer will not be formed. A silicide layer 8115 is then formed over exposed regions of silicon and polysilicon are not substantially reactive to the wet etch and are not removed by the wet etch. An example wet etch is aqua regia, a mixture of nitric and hydrochloric acids. In an embodiment, the silicide layer 8115 that overlies gate polysilicon layer 8025 is electrically coupled to the gate metallic strips 1131 formed in a first metallic layer M1 (see, e.g., FIG. 16). The silicide layer 8115 may be formed with refractory metals such as tungsten, titanium, and cobalt having a thickness preferably in the range of 100-800 Å.

An amorphous silicon oxynitride ("$Si_xO_yN_z$") layer 8120 (an insulating layer) is deposited and patterned over the gates and silicon dioxide regions 8105. A first metallic (e.g., aluminum) layer M1 is located (e.g., via a vacuum deposition) between the silicon oxynitride regions 8120 down to portions of the silicide layer 8115 in a region for the source and drain contacts. An etch-stop refractory layer 8130 is deposited over the first metallic layer M1. In an embodiment, the etch-stop refractory layer 8130 is titanium nitride, cobalt nitride, or tungsten nitride. Another silicon oxynitride layer 8140 (an insulating layer) is deposited and patterned over the silicon oxynitride layer 8120. The silicon oxynitride layers 8120, 8140 enable formation of low-resistance, metallic, source and drain contacts for the P-LDMOS in a sequence of processing steps. A second metallic (e.g., aluminum) layer M2 is located (e.g., via a vacuum deposition) between the silicon oxynitride regions 8140 down to the etch-stop refractory layers 8130 above the first metallic layers M1 in a region for the source and drain contacts. An etch-stop refractory layer 8150 is deposited over the second metallic layer M2. In an embodiment, the etch-stop refractory layer 8150 is titanium nitride, cobalt nitride, or tungsten nitride.

Another silicon oxynitride layer 8160 (an insulating layer) is deposited and patterned over the silicon oxynitride layer 8140. The silicon oxynitride layers 8120, 8140, 8160 enable formation of low-resistance, metallic, source and drain contacts for the P-LDMOS in a sequence of processing steps. A third metallic (e.g., aluminum) layer M3 is located (e.g., via a vacuum deposition) between the silicon oxynitride regions 8160 down to the etch-stop refractory layers 8150 above the second metallic layers M2 in a region for the source and drain contacts. A final silicon oxynitride layer 8170 (an insulating layer) is deposited and patterned over the silicon oxynitride layer 8160. The silicon oxynitride layers 8120, 8140, 8160, 8170 enable formation of low-resistance, metallic, source and drain contacts for the P-LDMOS in a sequence of processing steps. A polyimide coating 8180 (an insulating layer) is deposited and patterned over the silicon oxynitride layer 8170 and the third metallic layers M3. A refractory barrier layer 8190 (e.g., titanium nitride, tantalum nitride, or cobalt nitride) is deposited over the semiconductor device.

A thin metallic (e.g., copper) seed layer is then deposited of over the refractory barrier layer 8190, which is then electroplated to form an electroplated copper layer 8200. Another polyimide coating 8205 (an insulating layer) is deposited and patterned above the copper layer 8200 in the regions defined by the polyimide coating 8180. Another thin metallic (e.g., copper) seed layer 8215 is deposited and patterned above the electroplated copper layer 8200 between the another polyimide coating 8205 in the regions of the sources of the P-LDMOS device. Deposition of the copper seed layer 8215 is an optional step to produce a fresh surface for later electrodeposition of metallic (e.g., copper) pillars.

Metallic (e.g., copper) pillars 8220 are formed by an electroplating process employing an acid solution and located over the copper seed layer 8215. The copper pillars 8220 serve as low-resistance source contacts to a conductive, patterned leadframe, traces of which terminals of the completed semiconductor device are solderably attached, as illustrated and described hereinabove with reference to FIG. 4. Corresponding steps can be employed in conjunction with the steps described hereinabove for construction of the source contacts to form low-resistance drain contacts for the P-LDMOS device. Additionally, an encapsulant (e.g., an epoxy) 8225 can be selectively deposited between the copper pillars 8200 and a patterned leadframe 8230 placed thereabove to create external contacts for a packaged semiconductor device (see, e.g., FIG. 18).

The steps listed below in TABLE 1 illustrate a sequence of process steps that can be employed to form N-LDMOS and P-LDMOS devices in a common die. It is contemplated within the broad scope of the present invention that the particular sequence of process steps can be modified to produce N-LDMOS and P-LDMOS devices in a common die.

The steps are numbered in the leftmost column. In the next column to the right, process steps are identified that apply to both the N-LDMOS and P-LDMOS devices. In the third and fourth columns, respectively, process steps that apply only to the N-LDMOS and P-LDMOS devices are identified.

TABLE 1

| | Common processing steps | N-LDMOS device steps | P-LDMOS device steps |
|---|---|---|---|
| 1. | Form shallow trench isolation regions in a P-doped semiconductor substrate | | |
| 2. | | | Form lightly doped N-type well 8015 by applying, patterning and etching a photoresist and ion implanting |
| 3. | | Form P-type wells 2015 by applying, patterning, and etching a photoresist and ion implanting | |
| 4. | | | Form N-type wells 8017 by applying, patterning, and etching a photoresist and ion implanting |
| 5. | Deposit gate oxide layer 2020, 8020 over surface of the die | | |
| 6. | Deposit gate polysilicon layer 2025, 8025 over the gate oxide layer 2020, 8020 | | |
| 7. | Deposit overlying gate oxide layer 2030, 8030 over the gate polysilicon layer 2025, 8025 | | |
| 8. | Apply photoresist and etch to define gates | | |
| 9. | Apply silicon nitride blanket over surface of the die | | |
| 10. | Etch back the silicon nitride to form sidewall spacers 2040, 8040 laterally adjacent to the gates | | |

TABLE 1-continued

| Common processing steps | N-LDMOS device steps | P-LDMOS device steps |
|---|---|---|
| 11. | Apply photoresist layer and pattern, and etch for later selectively implanting ions | |
| 12. | Ion-implant P-type ions to form P-type regions 2055 | |
| 13. | Ion-implant N-type ions to form heavily doped N-type regions 2060 | |
| 14. | Strip photoresist | |
| 15. | | Apply photoresist layer, pattern, and etch for later selectively implanting ions |
| 16. | | Ion-implant N-type ions to form N-type regions 8055 |
| 17. | | Ion-implant P-type ions to form heavily doped P-type regions 8060 and in the gate polysilicon layer 8025 |
| 18. | | Strip photoresist |
| 19. Anneal to transform implants into substrate-active sites to activate implants | | |
| 20. | Apply photoresist, pattern, and etch for later selectively implanting ions | |
| 21. | Ion implant N-type ions to form lightly doped N-type regions 2070 | |
| 22. | Strip photoresist | |
| 23. | | Apply photoresist, pattern, and etch for later selectively implanting ions |
| 24. | | Ion implant P-type ions to form lightly doped P-type regions 8070 |
| 25. Anneal to transform implants into active substrate sites | | |
| 26. | Apply photoresist, pattern, and etch for later selectively implanting ions | |
| 27. | Ion implant N-type ions to form heavily doped N-type regions 2080 and in the gate polysilicon layer 2025 | |
| 28. | Strip photoresist | |
| 29. | | Apply photoresist, pattern, and etch for later selectively implanting ions |
| 30. | | Ion implant P-type ions to form heavily doped P-type regions 8080 and in the gate polysilicon layer 8025 |
| 31. | | Strip photoresist |
| 32. Anneal to transform implants into active substrate sites | | |
| 33. | Apply photoresist, pattern, and etch for later selectively implanting ions | |

TABLE 1-continued

| | Common processing steps | N-LDMOS device steps | P-LDMOS device steps |
|---|---|---|---|
| 34. | | Ion implant P-type ions to form heavily doped P-type regions 2090 | |
| 35. | | Strip photoresist | |
| 36. | | | Apply photoresist, pattern, and etch for later selectively implanting ions |
| 37. | | | Ion implant N-type ions to form heavily doped N-type regions 8090 |
| 38. | | | Strip photoresist |
| 39. | Anneal to transform implants into active substrate sites | | |
| 40. | Form silicon dioxide layer over surface of the semiconductor device | | |
| 41. | Apply photoresist above silicon dioxide layer, pattern, and etch to form silicon dioxide regions 2105, 8105 and partial removal of overlying gate oxide layers 2030, 8030 | | |
| 42. | Strip photoresist to enable formation of silicide regions | | |
| 43. | Deposit refractory metal layer over surface of the semiconductor | | |
| 44. | Etch refractory metal layer with a wet etch, leaving behind silicide layers 2115, 8115 formed over exposed regions of silicon and polysilicon | | |
| 45. | Deposit silicon oxynitride layer 2120, 8120 over semiconductor device | | |
| 46. | Deposit photoresist layer over silicon oxynitride layers 2120, 8120, pattern and etch to expose portions of the silicide layers2115, 8115 | | |
| 47. | Etch silicon oxynitride layers 2120, 8120 with suitable etch to expose portions of silicide layers 2115, 8115 | | |
| 48. | Strip remaining photoresist layer | | |
| 49. | Vacuum-deposit first metallic layer M1 over the semiconductor device | | |
| 50. | Deposit etch-stop refractory layers 2130, 8130 over the first metallic layer M1 | | |
| 51. | Deposit photoresist layer over of the first metallic layer M1, pattern and etch to protect areas of the first metallic layer M1 to be retained | | |
| 52. | Remove exposed areas of etch-stop refractory layer 2130, 8130 and exposed areas of the first metallic layer M1 | | |
| 53. | Strip off remaining photoresist layer exposing remaining etch-stop refractory layers 2130, 8130 and silicon oxynitride layers 2120, 8120 | | |
| 54. | Deposit another silicon oxynitride layer 2140, 8140 over semiconductor device and planarize by chemical-mechanical planarization | | |
| 55. | Deposit, pattern, and etch photoresist layer over the silicon oxynitride layers 2140, 8140 | | |
| 56. | Etch silicon oxynitride layers 2140, 8140 down to the etch-stop refractory layers 2130, 8130 | | |
| 57. | Strip off photoresist layer | | |
| 58. | Vacuum-deposit second metallic layer M2 over the semiconductor device | | |
| 59. | Deposit etch-stop refractory layers 2150, 8150 over the second metallic layer M2 | | |
| 60. | Deposit photoresist layer over of the second metallic layer M2, pattern and etch to protect areas of the second metallic layer M2 to be retained | | |

TABLE 1-continued

| Common processing steps | N-LDMOS device steps | P-LDMOS device steps |
|---|---|---|
| 61. Remove exposed areas of etch-stop refractory layer 2150, 8150 and exposed areas of the second metallic layer M2 | | |
| 62. Strip off remaining photoresist layer exposing remaining etch-stop refractory layers 2150, 8150 and silicon oxynitride layers 2140, 8140 | | |
| 63. Deposit another silicon oxynitride layer 2160, 8160 over semiconductor device and planarize by chemical-mechanical planarization | | |
| 64. Deposit, pattern, and etch a photoresist layer to cover areas of the silicon oxynitride layer 2160, 8160 to be retained | | |
| 65. Etch silicon oxynitride layers 2160, 8160 down to etch-stop refractory layers 2150, 8150 | | |
| 66. Strip off photoresist layer | | |
| 67. Vacuum-deposit third metallic layer M3 over the semiconductor device | | |
| 68. Deposit, pattern, and etch a photoresist layer to cover areas of the third metallic layer M3 to be retained | | |
| 69. Remove exposed areas of the third metallic layer M3 with a suitable etch | | |
| 70. Strip off remaining photoresist layer, exposing remaining the third metallic layer M3 and silicon oxynitride layers 2160, 8160 | | |
| 71. Deposit final silicon oxynitride layers 2170, 8170 over semiconductor device and planarize by chemical-mechanical planarization | | |
| 72. Deposit, pattern, and etch a photoresist layer through the silicon oxynitride layers 2170, 8170 to expose areas of the silicon oxynitride layers 2170, 8170 to be retained | | |
| 73. Etch the silicon oxynitride layer 2170, 8170 down to the third metallic layer M3 | | |
| 74. Strip off the photoresist layer | | |
| 75. Deposit polyimide coating 2180, 8180 over the semiconductor device | | |
| 76. Deposit and pattern a photoresist layer over the polyimide coating 2180, 8180 to expose the third metallic layer M3 over sources of the N- and P-LDMOS devices | | |
| 77. Etch polyimide coating 2180, 8180 to expose the third metallic layer M3 over the sources and remove the photoresist layer | | |
| 78. Deposit refractory barrier layer 2190, 8190 over semiconductor device | | |
| 79. Deposit thin copper seed layer over the refractory barrier layer 2190, 8190 | | |
| 80. Electroplate to form electroplated copper layer 2200, 8200 | | |
| 81. Form another polyimide coating 2205, 8205 over the copper layer 2200, 8200 | | |
| 82. Deposit and pattern photoresist layer over the polyimide layer 2205, 8205 and etch the same to expose the sources | | |
| 83. Deposit another thin copper seed layer 2215, 8215 over semiconductor device. This is an optional step is to produce a fresh surface for later electrodeposition of copper pillars | | |
| 84. Lift off photoresist layer with a portion of thin copper seed layer 2215, 8215 that overlies the photoresist | | |
| 85. Form copper pillars 2220, 8220 by an electroplating process with an acid solution | | |
| 86. Deposit encapsulant (e.g., an epoxy) 2225, 8225 between the copper pillars 2220, 8220 | | |

TABLE 1-continued

| Common processing steps | N-LDMOS device steps | P-LDMOS device steps |
|---|---|---|
| 87. Place a conductive patterned leadframe 2230, 8230 thereabove to create external contacts for a packaged semiconductor device | | |

Those skilled in the art should understand that the previously described embodiments of a semiconductor switch and a power converter and related methods of constructing the same are submitted for illustrative purposes only. In addition, other embodiments capable of producing a semiconductor switch and a power converter employable with other switch-mode power converter topologies are well within the broad scope of the present invention. While construction of the semiconductor switch and the power converter have been described in the environment of a power converter including a controller to control an output characteristic to power a load, the construction of the semiconductor switch and the power converter may also be applied to other systems such as a power amplifier, a motor controller, and a system to control an actuator in accordance with a stepper motor or other electromechanical device.

For a better understanding of integrated circuits, semiconductor devices and methods of manufacture therefor see "Semiconductor Device Fundamentals," by R. F. Pierret, Addison-Wesley (1996), and "Handbook of Sputter Deposition Technology," by K. Wasa and S. Hayakawa, Noyes Publications (1992). For a better understanding of power converters, see "Modern DC-to-DC Switchmode Power Converter Circuits," by Rudolph P. Severns and Gordon Bloom, Van Nostrand Reinhold Company, New York, N.Y. (1985) and "Principles of Power Electronics," by J. G. Kassakian, M. F. Schlecht, and G. C. Verghese, Addison-Wesley (1991). The aforementioned references are incorporated herein by reference in their entirety.

Also, although the present invention and its advantages have been described in detail, it should be understood that various changes, substitutions, and alterations can be made herein without departing from the spirit and scope of the invention as defined by claims on embodiments. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, claims on embodiments are intended to include within their scope such processes, machines, manufacture, compositions of matter, means, methods, or steps.

What is claimed is:

1. A semiconductor device, comprising:

a semiconductor die formed with a plurality of laterally diffused metal oxide semiconductor (LDMOS) cells forming an L-DMOS device and a P-LDMOS device;

a redistribution layer electrically coupled to said plurality of LDMOS cells and configured to provide a common circuit node for a drain region of said N-LDMOS device and said P-LDMOS device;

a plurality of metallic pillars distributed over and electrically coupled to said redistribution layer; and a conductive patterned leadframe electrically coupled to said redistribution layer by said plurality of metallic pillars, wherein portions of said conductive patterned leadframe are exposed to serve as external contacts, and a drain region external contact of said portions of said conductive patterned leadframe entirely overlies a footprint of the drain region of said N-LDMOS device and said P-LDMOS device.

2. The semiconductor device as recited in claim 1, further comprising a plurality of gate drivers electrically coupled to said redistribution layer and to gates of said plurality of LDMOS cells.

3. The semiconductor device as recited in claim 1, wherein said semiconductor device is potted with an encapsulate.

4. The semiconductor device as recited in claim 1, wherein ones of said external contacts are configured to be coupled to a printed circuit board.

5. The semiconductor device as recited in claim 4, wherein ones of said external contacts are configured to be coupled to a plurality of decoupling devices on said printed circuit board.

6. The semiconductor device as recited in claim 4, wherein ones of said external contacts are configured to be coupled to a plurality of decoupling devices through vias on an opposing surface of said printed circuit board.

7. The semiconductor device as recited in claim 6, wherein said at least one of said plurality of decoupling devices is located under said semiconductor die.

8. The semiconductor device as recited in claim 1, wherein ones of said external contacts are coupled to a plurality of gate drivers electrically coupled to said redistribution layer and to gates of said plurality of LDMOS cells.

9. The semiconductor device as recited in claim 1, wherein said plurality of metallic pillars comprises copper.

10. The semiconductor device as recited in claim 1, wherein said plurality of metallic pillars is formed as electroplated columns.

11. The semiconductor device as recited in claim 1, further comprising a metallic layer formed below said redistribution layer including a plurality of alternating source and drain metallic strips formed above a substrate of said semiconductor die and parallel to and forming an electrical contact with respective ones of source regions and said drain region of said N-LDMOS device and said P-LDMOS deivice.

12. A method of forming a semiconductor device, comprising:

forming a plurality of laterally diffused metal oxide semiconductor (LDMOS) cells of an LDMOS device in a semiconductor die;

coupling a redistribution layer to said plurality of LDMOS cells;

distributing over and coupling a plurality of metallic pillars to said redistribution layer; and coupling a plurality of gate drivers to said redistribution layer and to gates of said plurality of LDMOS cells, wherein said plurality of gate drivers are positioned on a periphery of said semiconductor die.

13. The method as recited in claim 12, further comprising:

coupling a conductive patterned leadframe to said redistribution layer by said plurality of metallic pillars; and potting said semiconductor device with an encapsulant, wherein portions of said conductive patterned leadframe are exposed to serve as external contacts for said semiconductor device.

14. The method as recited in claim 13, wherein ones of said external contacts are coupled to said plurality of gate drivers coupled to said redistribution layer and to gates of said plurality of LDMOS cells.

15. The method as recited in claim 13, wherein ones of said external contacts are coupled to drains or sources of said plurality of LDMOS cells through said redistribution layer.

16. The method as recited in claim 12, further comprising forming a metallic layer below said redistribution layer including a plurality of alternating source and drain metallic strips formed above a substrate of said semiconductor die and parallel to and forming an electrical contact with respective ones of a plurality of source and drain regions of said LDMOS device.

17. A semiconductor device, comprising:

a semiconductor die formed with a plurality of laterally diffused metal oxide semiconductor (LDMOS) cell forming an N-LDMOS device and a P-LDMOS device;

a redistribution layer electrically coupled to said plurality of LDMOS cells and configured to provide a common circuit node for drain regions of said N-LDMOS device and said P-LDMOS device;

a plurality of metallic pillars distributed over and electrically coupled to said redistribution layer; and a plurality of gate drivers electrically coupled to said redistribution layer and to gates of said plurality of LDMOS cells, wherein said plurality of gate drivers are positioned on a periphery of said semiconductor die.

18. The semiconductor device as recited in claim 17 further comprising a conductive patterned leadframe electrically coupled to said redistribution layer by said plurality of metallic pillars.

19. The semiconductor device as recited in claim 18, wherein said semiconductor device is potted with encapsulant.

20. The semiconductor device as recited in claim 18, wherein portions of said conducitve patterned leadframe are exposed to serve as external contacts for said semidonductor device.

* * * * *